(12) United States Patent
Hayashi et al.

(10) Patent No.: US 7,465,963 B2
(45) Date of Patent: *Dec. 16, 2008

(54) ORGANIC EL DEVICE

(75) Inventors: Kazuhiko Hayashi, Tokyo (JP); Atsushi Oda, Tokyo (JP); Takashi Fukuchi, Tokyo (JP); Shinnzo Tsuboi, Tokyo (JP)

(73) Assignee: Samsung SDI Co., Ltd., Suwon (KR)

( * ) Notice: Subject to any disclaimer, the term of this patent is extended or adjusted under 35 U.S.C. 154(b) by 0 days.

This patent is subject to a terminal disclaimer.

(21) Appl. No.: 10/467,691

(22) PCT Filed: Feb. 4, 2002

(86) PCT No.: PCT/JP02/00880

§ 371 (c)(1),
(2), (4) Date: Aug. 8, 2003

(87) PCT Pub. No.: WO02/063929

PCT Pub. Date: Aug. 15, 2002

(65) Prior Publication Data

US 2004/0065877 A1  Apr. 8, 2004

(30) Foreign Application Priority Data

Feb. 8, 2001  (JP) .............................. 2001-031813

(51) Int. Cl.
*H01L 33/00* (2006.01)
(52) U.S. Cl. ...................... 257/99; 257/103; 257/40; 257/E33.064; 257/E51.019; 257/E51.02
(58) Field of Classification Search .................. 257/40, 257/99, 741
See application file for complete search history.

(56) References Cited

U.S. PATENT DOCUMENTS 5,952,779 A * 9/1999 Arai et al. ................... 313/504

(Continued)

FOREIGN PATENT DOCUMENTS

JP  64-059791  3/1989

(Continued)

OTHER PUBLICATIONS

C.W. Tang et al.; Organic Electroluminescent Diodes; Applied Physics Letter 51; pp. 913-915; Sep. 21, 1987.

(Continued)

*Primary Examiner*—Jerome Jackson, Jr.
(74) *Attorney, Agent, or Firm*—H.C. Park & Associates, PLC

(57) ABSTRACT

An organic EL device having a light emitting element including a first electrode (2), a second electrode (4) of transparent conductive film, and a light emitting organic material layer (9) formed between said first electrode (2) and said second electrode (4), wherein said transparent conductive film is made of a metal oxide deficient in oxygen as compared with stoichiometric composition. Since the transparent conductive film (4) directly in contact with the light emitting organic material layer (9) over a wide area is made of the metal oxide deficient in oxygen as compared with stoichiometric composition, the transparent conductive film can absorb moisture and oxygen which may possibly absorbed by the light emitting organic material layer so that the light emitting organic material layer is prevented from deteriorating, and the long emission lifetime of the element can be ensured.

9 Claims, 43 Drawing Sheets

U.S. PATENT DOCUMENTS 5,981,092 A * 11/1999 Arai et al. .................. 428/690
6,628,086 B2 * 9/2003 Hayashi et al. .......... 315/169.3

FOREIGN PATENT DOCUMENTS

| JP | 03-004481 | 1/1991 |
|----|-----------|--------|
| JP | 05-041281 | 2/1993 |
| JP | 05-182759 | 7/1993 |
| JP | 8-124679 | 5/1996 |
| JP | 10-162959 | 6/1998 |
| JP | 10-162960 | 6/1998 |
| JP | 2800813 | 9/1998 |
| JP | 11-144864 | 5/1999 |
| JP | 11-176580 | 7/1999 |
| JP | 2000-030871 | 1/2000 |
| JP | 2000-260562 | 9/2000 |

OTHER PUBLICATIONS

D.R. Baigent, et al.; Conjugated Polymer Light-Emitting Diodes on Silicon Substrates; Applied Physics Letter 65; pp. 2636-2638; Nov. 21, 1994.

* cited by examiner

ORGANIC EL DEVICE

TECHNICAL FIELD

The present invention relates to an organic EL device having a light emitting element which includes a light emitting organic material layer sandwiched between two electrodes including a transparent conductive film electrode, and more particularly to an organic EL device which is suitable for use with a display device.

BACKGROUND ART

One type of the display devices employing self-luminescence elements utilizes electroluminescence elements (EL elements). The EL element is divided into an organic EL element having a light emitting layer made of an organic material and an inorganic EL element having a light emitting layer made of an inorganic material.

The organic EL element includes an anode, a cathode, and an organic EL layer which is sandwiched between these two types of anode and cathode electrodes and which is made of thin film of an organic light emissive compound. Applying a voltage between the anode and the cathode causes the anode and the cathode to inject holes and electrons into the organic EL layers respectively, for recombination. The energy produced then excites the molecules of the organic light emissive compound constituting the organic EL layer. A light emitting phenomenon is provided in the process of such excited molecules being deactivated into their ground state. The organic EL element is a light emitting element which utilizes this light emitting phenomenon.

The organic EL layer includes at least an organic layer called a light emitting layer in which holes and electrons are recombined to emit light. When necessary, the organic EL layer has a single-layer structure or a multi-layered structure that includes one of or both an organic layer called a hole transport layer which allows holes to be readily injected therein but electrons to hardly travel therethrough and an organic layer called an electron transport layer which allows electrons to be readily injected therein but holes to hardly travel therethrough.

In recent years, the organic EL element is actively being studied and brought to practical use. This element has a basic structure in which a hole injection material such as triphenyldiamine (TPD) is evaporated to form a thin film on a transparent electrode (a hole injection electrode or an anode) such as indium tin oxide (ITO), and a phosphor such as an aluminum quinolinol complex ($Alq_3$) is then deposited as a light emitting layer, with a metal electrode (an electron injection electrode or a cathode) having a low work function such as AgMg being subsequently formed. Attention is now focused on this element because the element provides as very high a brightness as several hundreds to several tens of thousands of $cd/m^2$ at a voltage of about 10V and thus can be used as an illumination lamp, a light source, or a display for OA devices, home electric appliances, automobiles, two-wheeled vehicles, airoraft, and so on.

For example, such an organic EL element is configured such that an organic layer such as a light emitting layer is sandwiched between a scan (common line) electrode serving as an electron injection electrode and a data (segment line) electrode serving as a hole injection electrode (transparent electrode), and is formed on a transparent (glass) substrate. On the other hand, the display is largely divided into two types: a matrix display that allows the light emitting elements disposed in a matrix to emit light dot by dot using the scan electrodes and data electrodes arranged in the horizontal and vertical directions in order to display information such as an image or character as a collection of these dots (pixels), and a segment display that allows an indicator present independently as having a predetermined shape and size to be displayed.

For the segment type display, it is possible to employ a static drive system by which each indictor is displayed separately independently. However, for the matrix display, normally employed is a dynamic drive system which allows each scan line and data line to be driven in time division manner.

The light emitting element constituting the light emitting portion of the organic EL element is divided into the following types: a substrate surface emission type that uses the structure of transparent substrate/transparent electrode/light emitting layer/metal electrode allowing light generated in the light emitting layer to be emitted through the transparent electrode and the transparent substrate, and a film surface emission type that uses the structure of substrate/metal electrode/light emitting layer/transparent electrode allowing light generated in the light emitting layer to be emitted through the transparent electrode from the film surface side opposite to the substrate surface. The element of the substrate surface emission type is described, for example, in Appl. Phys. Lett., 51, 913-915 (1987), while the element of the film surface emission type is described, for example, in Appl. Phys. Lett., 65, 2636-2638 (1994).

An organic fluorescent solid body serving as a material of the light emitting layer in the organic EL element is quite susceptible to deterioration from moisture, oxygen or the like when exposed thereto. An electrode disposed directly or via the electron transport layer on the light emitting layer is also quite susceptible to deterioration in characteristics from oxidation. This causes a prior art organic EL element to suddenly deteriorate in its emission characteristics when it is driven in the air. In particular, the presence of oxygen or moisture around the element raises a problem of accelerating oxidation thereby causing the organic material to be altered in quality, the film to be peeled off, and a dark spot (non-light emitting portion) to grow, resulting in loss of lifetime. Accordingly, to obtain a practical organic EL element or organic EL device, it is necessary to devise the structure of the element to prevent the intrusion of moisture or oxygen into the light emitting layer and the oxidation of its opposite electrode.

To solve the aforementioned problems, it is suggested to seal the organic EL element to prevent it from being exposed to the air. For example, Japanese Patent Laid-Open Publication. No. Hei 5-182759 discloses that an organic EL element is covered with and thereby sealed in a photocurable resin layer resistant to moisture and a substrate secured onto that layer and having a reduced permeability to moisture. On the other hand, Japanese Patent Laid-Open Publication No. Hei 5-41281 discloses that an El element is sealed in an inert liquid having a dehydrating agent such as synthetic Zeolite contained in a fluorocarbon oil. On the other hand, Japanese Patent No. 2800813 discloses a method for providing an organic EL element with a fluorine-based polymer protective layer, disposing outside that layer a sealing portion having a cap structure, and filling the sealing portion with an inert m dium for encapsulation.

It has also been suggested that deterioration is prevented by capturing moisture. For example, Japanese Patent Laid-Open Publication No. Hei 3-4481 discloses that an organic EL element is coated with a moisture capturing layer. In addition, Japanese Patent Laid-Open Publication No. 2000-30871 describes that a moisture capturing material is contained in an insulating layer that fills between the transparent electrodes arranged in a matrix.

However, the application of only the sealing techniques was not sufficient to completely remove the moisture and oxygen present around the element, thereby making it difficult to ensure a sufficiently long emission lifetime. Furthermore, since usage of the prior art sealing may result in an increase in thickness of the display device by the amount of a sealing member, it is desirable to ensure a light emission sustain time without using the sealing, if possible.

Still furthermore, even the structure provided with a moisture capturing layer raises a problem of causing an increase in thickness of a display device by the amount of the layer. In the methods employing the prior art moisture capturing layer and the moisture capturing material, since the moisture capturing layer or the moisture capturing material is not in direct and entir contact with the organic film, it is difficult to provid a sufficient moisture capturing effect to the organic film.

DISCLOSURE OF THE INVENTION

The present invention is intended to solve the aforementioned prior art problems. It is therefore an object of the invention to provide an organic EL device which can ensure an elongated light emission sustain time with encapsulation and which also can ensure a practical light emission sustain time even without encapsulation.

To achieve the aforementioned object, the present invention provides an organic EL device having a light emitting element including: a first electrode; a second electrode of transparent conductive film; and a light emitting organic material layer formed between the first electrode and the second electrode. The transparent conductive film is made of a metal oxide deficient in oxygen as compared with stoichiometric composition.

Furthermore, preferably, the transparent conductive film is made of ITO having a composition of $In_{2-x}Sn_xO_{3-y}$ (where $0<x<1$ and $0.05 \leqq y \leqq 0.2$). Furthermore, preferably, the first electrode is made of any one of MgAg, Al, and LiAl.

According to the organic EL device of the present invention, the transparent conductive film directly contacting the light emitting organic material layer over a wide area is made of a metal oxide deficient in oxygen as compared with stoichiometric composition. The present invention thus allows the transparent conductive film to absorb moisture and oxygen that may be possibly absorbed by the light emitting organic material layer, thereby making it possible to prevent deterioration of the light emitting organic material layer and ensure an elongated emission lifetime of the element.

BEST MODE FOR CARRYING OUT THE INVENTION

Figure 1:
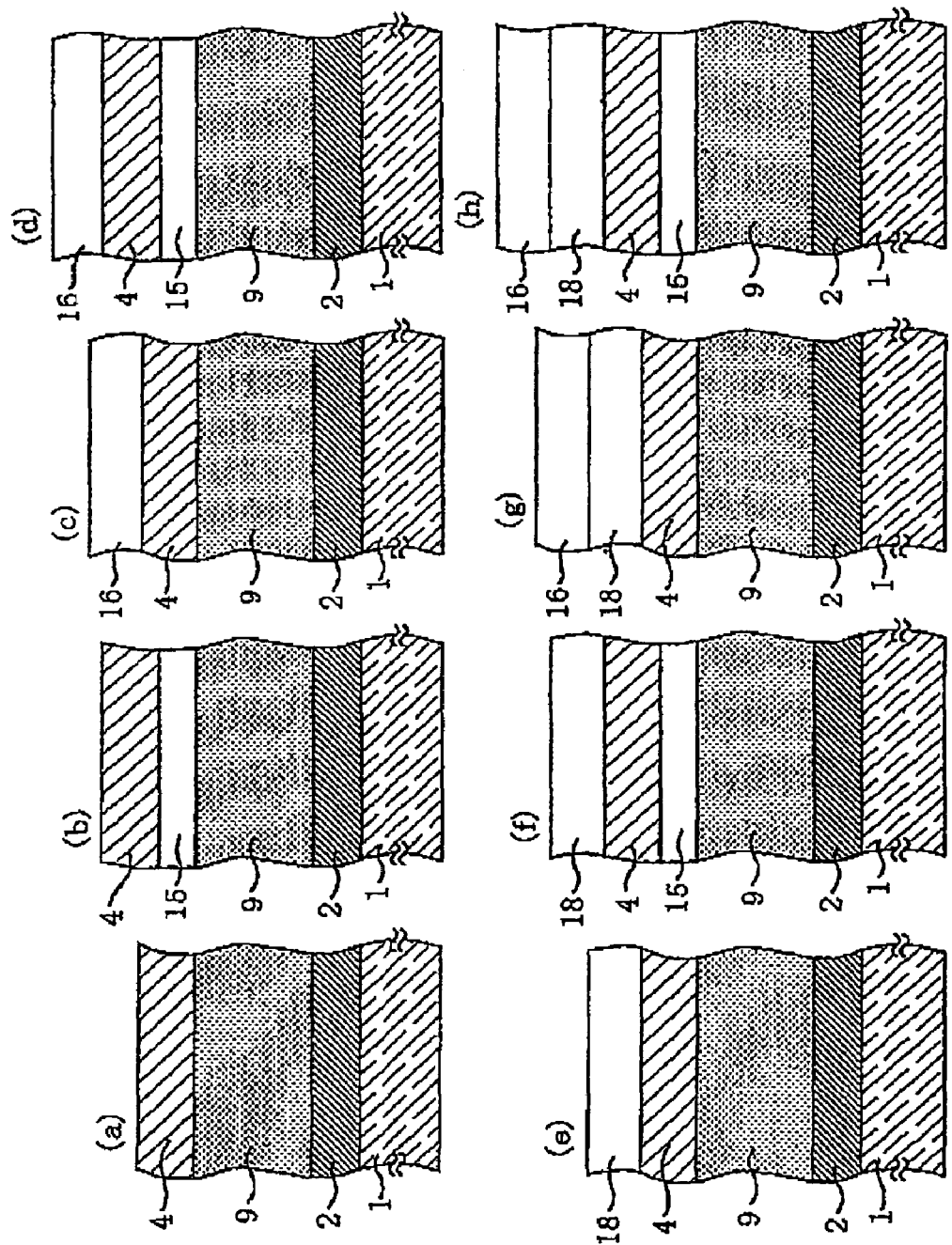
FIGS. 1(a) to 1(h) are sectional views each showing a multilayer structure of a light emitting element according to the present invention.
Figure 2:
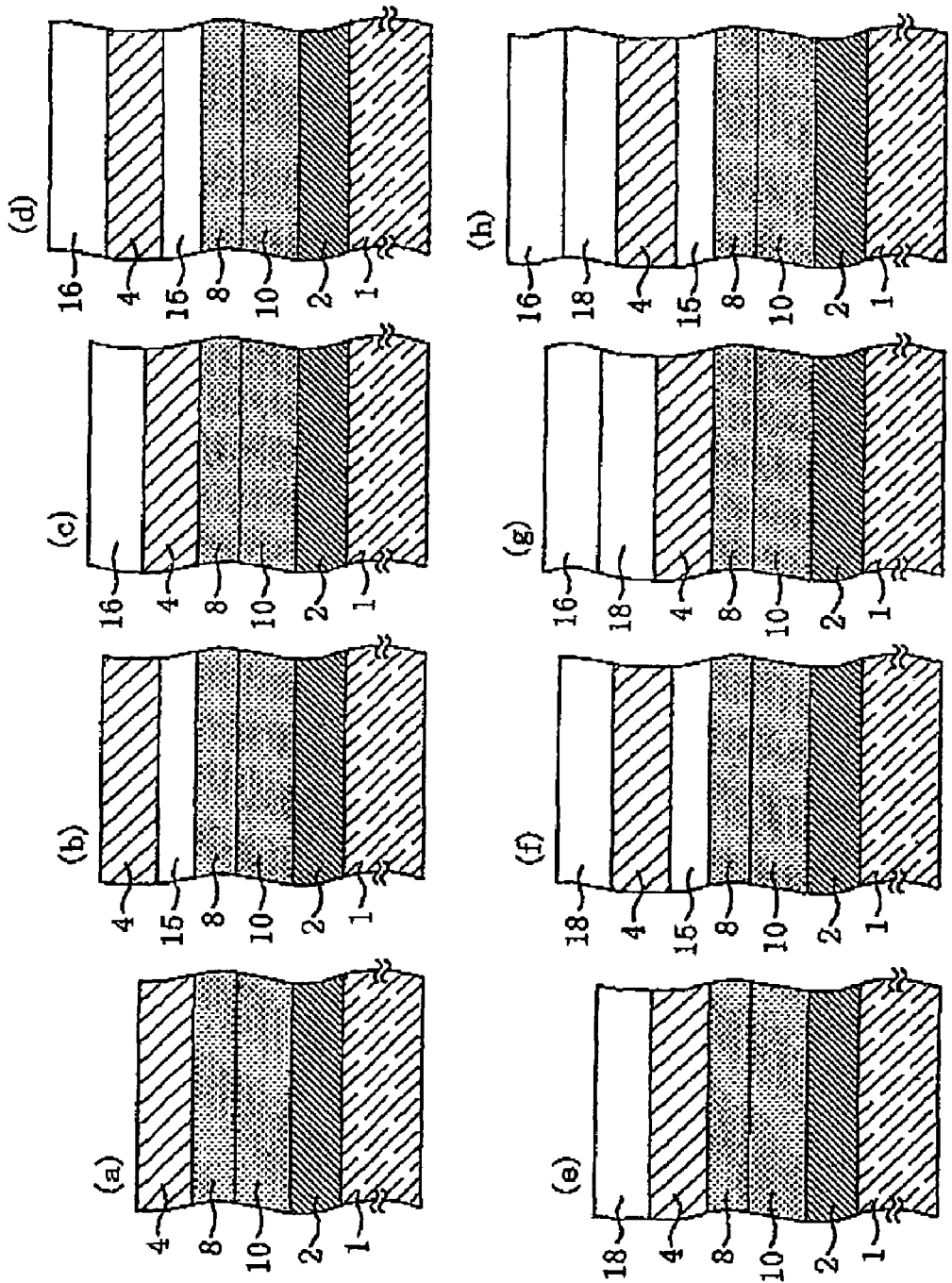
FIGS. 2(a) to 2(h) are sectional views each showing a multilayer structure of a light emitting element according to the present invention.
Figure 3:
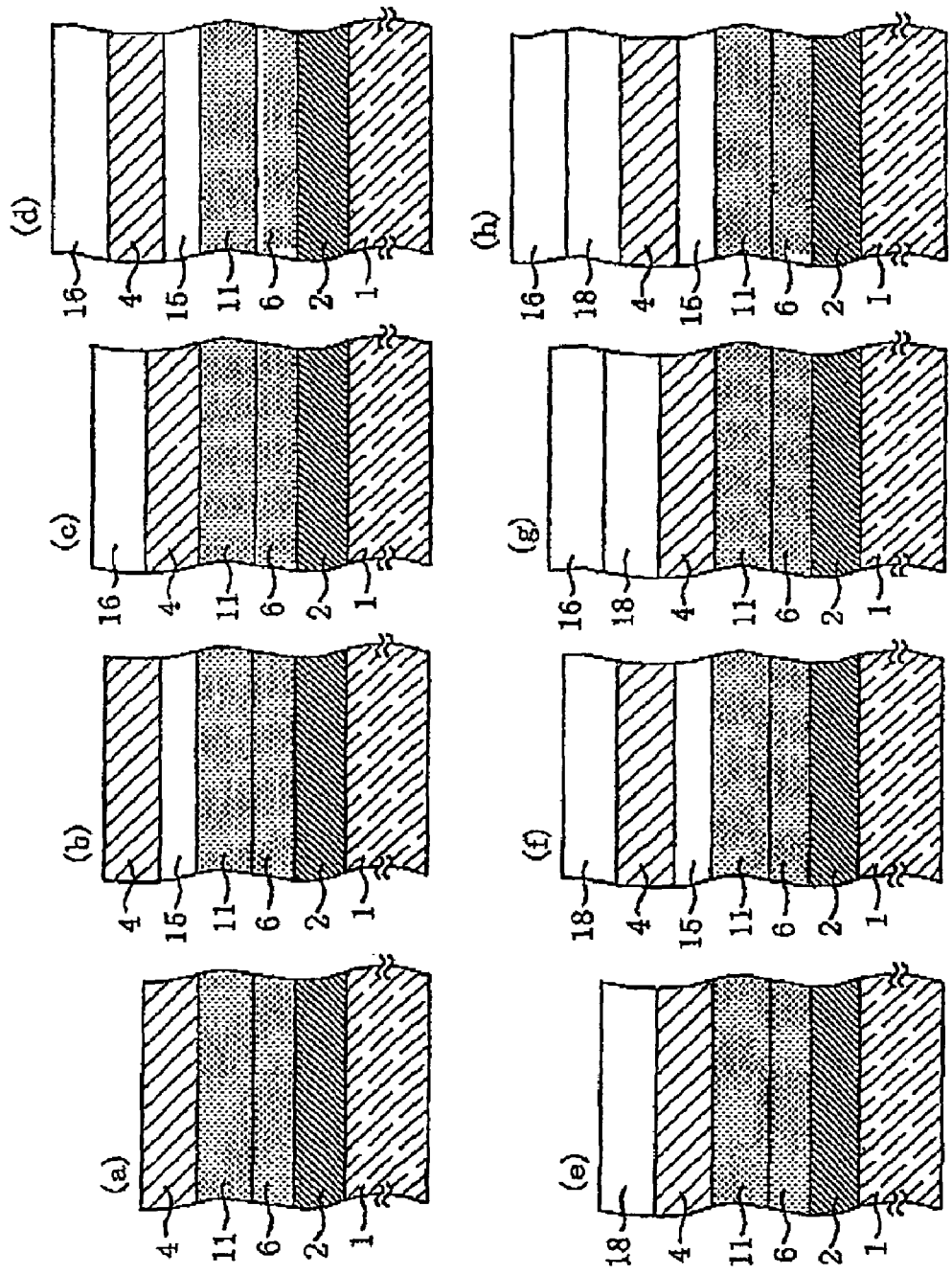
FIGS. 3(a) to 3(h) are sectional views each showing a multilayer structure of a light emitting element according to the present invention.
Figure 4:
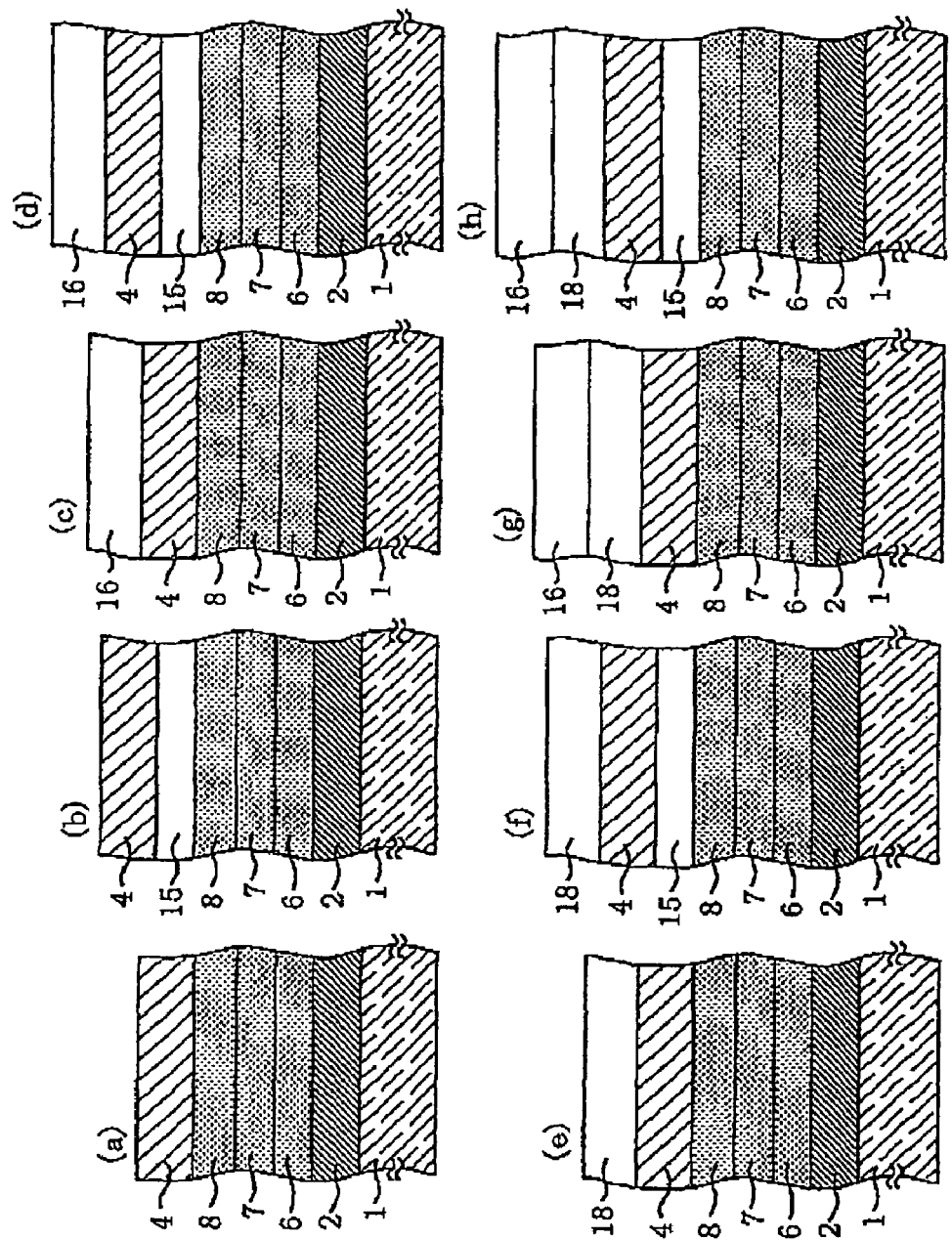
FIGS. 4(a) to 4(h) are sectional views each showing a multilayer structure of a light emitting element according to the present invention.
Figure 5:
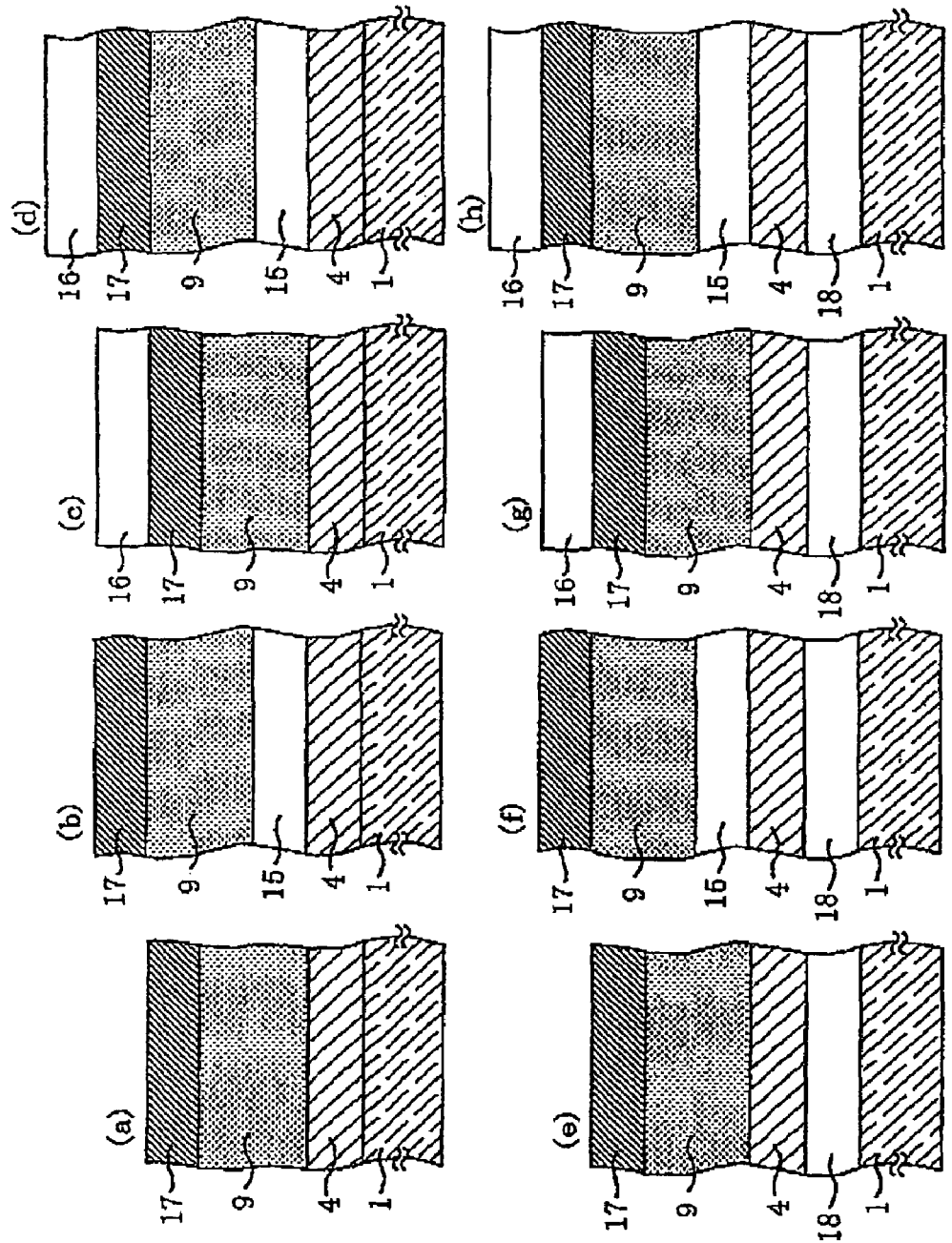
FIGS. 5(a) to 5(h) are sectional views each showing a multilayer structure of a light emitting element according to the present invention.
Figure 6:
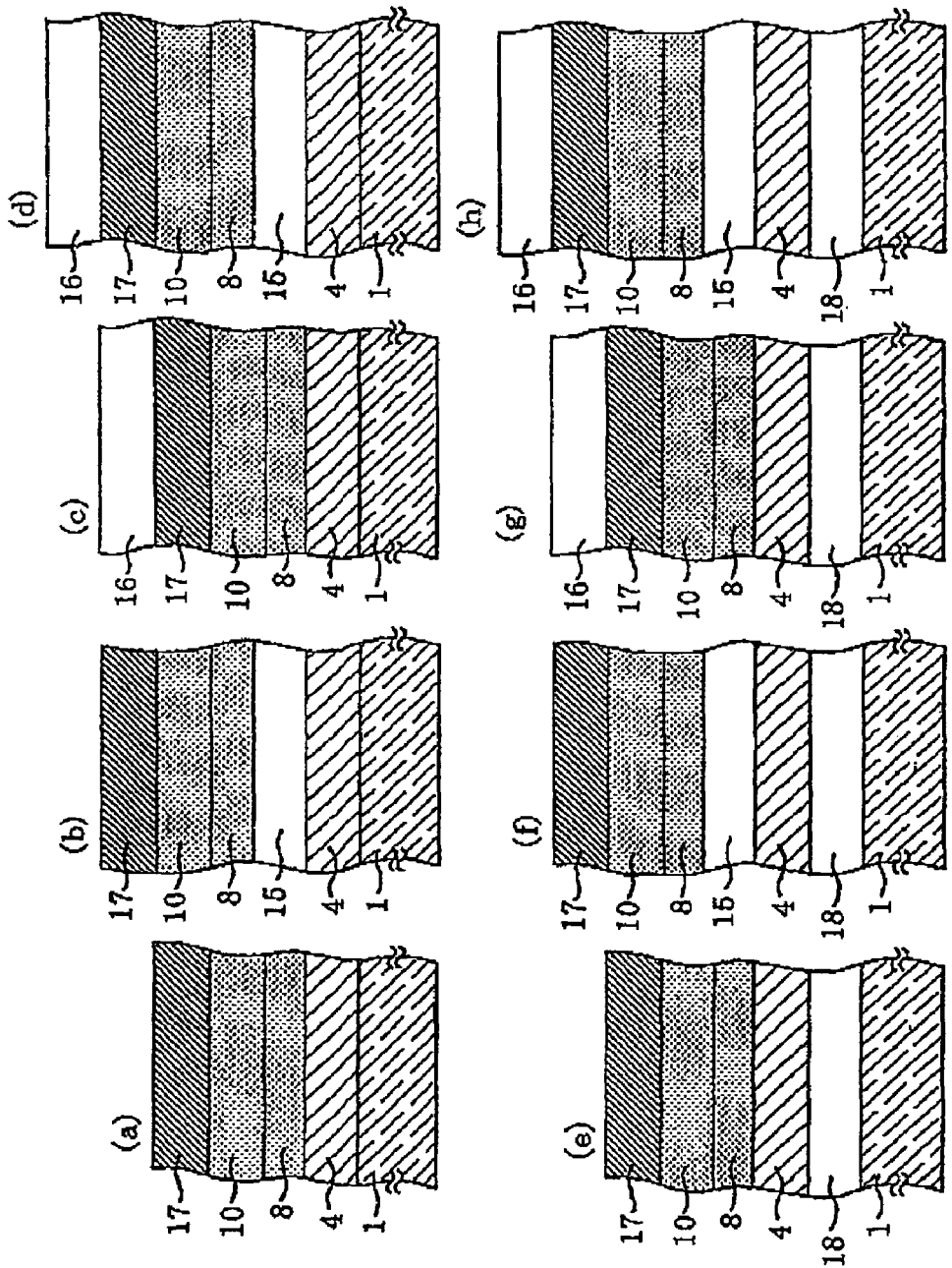
FIGS. 6(a) to 6(h) are sectional views each showing a multilayer structure of a light emitting element according to the present invention.
Figure 7:
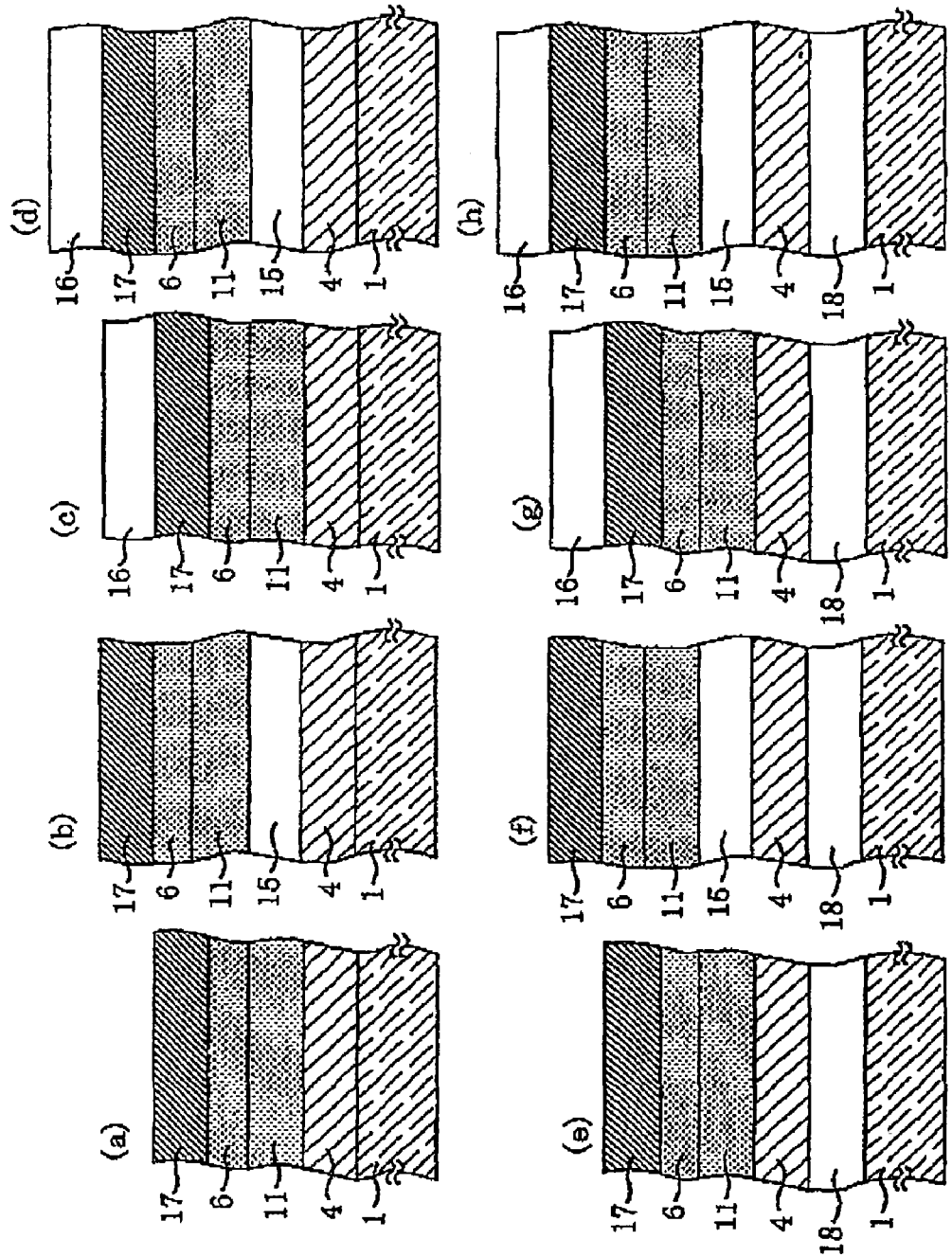
FIGS. 7(a) to 7(h) are sectional views each showing a multilayer structure of a light emitting element according to the present invention.
Figure 8:
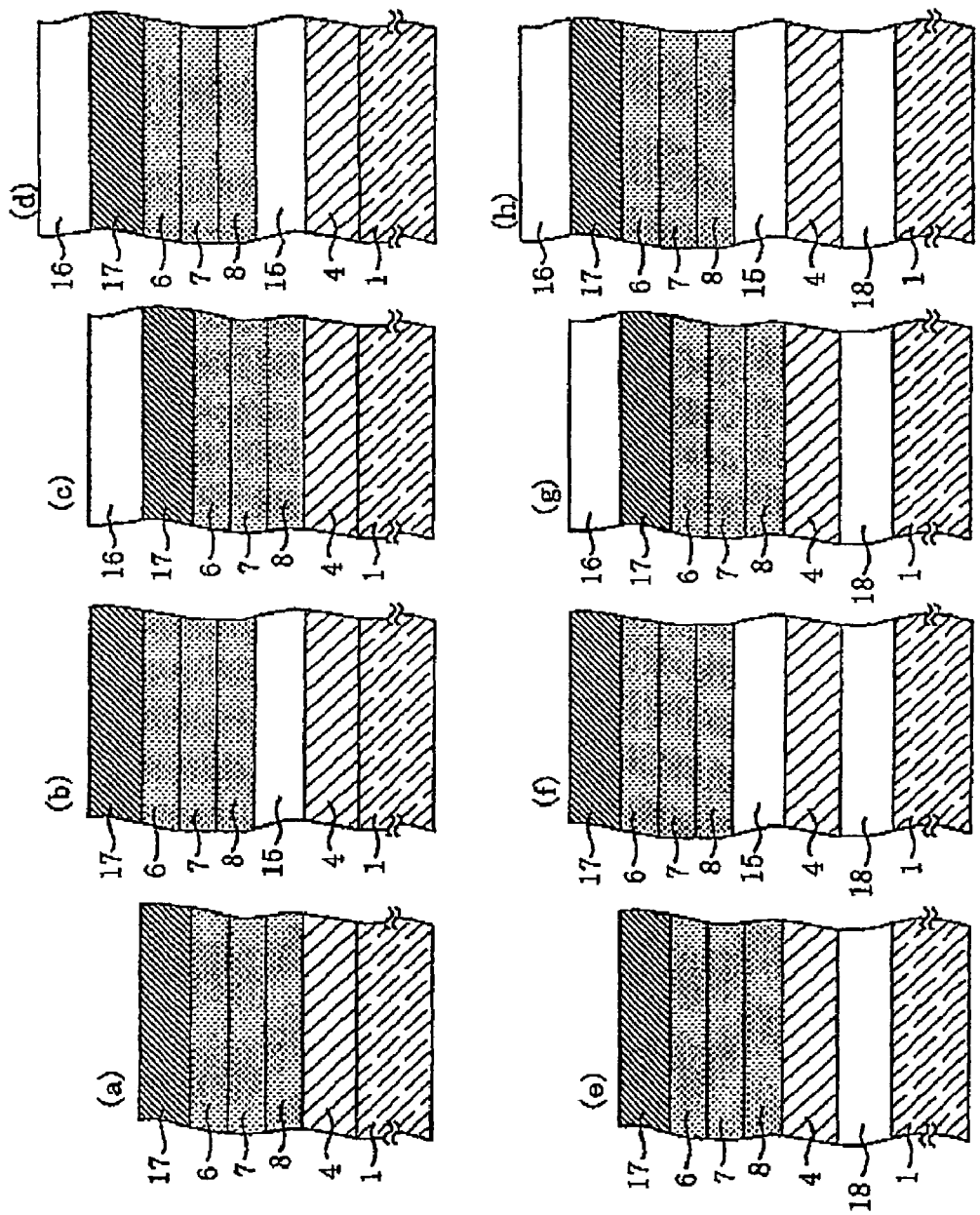
FIGS. 8(a) to 8(h) are sectional views each showing a multilayer structure of a light emitting element according to the present invention.

Now, the present invention will be explained below in more detail with reference to the accompanying drawings in accordance with the embodiments.

FIGS. 1(a) to 8(h) are sectional views showing a layer structure of a light emitting element in an organic EL device according to the present invention.

The structure shown in FIG. 1(a) is configured such that a lower electrode 2, a light emitting layer 9 serving as both a hole injection layer and an electron transport layer, and a transparent electrode layer 4 are sequentially formed on a base assembly 1. In this structure, the transparent electrode layer 4 employs an oxide material of In and Sn having a composition of $In_{2-x}Sn_xO_{3-y}$ ($0.05 \leqq y \leqq 0.2$) (hereinafter ditto with the transparent electrode layer 4), where x is defined such that $0<x<1$, preferably such that $0<x<0.3$. FIG. 1(b) shows an example in which an anode buffer layer 15 is inserted between the light emitting layer 9 serving as both a hole injection layer and an electron transport layer and the transparent electrode layer 4 in the multilayer structure of FIG. 1(a). FIG. 1(c) shows a structure having a protective layer 16 disposed on top of the multilayer structure of FIG. 1(a). FIG. 1(d) shows a structure having the protective layer 16 disposed on top of the multilayer structure of FIG. 1(b). FIGS. 1(e), 1(f), 1(g), and 1(h) show examples in which an enhanced hygroscopic layer 18 is provided on the transparent electrode layer 4 side opposite to the light emitting layer 9 in FIGS. 1(a), 1(b), 1(c), and 1(d), respectively.

The structure shown in FIG. 2(a) is configured such that the lower electrode 2, a light emitting layer 10 serving: also as an electron transport layer, a hole injection layer 8, and the transparent electrode layer 4 are sequentially formed on the base assembly 1. FIG. 2(b) shows an example in which the anode buffer layer 15 is inserted between the hole injection layer 8 and the transparent electrode layer 4 in the multilayer structure of FIG. 2(a). FIG. 2(c) shows a structure having the protective layer 16 disposed on top of: the multilayer structure of FIG. 2(a). FIG. 2(d) shows a structure having the protective layer 16 disposed on top of the multilayer structure of FIG. 2(b). FIGS. 2(e), 2(f), 2(g), and 2(h) show examples in which the enhanced hygroscopic layer 18 is provided on the transparent electrode layer 4 side opposite to the light emitting layer 10 in FIGS. 2(a), 2(b), 2(c), and 2(d), respectively.

The structure shown in FIG. 3(a) is configured such that the lower electrode 2, an electron transport layer 6, a light emitting layer 11 serving also as a hole injection layer, and the transparent electrode layer 4 are sequentially formed on the base assembly 1. FIG. 3(b) shows an example in which the anode buffer layer 15 is inserted between the light emitting layer 11 and the transparent electrode layer 4 in the multilayer structure of FIG. 3(a). FIG. 3(c) shows a structure having the protective layer 16 disposed on top of the multilayer structure of FIG. 3(a). FIG. 3(d) shows a structure having the protective layer 16 disposed on top of the multilayer structure of FIG. 3(b). FIGS. 3(e), 3(f), 3(g), and 3(h) show examples in which the enhanced hygroscopic layer 18 is provided on the transparent electrode layer 4 side opposite to the light emitting layer 11 in FIGS. 3(a), 3(b), 3(c), and 3(d), respectively.

The structure shown in FIG. 4(a) is configured such that the lower electrode 2, the electron transport layer 6, a light emitting layer 7, the hole injection layer 8, and the transparent electrode layer 4 are sequentially formed on the base assembly 1. FIG. 4(b) shows an example in which the anode buffer layer 15 is inserted between the hole injection layer 8 and the transparent electrode layer 4 in the multilayer structure of FIG. 4(a). FIG. 4(c) shows a structure having the protective layer 16 disposed on top of the multilayer structure of FIG. 4(a). FIG. 4(d) shows a structure having the protective layer 16 disposed on top of the multilayer structure of FIG. 4(b). FIGS. 4(e), 4(f), 4(g), and 4(h) show examples in which the enhanced hygroscopic layer 18 is provided on the transparent electrode layer 4 side opposite to the light emitting layer 7 in FIGS. 4(a), 4(b), 4(c), and 4(d), respectively.

The structure shown in FIG. 5(a) is configured such that the transparent electrode layer 4, the light emitting layer 9 serving also as both a hole injection layer and an electron transport layer, and an upper electrode 17 are sequentially formed on the base assembly 1. FIG. 5(b) shows an example in which the anode buffer layer 15 is inserted between the light emitting layer 9 serving also as both a hole injection layer and an electron transport layer and the transparent electrode layer 4 in the multilayer structure of FIG. 5(a). FIG. 5(c) shows a structure having the protective layer 16 disposed on top of the multilayer structure of FIG. 5(a). FIG. 5(d) shows a structure having the protective layer 16 disposed on top of the multi-layer structure of FIG. 5(b). FIGS. 5(e), 5(f), 5(g), and 5(h) show examples in which the enhanced hygroscopic layer 18 is provided between the base assembly 1 and the transparent electrode layer 4 in FIGS. 5(a), 5(b), 5(c), and 5(d), respectively.

The structure shown in FIG. 6(a) is configured such that the transparent electrode layer 4, the hole injection layer 8, the light emitting layer 10 serving also as an electron transport layer, and the upper electrode 17 are sequentially formed on the base assembly 1. FIG. 6(b) shows an example in which the anode buffer layer 15 is inserted between the hole injection layer 8 and the transparent electrode layer 4 in the multilayer structure of FIG. 6(a). FIG. 6(c) shows a structure having the protective layer 16 disposed on top of the multilayer structure of FIG. 6(a). FIG. 6(d) shows a structure having the protective layer 16 disposed on top of: the multilayer structure of FIG. 6(b). FIGS. 6(e), 6(f), 6(g), and 6(h) show examples in which the enhanced hygroscopic layer. 18 is provided between the base assembly 1 and the transparent electrode layer 4 in FIGS. 6(a), 6(b), 6(c), and 6(d), respectively.

The structure shown in FIG. 7(a) is configured such that the transparent electrode layer 4, the light emitting layer 11 serving also as a hole injection layer, the electron transport layer 6, and the upper electrode 17 are sequentially formed on the base assembly 1. FIG. 7(b) shows an example in which the anode buffer layer 15 is inserted between the light emitting layer 11 serving also as a hole injection layer and the transparent electrode layer 4 in the multilayer structure of FIG. 7(a). FIG. 7(c) shows a structure having the protective layer 16 disposed on top of the multilayer structure of FIG. 7(a). FIG. 7(d) shows a structure having the protective layer 16 disposed on top of the multilayer structure of FIG. 7(b). FIGS. 7(e), 7(f), 7(g), and 7(h) show examples in which the enhanced hygroscopic layer 18 is provided between the base assembly 1 and the transparent electrode layer 4 in FIGS. 7(a), 7(b), 7(c), and 7(d), respectively.

The structure shown in FIG. 8(a) is configured such that the transparent electrode layer 4, the hole injection layer 8, the light emitting layer 7, the electron transport layer 6, and the upper electrode 17 are sequentially formed on the base assembly 1. FIG. 8(b) shows an example in which the anode buffer layer 15 is inserted between the hole injection layer 8 and the transparent electrode layer 4 in the multilayer structure of FIG. 8(a). FIG. 8(c) shows a structure having the protective layer 16 disposed on top of the multilayer structure of FIG. 8(a). FIG. 8(d) shows a structure having the protective layer 16 disposed on top of the multilayer structure of FIG. 8(b). FIGS. 8(e), 8(f), 8(g), and 8(h) show examples in which the enhanced hygroscopic layer 18 is provided between the base assembly 1 and the transparent electrode layer 4 in FIGS. 8(a), 8(b), 8(c), and 8(d), respectively.

Figure 9:
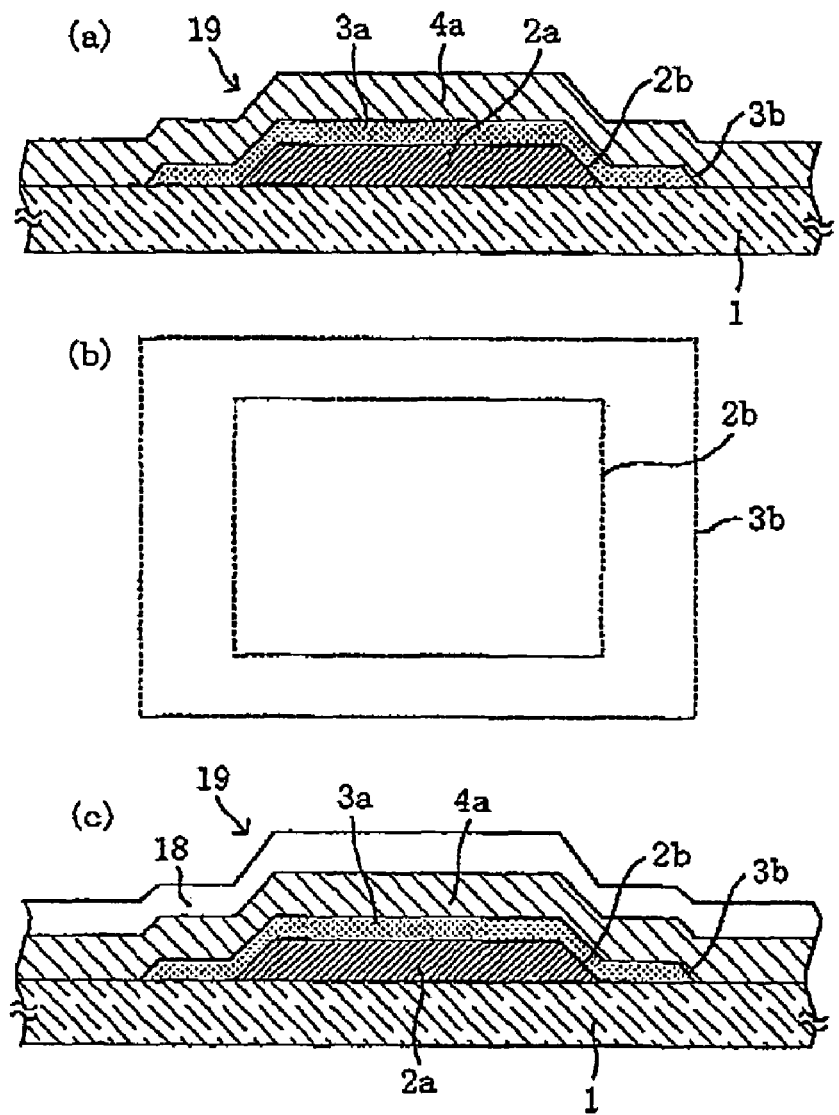
FIGS. 9(a) and 9(b) are sectional and plan views each showing an exemplary light emitting element according to the present invention, FIG. 9(c) being a sectional view showing a modified example of FIG. 9(a)

FIGS. 9(a) and 9(b) are schematic sectional and plan views each showing the structure of a light emitting element 19 in an organic EL device according to an embodiment of the present invention. In this structure, the base assembly 1 is an object for forming a light emitting element on a surface thereof, including a substrate or one having film or an element formed on the substrate (hereinafter ditto with the base assembly 1). On the base assembly 1, there is formed a lower electrode pattern 2a. On the lower electrode pattern 2a, there is formed a light emitting material layer pattern 3a. The light emitting material layer pattern 3a contains at least a light emitting layer, and may also contain an electron transport layer or a hole injection layer in addition to the light emitting layer (hereinafter ditto with the light emitting material layer pattern 3a). The light emitting material layer pattern 3a is larger than the lower electrode pattern 2a, covering the entire region of the lower electrode pattern 2a. In other words, a light emitting material layer pattern end 3b stays outside a lower electrode pattern end 2b over the entire region. On top of the light emitting material layer pattern 3a, there is formed a transparent electrode pattern 4a. In the figure, the transparent electrode pattern 4a is shown as if it is not patterned; however, this means that the pattern is too large to be illustrated as patterned within the range shown in the figure.

In this arrangement, an $In_{2-x}Sn_xO_{3-y}$ ($0.05 \leq y \leq 0.2$), which is deficient in oxygen to be thereby hygroscopic, is formed on the entire region of the lower electrode pattern 2a and the light emitting material layer pattern 3a. This allows the $In_{2-x}Sn_xO_{3-y}$ ($0.05 \leq y \leq 0.2$) to absorb a trace amount of moisture present in the vicinity of the light emitting material layer and thereby keep moisture from the light emitting material.

Here, such a case was shown in which the entire region of the lower electrode pattern 2a is covered with the light emitting material layer pattern 3a. However, this embodiment also includes the case where part of the lower electrode pattern 2a is not covered with the light emitting material layer pattern 3a. Additionally, in the foregoing, such a case was shown in which the entire region of the light emitting material layer pattern 3a is covered with the transparent electrode pattern 4a; however, this embodiment also includes the case where part of the light emitting material layer pattern 3a is not covered with the transparent electrode pattern 4a.

On the other hand, as shown in the schematic sectional view shown in FIG. 9(c), the enhanced hygroscopic layer 18 can also be provided on the transparent electrode pattern 4a of the $In_{2-x}Sn_xO_{3-y}$ ($0.05 \leq y \leq 0.2$). In this case, the enhanced hygroscopic layer accepts the moisture absorbed by the transparent electrode layer 4 and thereby act to further keep moisture from the light emitting material.

In order to entirely block the entrance of moisture and oxygen in the air from above the transparent electrode pattern 4a into the lower electrode pattern 2a and the light emitting material layer pattern 3a, it is also possible to provide a protective layer (not shown) on the transparent electrode pattern 4a or the enhanced hygroscopic layer 18.

Figure 10:
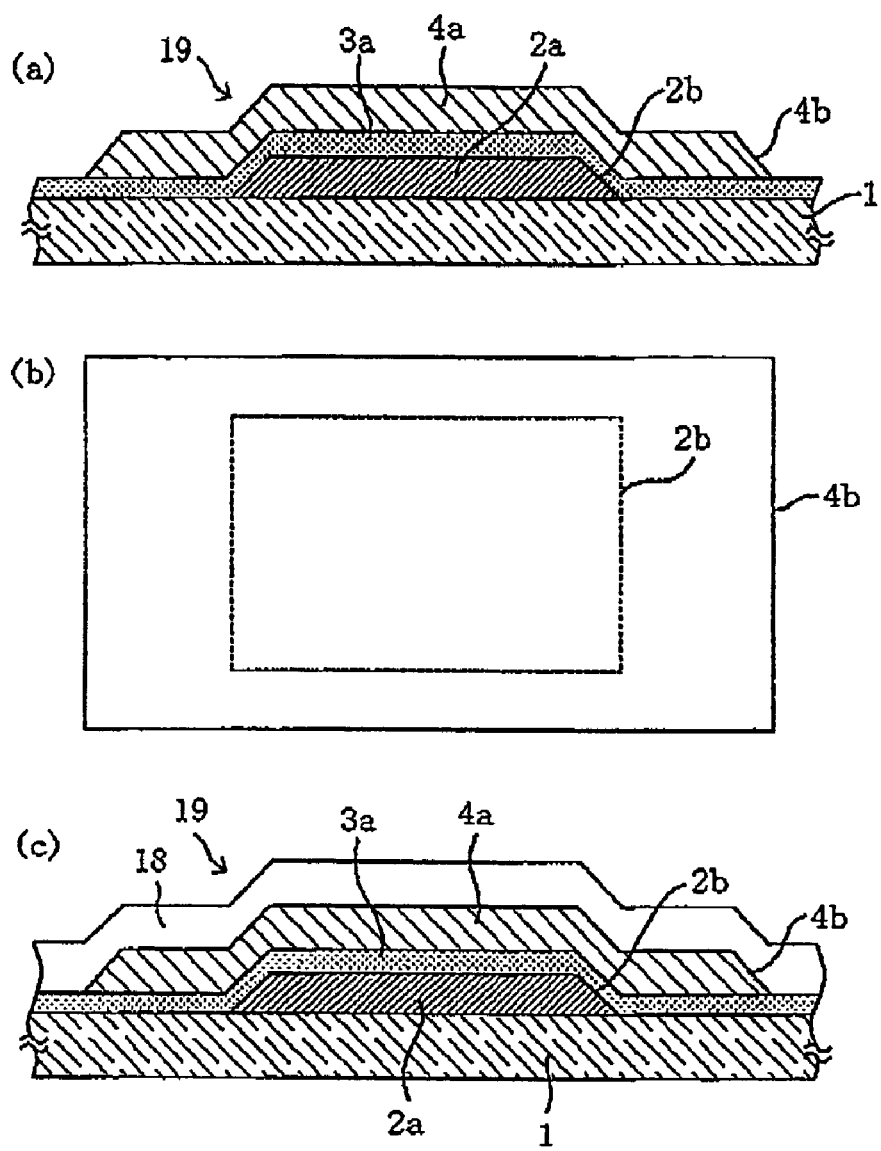
FIGS. 10(a) and 10(b) are sectional and plan views each showing another exemplary light emitting element according to the present invention, FIG. 10(c) being a sectional view showing a modified example of FIG. 10(a)

FIGS. 10(a) and 10(b) are schematic sectional and plan views each showing the structure of a light emitting element 19 in an organic EL device according to an embodiment of the present invention. The lower electrode pattern 2a is formed on the base assembly 1, and the light emitting material layer pattern 3a is formed on the lower electrode pattern 2a. The light emitting material layer pattern 3a is larger than the lower electrode pattern 2a, covering the entire region of the lower electrode pattern 2a. In the figure, the light emitting material layer pattern 3a is shown as if it is not patterned: however, this means that the pattern is too large to be illustrated as patterned within the range shown in the figure. The transparent electrode pattern 4a is formed on the light. emitting material layer pattern 3a. The transparent electrode pattern 4a is smaller than the light emitting material layer pattern 3a but larger than the lower electrode pattern 2a. Additionally, the entire region of the lower electrode pattern 2a is covered with the transparent electrode pattern 4a. In other words, the lower electrode pattern end 2b is located inside a transparent electrode pattern end 4b over the entire region.

In this arrangement, the $In_{2-x}Sn_xO_{3-y}$ ($0.05 \leq y \leq 0.2$), which is deficient in oxygen to be thereby hygroscopic, is formed on the entire region of the lower electrode pattern 2a and the light emitting portion. In this structure, the light emitting portion is a portion of the light emitting material layer pattern 3a which is sandwiched between the lower electrode pattern 2a and the transparent electrode pattern 4a and which emits light by the application of a voltage between the lower electrode pattern 2a and the transparent electrode pattern 4a. In this case, it generally coincides with the portion of the light emitting material layer that is in contact with the lower electrode pattern 2a. This structure allows the $In_{2-x}Sn_xO_{3-y}$ ($0.05 \leq y \leq 0.2$) to absorb a trace amount of moisture present in the vicinity of the light emitting portion of the light emitting material layer and thereby keep moisture from the light emitting material layer.

This structure does not require the light emitting material layer pattern 3a to be patterned with accuracy so that it entirely covers the lower electrode pattern 2a and is covered with the transparent electrode pattern 4a, thereby being easily manufactured and reduced in manufacturing costs when compared with the structure shown in FIGS. 9(a) and 9(b). However, the transparent electrode pattern 4a cannot absorb moisture from the portion of the light emitting material layer pattern 3a which is not covered with the transparent electrode pattern 4a. This region is located apart from the light emitting portion and not directly related to light emission. However, any corrosion in this region may trigger the p eling or the like of the lower electrode pattern 2a, thereby exerting an effect on emission characteristics. To use this structure, it is desirable to employ for the light emitting layer a material that is resistant to corrosion by moisture or oxygen.

Here, such a case has been shown in which the entire region of the lower electrode pattern 2a is covered with the light emitting material layer pattern 3a; however, this embodiment also includes the case where part of the lower electrode pattern 2a is not covered with the light emitting material layer pattern 3a. Additionally, in the foregoing, such a case has been shown in which the entire region of the transparent electrode pattern 4a is formed on the light emitting material layer pattern 3a; however, this embodiment also includes the case where part of the transparent electrode pattern 4a is not formed on the light emitting material layer pattern 3a.

This embodiment shown in FIGS. 10(a) and 10(b) can also be modified as follows. That is, as shown in the sectional view shown in FIG. 10(c), the enhanced hygroscopic layer 18 can also be provided on the transparent electrode pattern 4a. In this case, the enhanced hygroscopic layer 18 accepts the moisture absorbed by the transparent electrode pattern 4a and serves to further keep moisture from the light emitting material.

In order to entirely block the entrance of moisture and oxygen in the air into the lower electrode pattern 2a and the light emitting material layer pattern 3a, it is also possible to provide a protective layer (not shown) on the transparent electrode pattern 4a or the enhanced hygroscopic layer 18.

FIGS. 11(a) and 11(b) are schematic sectional and plan views each showing the structure of a light emitting element 19 in an organic EL device according to an embodiment of the present invention. The lower electrode pattern 2a is formed on the base assembly 1, and the light emitting material layer pattern 3a is formed on the lower electrode pattern 2a. Such a case is shown here in which the entirety of the light emitting material layer pattern 3a is formed on the lower electrode pattern 2a. Around the light emitting material layer pattern 3a, there is formed an insulating layer pattern 5a such that an insulating layer pattern end 5b is in contact with the light emitting material layer pattern end 3b. The transparent electrode pattern 4a is formed on the light emitting material layer pattern 3a so as to cover the entirety thereof.

In this arrangement, the $In_{2-x}Sn_xO_{3-y}$ ($0.05 \leq y \leq 0.2$), which is deficient in oxygen to be thereby hygroscopic, is formed on the entire region of the lower electrode pattern 2a and the light emitting material layer pattern 3a. This allows the $In_{2-x}Sn_xO_{3-y}$ ($0.05 \leq y \leq 0.2$) to absorb a trace amount of moisture present in the vicinity of the light emitting material layer and thereby keep moisture from the light emitting material.

This structure is configured such that the lower electrode pattern 2a and the light emitting material layer pattern 3a are embedded in the insulating layer pattern 5a, thereby allowing the upper portion of the element to be relatively flattened. However, the insulating layer pattern 5a needs to be employed and provided through an additional step, thereby causing an increase in manufacturing costs by that amount.

Here, such a case was shown in which the entire region of the light emitting material layer pattern 3a is formed on the lower electrode pattern 2a; however, this embodiment also includes the case where part of the light emitting material layer pattern 3a is not formed on the lower electrode pattern 2a. Additionally, in the foregoing, such a case was shown in which the entire region of the light emitting material layer pattern 3a is covered with the transparent electrode pattern 4a; however, this embodiment also includes the case where part of the light emitting material layer pattern 3a is not covered with the transparent electrode pattern 4a.

This embodiment shown in FIGS. 11(a) and 11(b) can also be modified as follows. That is, as shown in the sectional view shown in FIG. 11(c), the enhanced hygroscopic layer 18 can also be provided on the hygroscopic transparent electrode pattern 4a. In this case, the enhanced hygroscopic layer accepts the moisture absorbed by the transparent electrode pattern 4a and serves to further keep moisture from the light emitting material.

In order to entirely block the entrance of moisture and oxygen in the air into the lower electrode pattern 2a and the light emitting material layer pattern 3a, it is also possible to provide a protective layer (not shown) on the transparent electrode pattern 4a or the enhanced hygroscopic layer 18.

Figure 11:
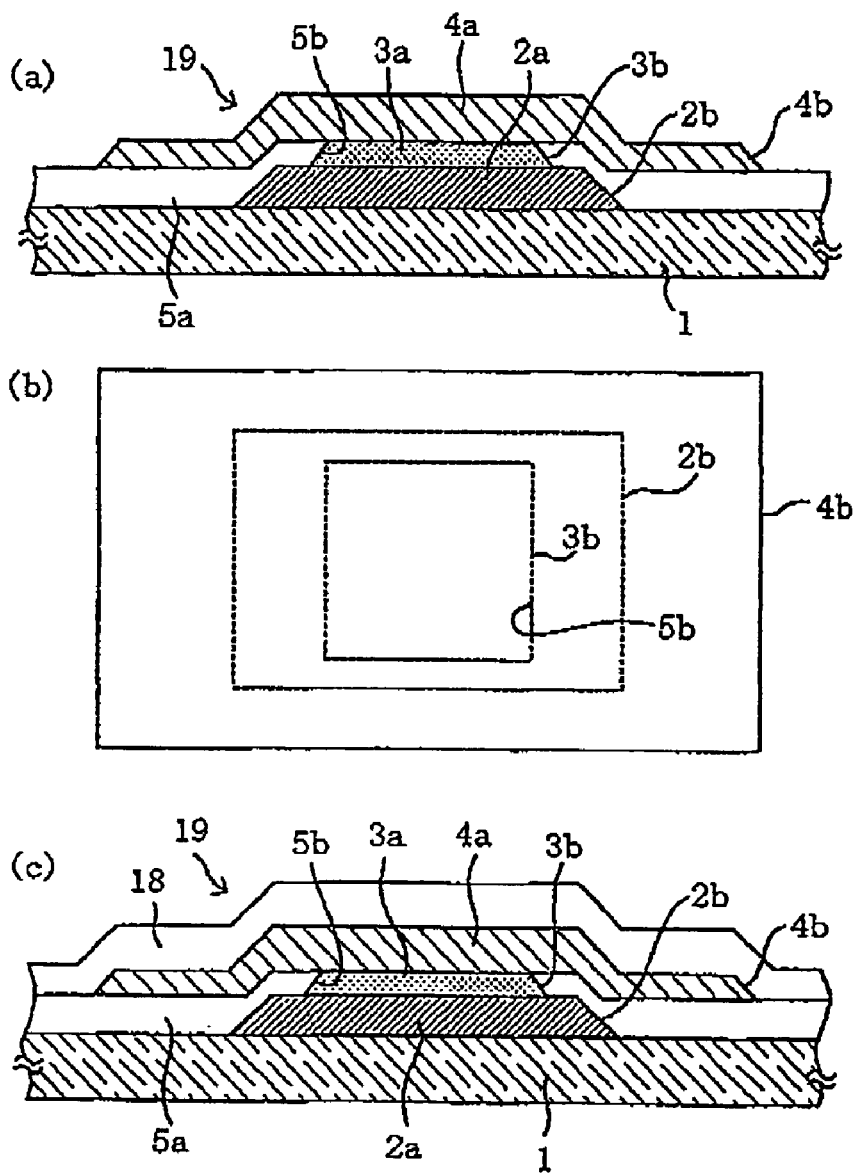
FIGS. 11(a) and 11(b) are sectional and plan views each showing still another exemplary light emitting element according to the present invention, FIG. 11(c) being a sectional view showing a modified example of FIG. 11(a)
Figure 12:
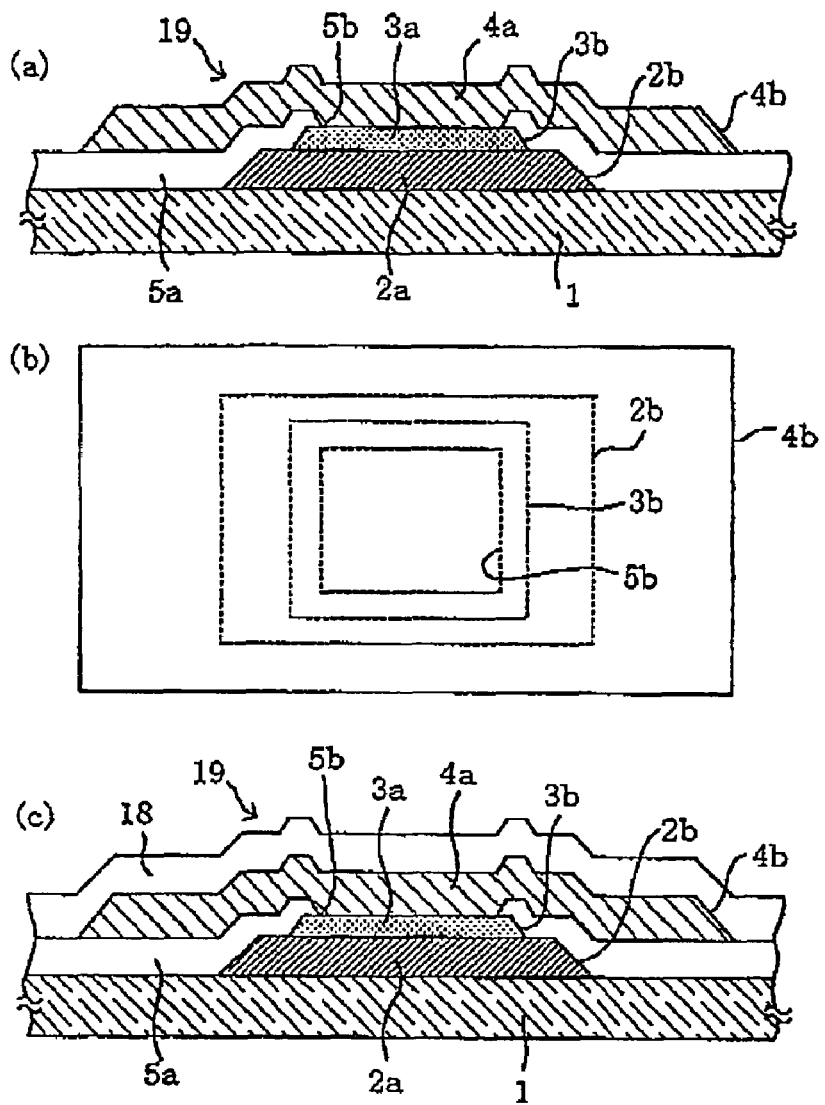
FIGS. 12(a) and 12(b) are sectional and plan views each showing still another exemplary light emitting element according to the present invention, FIG. 12(c) being a sectional view showing a modified example of FIG. 12(a)

The structures shown in FIGS. 12(a), 12(b), and 12(c) are variations of the embodiments shown in FIGS. 11(a), 11(b), and 11(c), with the end 5b of the insulating layer pattern 5a staying on the light emitting material layer pattern 3a. The insulating layer and the light emitting material pattern overlapping each other makes it possible to prevent the occurrence of a leakage current between the lower electrode pattern 2a and the transparent electrode pattern 4a, which may result from a manufacturing error. However, the presence of the insulating layer and the light emitting material pattern overlapping each other causes the upper surface of the light emitting element 19 to deteriorate in flatness more than that of FIG. 11.

FIGS. 13(a) and 13(b) are schematic sectional and plan views each showing the structure of a light emitting element 19 in an organic EL device according to an embodiment of the present invention. The lower electrode pattern 2a is formed on the base assembly 1, and the light emitting material layer pattern 3a is formed on the lower electrode pattern 2a. The light emitting material layer pattern 3a covers the entire region of the lower electrode pattern 2a. On top thereof, the transparent electrode pattern 4a is formed so as to cover the entire pattern of the lower electrode pattern 2a. On the light emitting material layer pattern 3a around the transparent electrode pattern 4a, formed is the insulating layer pattern 5a such that its end 5b is in contact with the transparent electrode pattern end 4b. Although not completely illustrated, the insulating layer pattern 5a is formed so as to cover the entirety of such a portion of the light emitting material layer pattern 3a that is not covered with the transparent electrode pattern 4a.

In this arrangement, the $In_{2-x}Sn_xO_{3-y}$ (0.05≦y≦0.2), which is deficient in oxygen to be thereby hygroscopic, is formed on the entire region of the lower electrode pattern 2a and the entire region of the light emitting material layer pattern 3a that is not covered with the insulating layer. This allows the $In_{2-x}Sn_xO_{3-y}$ to absorb a trace amount of moisture present in the vicinity of the light emitting portion of the light emitting material layer and thereby keep moisture from the light emitting material of that region.

Here, such a case was shown in which the entire region of the lower electrode pattern 2a is covered with the light emitting material layer pattern 3a; however, this embodiment also includes the case where part of the lower electrode pattern 2a is not covered with the light emitting material layer pattern 3a. Additionally, in the foregoing, such a case was shown in which the entire region of the transparent electrode pattern 4a is formed on the light emitting material layer pattern 3a; however, this embodiment also includes the case where part of the transparent electrode pattern 4a is not formed on the light emitting material layer pattern 3a.

This embodiment shown in FIGS. 13(a) and 13(b) can also be modified as follows. That is, as shown in the sectional view shown in FIG. 13(c), the enhanced hygroscopic layer 18 can also be provided on the hygroscopic transparent electrode layer 4 in this case, the enhanced hygroscopic layer accepts the moisture absorbed by the transparent electrode layer 4 and serves to further keep moisture from the light emitting material.

In order to entirely block the entrance of moisture and oxygen in the air into the lower electrode pattern 2a and the light emitting material layer pattern 3a, it is also possible to provide a protective layer (not shown) on the transparent electrode pattern 4a or the enhanced hygroscopic layer 18.

Figure 13:
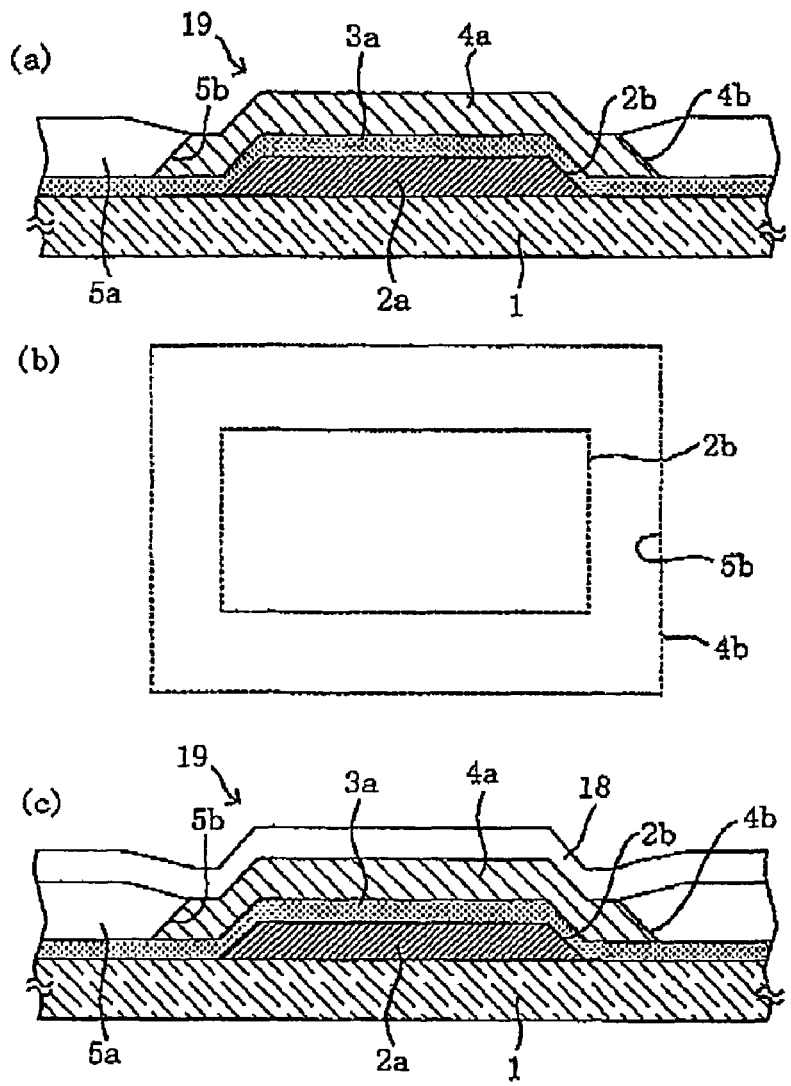
FIGS. 13(a) and 13(b) are sectional and plan views each showing still another exemplary light emitting element according to the present invention, FIG. 13(c) being a sectional view showing a modified example of FIG. 13(a)
Figure 14:
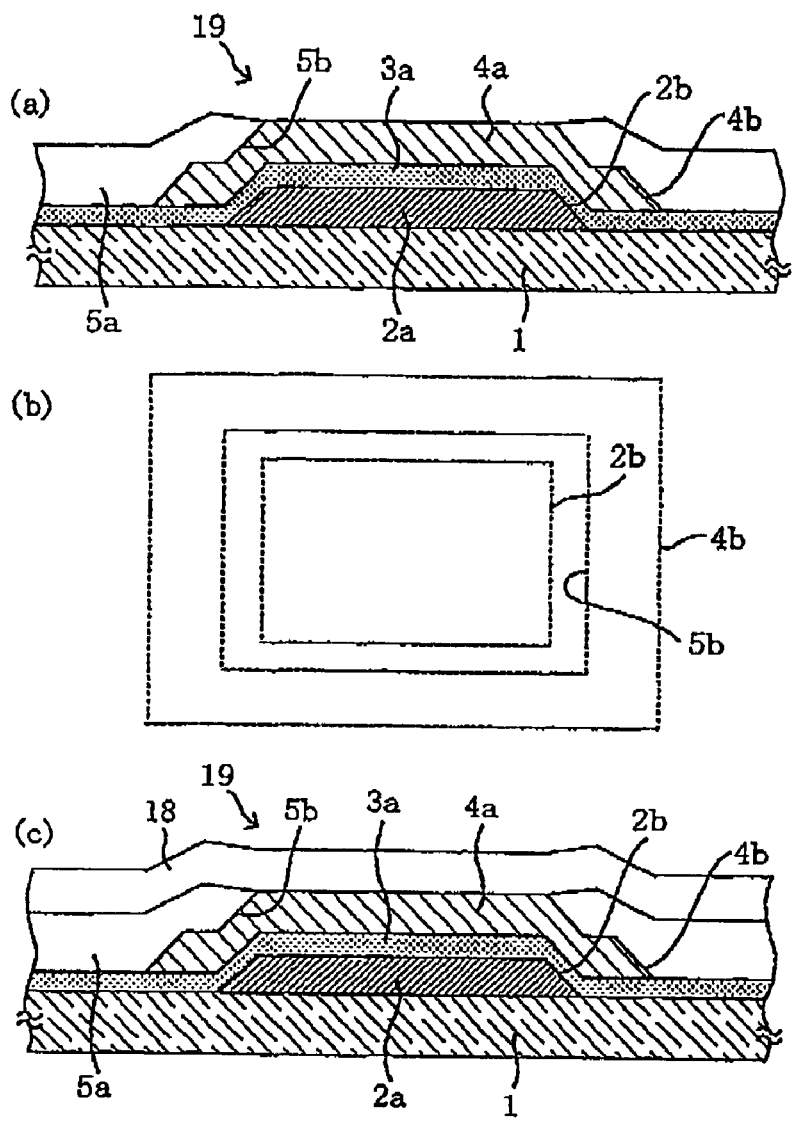
FIGS. 14(a) and 14(b) are sectional and plan views each showing still another exemplary light emitting element according to the present invention, FIG. 14(c) being a sectional view showing a modified example of FIG. 14(a)

The structures shown in FIGS. 14(a), 14(b), and 14(c) are variations of the embodiments shown in FIGS. 13(a), 13(b), and 13(c). In this embodiment, the insulating layer pattern and the transparent electrode pattern are formed to overlap each other so that the insulating layer pattern end 5b is located inside the transparent electrode pattern end 4b. The insulating layer pattern 5a and the transparent electrode pattern 4a overlapping each other makes it possible to prevent the occurrence of a gap between the insulating layer pattern end 5b and the transparent electrode pattern-end 4b, which may result from a manufacturing error, thereby reducing the possibility of corrosion of the light emitting material layer. However, the presence of the insulating layer and the light emitting material pattern overlapping each other causes the upper surface of the light emitting element 19 to deteriorate in flatness more than that of FIG. 13.

Figure 15:
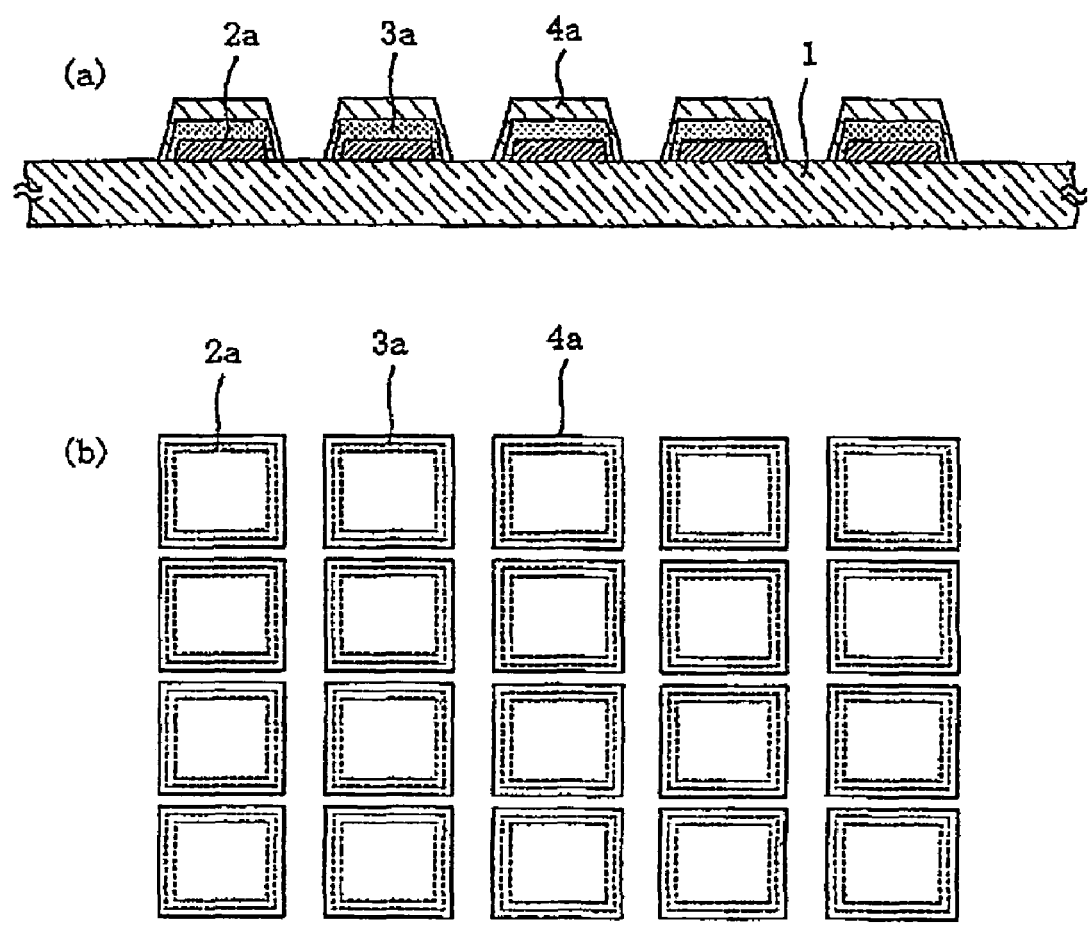
FIGS. 15(a) and 15(b) are sectional and plan views each showing an exemplary arrangement of light emitting elements available to an organic EL device according to the present invention.

FIGS. 15(a) and 15(b) are sectional and plan views each showing an arrangement of light emitting elements in an organic EL device according to an embodiment of the present invention. In each single light emitting element, the lower electrode pattern 2a is formed on the base assembly 1, and the light emitting material layer pattern 3a is formed on the lower electrode pattern 2a so as to cover the entire region thereof. Furthermore, on the light emitting material layer pattern 3a, formed is the transparent electrode pattern 4a so as to cover the entire region thereof. Such elements are arranged in the horizontal and vertical directions as shown in the figure. Here, such an example was shown in which the light emitting elements are arranged vertically in five columns and horizontally in four rows; however, the number of rows and columns can be selected freely.

Figure 16:
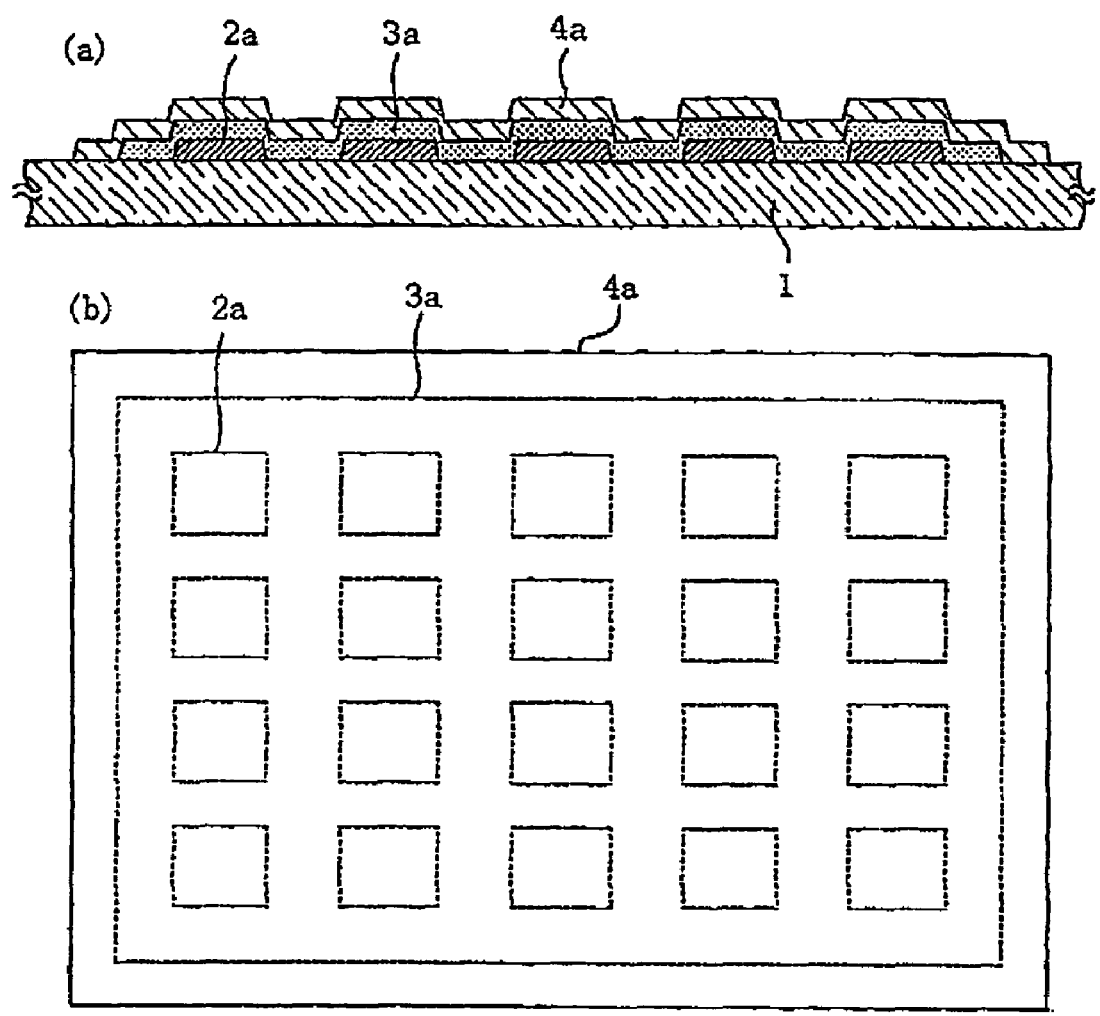
FIGS. 16(a) and 16(b) are sectional and plan views each showing another exemplary arrangement of light emitting elements available to an organic EL device according to the present invention.

FIGS. 16(a) and 16(b) are sectional and plan views each showing an arrangement of light emitting elements in an organic EL device according to an embodiment of the present invention. In this embodiment, the lower electrode pattern 2a is formed on the base assembly 1, and on the lower electrode pattern 2a, formed is the light emitting material layer pattern 3a so as to cover the top of the lower electrode pattern 2a and the top of the base assembly between the lower electrode patterns 2a. That is, the light emitting material layer pattern 3a covers a plurality of lower electrode patterns 2a. On the light emitting material layer pattern 3a, formed is the transparent electrode pattern 4a so as to cover the entire region thereof. A single transparent electrode pattern 4a covers a plurality of lower electrode patterns 2a and light emitting material layer patterns 3a. Here, such an example was shown in which the light emitting elements are arranged vertically in five columns and horizontally in four rows; however, the number of rows and columns can be selected freely. Additionally, in the foregoing, the light emitting material layer pattern 3a and the transparent electrode pattern 4a are common to all the light emitting elements, but not limited thereto, and may cover only a plurality of light emitting elements.

Figure 17:
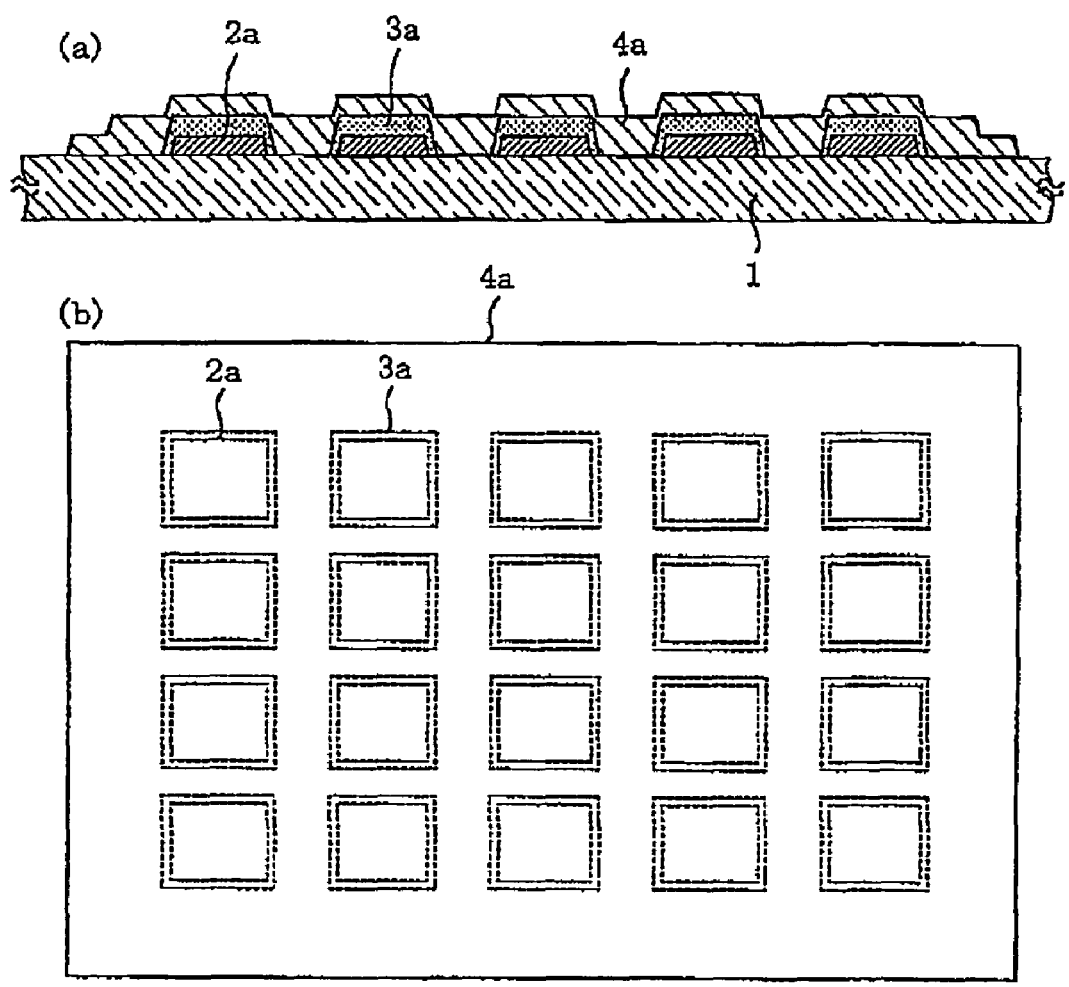
FIGS. 17(a) and 17(b) are sectional and plan views each showing still another exemplary arrangement of light emitting elements available to an organic EL device according to the present invention.

FIGS. 17(a) and 17(b) are sectional and plan views each showing an arrangement of light emitting elements in an organic EL device according to an embodiment of the present invention. In this embodiment, the lower electrode pattern 2a is formed on the base assembly 1, and on each lower electrode pattern 2a, formed is the light emitting material layer pattern 3a so as to cover the entire region thereof. On the light emitting material layer pattern 3a, formed is the transparent electrode pattern 4a so as to cover the top of the light emitting material layer pattern 3a and the top of the base assembly 1 between the light emitting material layer patterns 3a. A single transparent electrode pattern 4a covers a plurality of lower electrode patterns 2a and a plurality of light emitting material layer patterns 3a. Here, such an example was shown in which the light emitting elements are arranged vertically in five columns and horizontally in four rows; however, the number of rows and columns can be selected freely. Additionally, in the foregoing, the transparent electrode pattern 4a is common to all the light emitting elements, but not limited thereto, and may cover only a plurality of light emitting elements.

Figure 18:
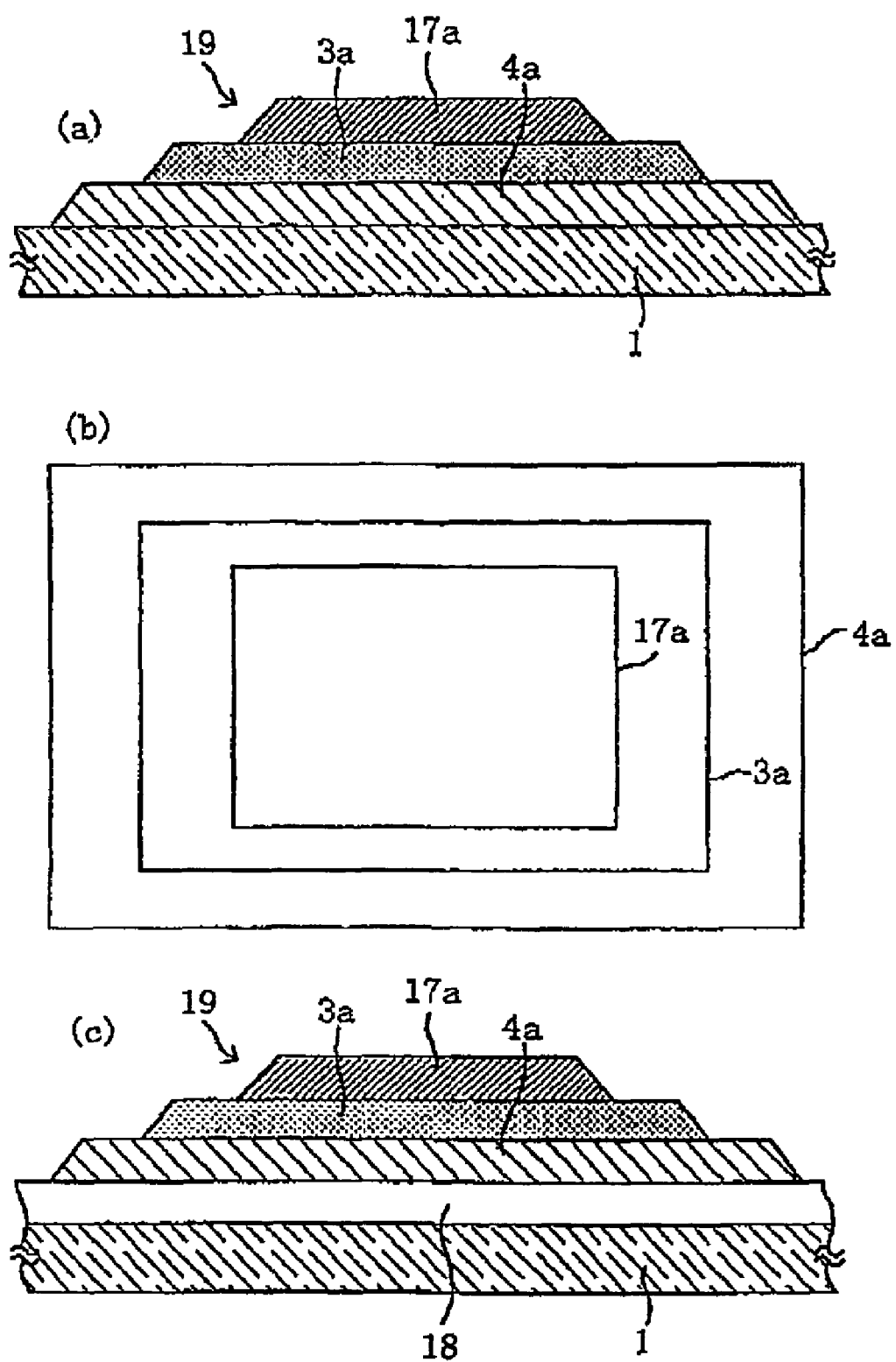
FIGS. 18(a) and 18(b) are sectional and plan views each showing an exemplary structure of a light emitting element in an organic EL device according to the present invention, FIG. 18(c) being a sectional view showing a modified example of FIG. 18(a)

FIGS. 18(a) and 18(b) are sectional and plan views each showing the structure of a light emitting element 19 in an organic EL device according to an embodiment of the present invention. As shown in FIG. 18, the transparent electrode pattern 4a is formed on the base assembly 1, and the light emitting material layer pattern 3a is formed on the transparent electrode pattern 4a so as to cover part thereof. There is formed an upper electrode pattern 17a on the light emitting material layer pattern 3a to cover part thereof. Accordingly, the light emitting material layer pattern 3a is smaller than the transparent electrode pattern 4a, while the upper electrode pattern 17a is smaller than the light emitting material layer pattern 3a.

In this arrangement, the $In_{2-x}Sn_xO_{3-y}$ ($0.05 \leq y \leq 0.2$), which is deficient in oxygen to be thereby hygroscopic, is formed under the entire region of the lower electrode pattern 2a and the light emitting material layer pattern. 3a. This allows the $In_{2-x}Sn_xO_{3-y}$ to absorb a trace amount of moisture present in the vicinity of the light emitting material layer and thereby keep moisture from the light emitting material.

Here, such a case was shown in which the entire region of the light emitting material layer pattern 3a is formed on the transparent electrode pattern 4a; however, this embodiment also includes the case where part of the light emitting material layer pattern 3a is not formed on the transparent electrode pattern 4a. Additionally, in the foregoing, such a case was shown in which the entire region of the upper electrode pattern 17a is formed on the light emitting material layer pattern 3a; however, this embodiment also includes the case where part of the upper electrode pattern 17a is not formed on the light emitting material layer pattern 3a.

This embodiment shown in FIGS. 18(a) and 18(b) can also be modified as follows. That is, as shown in the sectional view shown in FIG. 18(c), the enhanced hygroscopic layer 18 can also be provided under the hygroscopic transparent electrode pattern 4a. In this case, the enhanced hygroscopic layer 18 accepts the moisture absorbed by the transparent electrode pattern 4a and serves to further keep moisture from the light emitting material.

In order to entirely block the entrance of moisture and oxygen in the air into the upper electrode pattern 17a and the light emitting material layer pattern 3a, it is also possible to provide a protective layer (not shown) on the multilayer structure shown.

Figure 19:
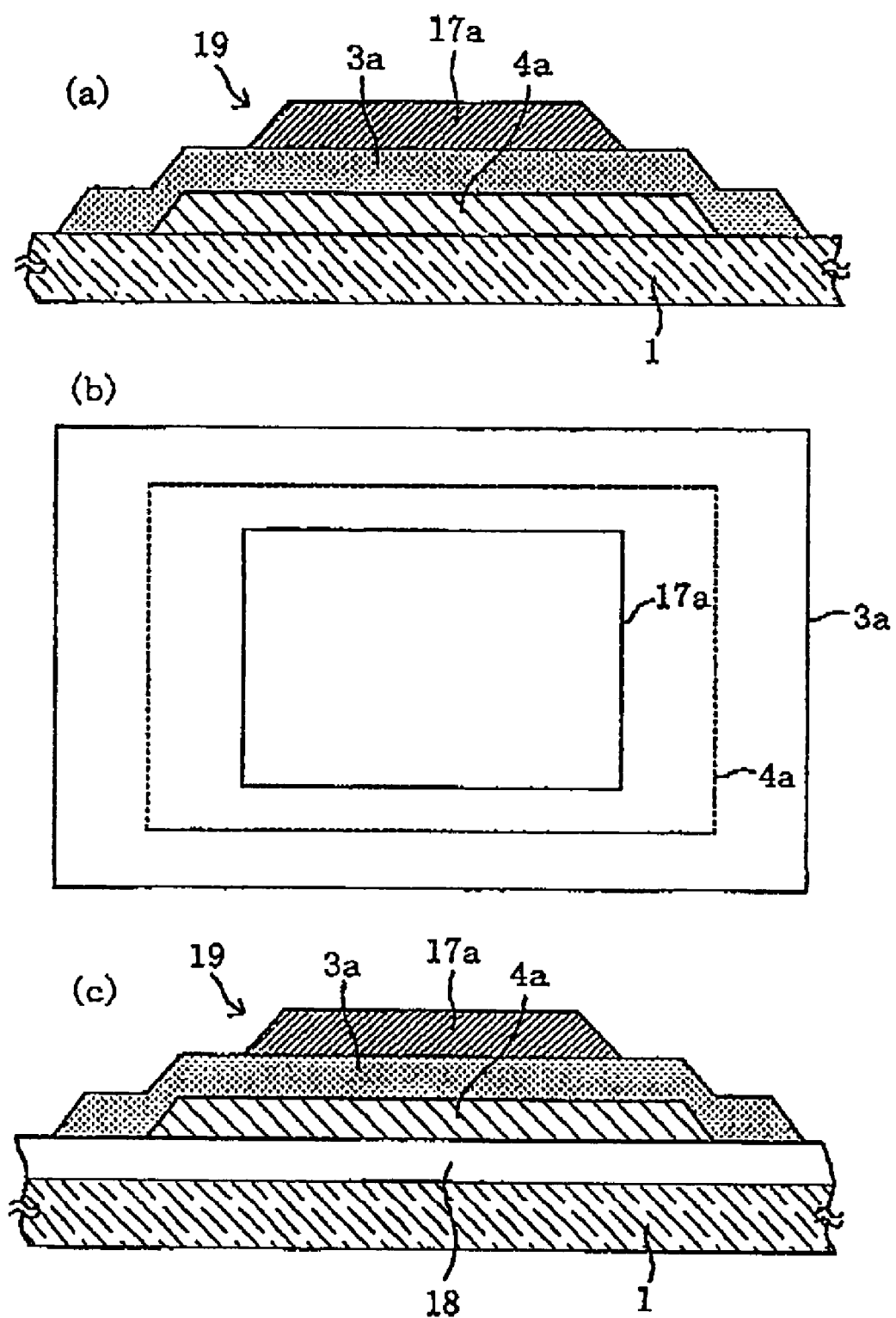
FIGS. 19(a) and 19(b) are sectional and plan views each showing another exemplary structure of a light emitting element in an organic EL device according to the present invention, FIG. 18(c) being a sectional view showing a modified example of FIG. 18(a)

FIGS. 19(a) and 19(b) are sectional and plan views each showing the structure of a light emitting element 19 in an organic EL device according to an embodiment of the present invention. The transparent electrode pattern 4a is formed on the base assembly 1, and the light emitting material layer pattern 3a is formed on the transparent electrode pattern 4a so as to completely cover the top of the transparent electrode pattern 4a. Accordingly, the light emitting material layer pattern 3a is larger than the transparent electrode pattern 4a. On the light emitting material layer pattern 3a, form d is the upper electrode pattern 17a so as to cover part of the top of the light emitting material layer pattern 3a. Accordingly, the upper electrode pattern 17a is smaller than the light emitting material layer pattern 3a.

In this arrangement, the $In_{2-x}Sn_xO_{3-y}$ ($0.05 \leq y \leq 0.2$), which is deficient in oxygen to be thereby hygroscopic, is formed under the upper electrode pattern 17a and the light emitting portion of the light emitting material layer pattern 3a. This allows the $In_{2-x}Sn_xO_{3-y}$ to absorb a trace amount of moisture present in the vicinity of the light emitting material layer and thereby keep moisture from the light emitting material.

This embodiment can make the light emitting material layer pattern 3a larger than that shown in FIGS. 18(a) and (b), thereby facilitating the formation of the light emitting material layer pattern 3a and providing a merit of a broadened scope of selection of the methods for manufacturing the light emitting material layer pattern 3a. However, since a portion of the light emitting material layer pattern 3a may not be formed on the transparent electrode pattern 4a, the light emitting material layer pattern 3a may need to use a material having a better moisture resistance.

Here, such a case was shown in which the entire region of the transparent electrode pattern 4a is covered with the light emitting material layer; however, this embodiment also includes the case where part of the transparent electrode pattern 4a is not covered with the light emitting material layer. Additionally, in the foregoing, such a case was shown in which the entire region of the upper electrode pattern 17a is formed on the light emitting material layer pattern 3a; however, this embodiment also includes the case where part of the upper electrode pattern 17a is not formed on the light emitting material layer pattern 3a.

This embodiment shown in FIGS. 19(a) and 19(b) can also be modified as follows. That is, as shown in the sectional view shown in FIG. 19(c), the enhanced hygroscopic layer 18 can also be provided between the hygroscopic transparent electrode layer 4 and the base assembly 1. In this case, the enhanced hygroscopic layer accepts the moisture absorbed by the transparent electrode layer 4 and serves to further keep moisture from the light emitting material.

In order to entirely block the entrance of moisture and oxygen in the air into the upper electrode pattern 17a and the light emitting material layer pattern 3a, it is also possible to provide a protective layer (not shown) on the multilayer structure shown.

Figure 20:
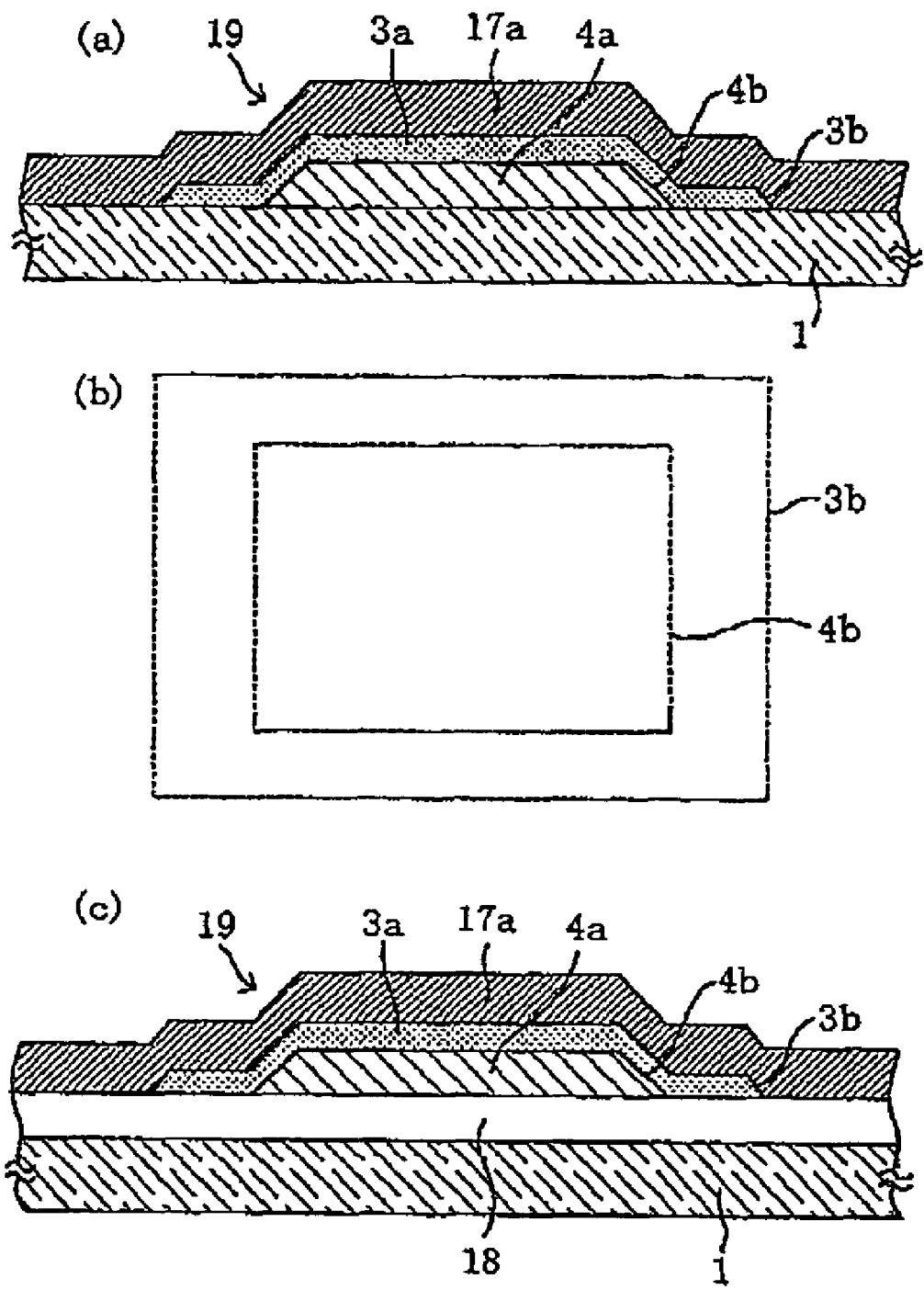
FIGS. 20(a) and 20(b) are sectional and plan views each showing still another exemplary structure of a light emitting element in an organic EL device according to the present invention, FIG. 20(c) being a sectional view showing a modified example of FIG. 20(a)

FIGS. 20(a) and 20(b) are sectional and plan views each showing the structure of a light emitting element 19 in an organic EL device according to an embodiment of the present invention. The transparent electrode pattern 4a is formed on the base assembly 1, and the light emitting material layer pattern 3a is formed on the transparent electrode pattern 4a so as to completely cover the transparent electrode pattern 4a. On the light emitting material layer pattern 3a, formed is the upper electrode pattern 17a so as to completely cover the top of the light emitting material layer pattern 3a. Accordingly, the light emitting material layer pattern 3a is larger than the transparent electrode pattern 4a, while the upper electrode pattern 17a is larger than the light emitting material layer pattern 3a.

In this arrangement, the $In_{2-x}Sn_xO_{3-y}$ ($0.05 \leq y \leq 0.2$), which is deficient in oxygen to be thereby hygroscopic, is formed under the light emitting material layer pattern 3a serving as a light emitting portion. This allows the $In_{2-x}Sn_xO_{3-y}$ ($0.05 \leq y \leq 0.2$) to absorb a trace amount of moisture present in the vicinity of the light emitting material layer and thereby keep moisture from the light emitting material.

This arrangement can also make the light emitting material layer pattern 3a and the upper electrode pattern 17a larger than that shown in FIGS. 18(a) and (b), thereby facilitating the formation of the light emitting material layer pattern 3a and the upper electrode pattern 17a and providing a merit of a broadened scope of selection of the methods for manufacturing the light emitting material layer pattern 3a and the upper electrode pattern 17a. However, since some portions of the light emitting material layer pattern 3a and the upper electrode pattern 17a are not formed on the transparent electrode pattern 4a, the light emitting material layer pattern 3a may possibly need to use a material having a better moisture resistance.

Here, such a case was shown in which the entire region of the transparent electrode pattern 4a is covered with the light emitting material layer; however, this embodiment also includes the case where part of the transparent electrode pattern 4a is not covered with the light emitting material layer. Additionally, in the foregoing, such a case was shown in which the entire region of the light emitting material layer pattern 3a is covered with the upper electrode pattern 17a; however, this embodiment also includes the case where part of the light emitting material layer pattern 3a is not covered with the upper electrode pattern 17a.

This embodiment shown in FIGS. 20(a) and 20(b) can also be modified as follows. That is, as shown in the sectional view shown in FIG. 20(c), the enhanced hygroscopic layer 18 can also be provided between the hygroscopic transparent electrode layer 4, and the base assembly 1. In this case, the enhanced hygroscopic layer accepts the moisture absorbed by the transparent electrode layer 4 and serves to further keep moisture from the light emitting material.

In order to entirely block the entrance of moisture and oxygen in the air into the upper electrode pattern 17a and the light emitting material layer pattern 3a, it is also possible to provide a protective layer (not shown) on the multilayer structure shown.

Figure 21:
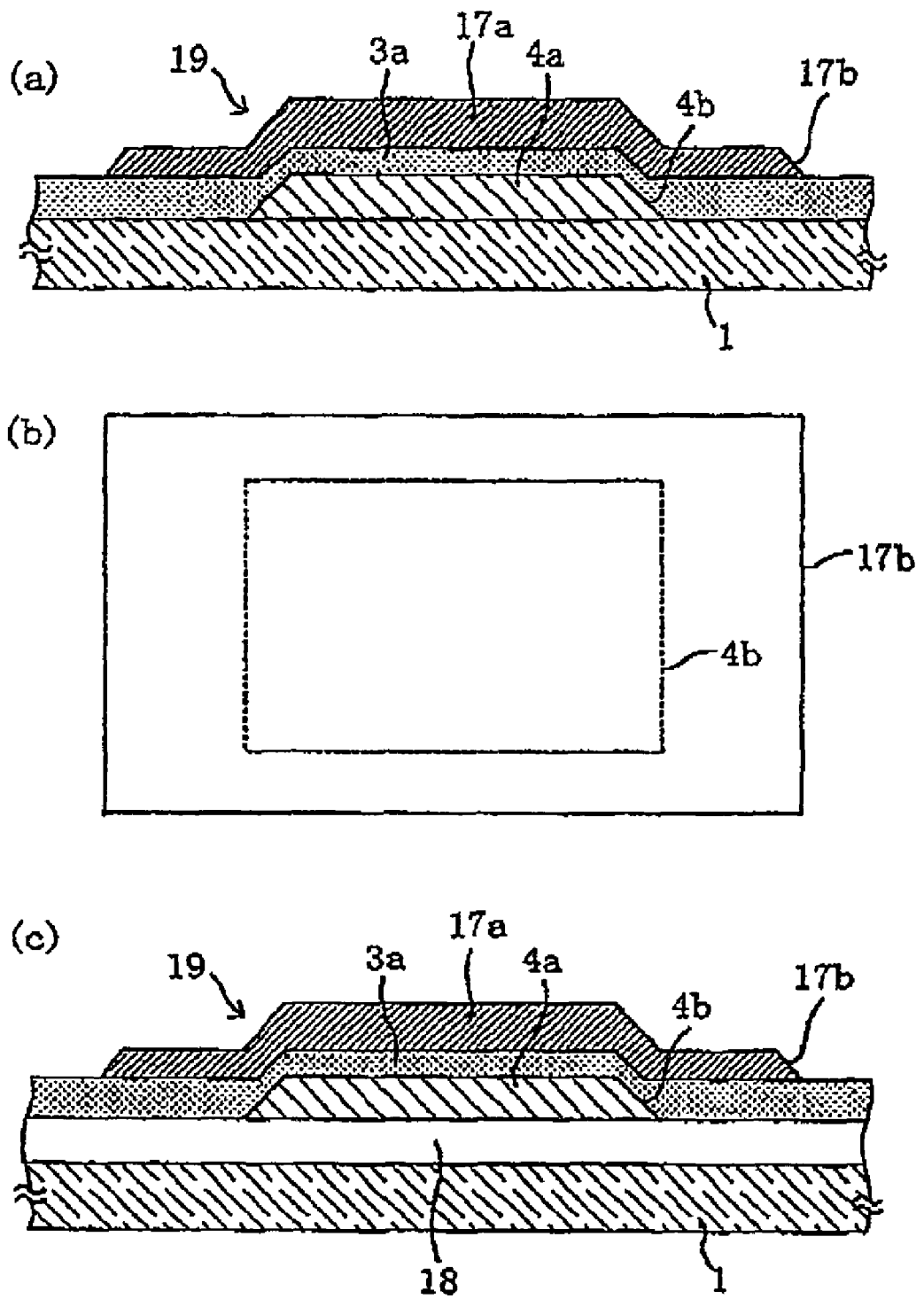
FIGS. 21(a) and 21(b) are sectional and plan views each showing still another exemplary structure of a light emitting element in an organic EL device according to the present invention, FIG. 21(c) being a sectional view showing a modified example of FIG. 21(a)

FIGS. 21(a) and 21(b) are sectional and plan views each showing the structure of a light emitting element 19 in an organic EL device according to an embodiment of the present invention. The transparent electrode pattern 4a is formed on the base assembly 1, and the light emitting material layer pattern 3a is formed on the transparent electrode pattern 4a so as to completely cover the transparent electrode pattern 4a. Accordingly, the light emitting material layer pattern 3a is larger than the transparent electrode pattern 4a. On the light emitting material layer pattern 3a, formed is the upper electrode pattern 17a so as to cover the top of the transparent electrode pattern 4a. The upper electrode pattern 17a is smaller than the light emitting material layer pattern 3a.

In this arrangement, the $In_{2-x}Sn_xO_{3-y}$ ($0.05 \leq y \leq 0.2$), which is deficient in oxygen to be thereby hygroscopic, is formed under the light emitting material layer pattern 3a serving as the light emitting portion. This allows the $In_{2-x}Sn_xO_{3-y}$ ($0.05 \leq y \leq 0.2$) to absorb a trace amount of moisture present in the vicinity of the light emitting material layer and thereby keep moisture from the light emitting material.

This arrangement can also make the light emitting material layer pattern 3a and the upper electrode pattern 17a larger than that shown in FIGS. 18(a) and (b), thereby facilitating the formation of the light emitting material layer pattern 3a and the upper electrode pattern 17a and providing a merit of a broadened scope of selection of the methods for manufacturing the light emitting material layer pattern 3a and the upper electrode pattern 17a. However, since some portions of the light emitting material layer pattern 3a and the upper electrode pattern 17a may not be formed on the transparent electrode pattern 4a, the light emitting material layer pattern 3a may possibly need to use a material having a better moisture resistance.

This embodiment shown in FIGS. 21(a) and 21(b) can also be modified as follows. That is, as shown in the sectional view shown in FIG. 21(c), the enhanced hygroscopic layer 18 can also be provided between the transparent electrode pattern 4a and light emitting material layer pattern 3a and the base assembly 1. In this case, the enhanced hygroscopic layer accepts the moisture absorbed by the transparent electrode pattern 4a and serves to further keep moisture from the light emitting material. In addition, it is also possible to provide an improved durability to the light emitting material by absorbing moisture from the region of the light emitting material layer pattern 3a that is not in contact with the transparent electrode pattern 4a.

In order to entirely block the entrance of moisture and oxygen in the air into the upper electrode pattern 17a and the light emitting material layer pattern 3a, it is also possible to provide a protective layer (not shown) on the multilayer structure shown.

FIGS. 22(a) and 22(b) are sectional and plan views each showing the structure of a light emitting element 19 in an organic EL device according to an embodiment of the present invention. The transparent electrode pattern 4a is formed on the base assembly 1, and the light emitting material layer pattern 3a is formed on the transparent electrode pattern 4a so as to cover part of the transparent electrode pattern 4a. Accordingly, the light emitting material layer pattern 3a is smaller than the transparent electrode pattern 4a. The insulating layer pattern 5a is formed around the light emitting material layer pattern 3a so as to embed the light emitting material layer pattern 3a therein. On the light emitting material layer pattern 3a and the insulating layer pattern 5a, formed is the upper electrode pattern 17a so as to completely cover the top of the light emitting material layer pattern 3a. Accordingly, the upper electrode pattern 17a is larger than the light emitting material layer pattern 3a.

In this arrangement, the $In_{2-x}Sn_xO_{3-y}$ ($0.05 \leq y \leq 0.2$), which is deficient in oxygen to be thereby hygroscopic, is formed under the light emitting material layer pattern 3a. This allows the $In_{2-x}Sn_xO_{3-y}$ ($0.05 \leq y \leq 0.2$) to absorb a trace amount of moisture present in the vicinity of the light emitting material layer and thereby keep moisture from the light emitting material.

This embodiment allows the transparent electrode pattern 4a and the light emitting material layer pattern 3a to be embedded in the insulating layer pattern 5a, thereby providing a merit of the upper surface of the light emitting element 19 being flatter when compared with the cases shown in FIGS. 18 to 21. However, this embodiment requires an additional step of embedding in the insulating layer pattern 5a, thereby causing an increase in manufacturing costs.

Here, such a case was shown in which the entire region of the light emitting material layer pattern 3a is formed on the transparent electrode pattern 4a; however, this embodiment also includes the case where part of the light emitting material layer pattern 3a is not formed on the transparent electrode pattern 4a. Additionally, in the foregoing, such a case was shown in which the entire region of the light emitting material layer pattern 3a is covered with the upper electrode pattern 17a; however, this embodiment also includes the case where part of the light emitting material layer pattern 3a is not covered with the upper electrode pattern 17a.

This embodiment shown in FIGS. 22(a) and 22(b) can also be modified as follows. That is, as shown in the sectional view shown in FIG. 22(c), the enhanced hygroscopic layer 18 can also be provided between the hygroscopic transparent electrode layer 4 and the base assembly 1. In this case, the enhanced hygroscopic layer accepts the moisture absorbed by the transparent electrode layer 4 and serves to further keep moisture from the light emitting material.

In order to entirely block the entrance of moisture and oxygen in the air into the upper electrode pattern 17a and the light emitting material layer pattern 3a, it is also: possible to provide a protective layer (not shown) on the multilayer structure shown.

Figure 22:
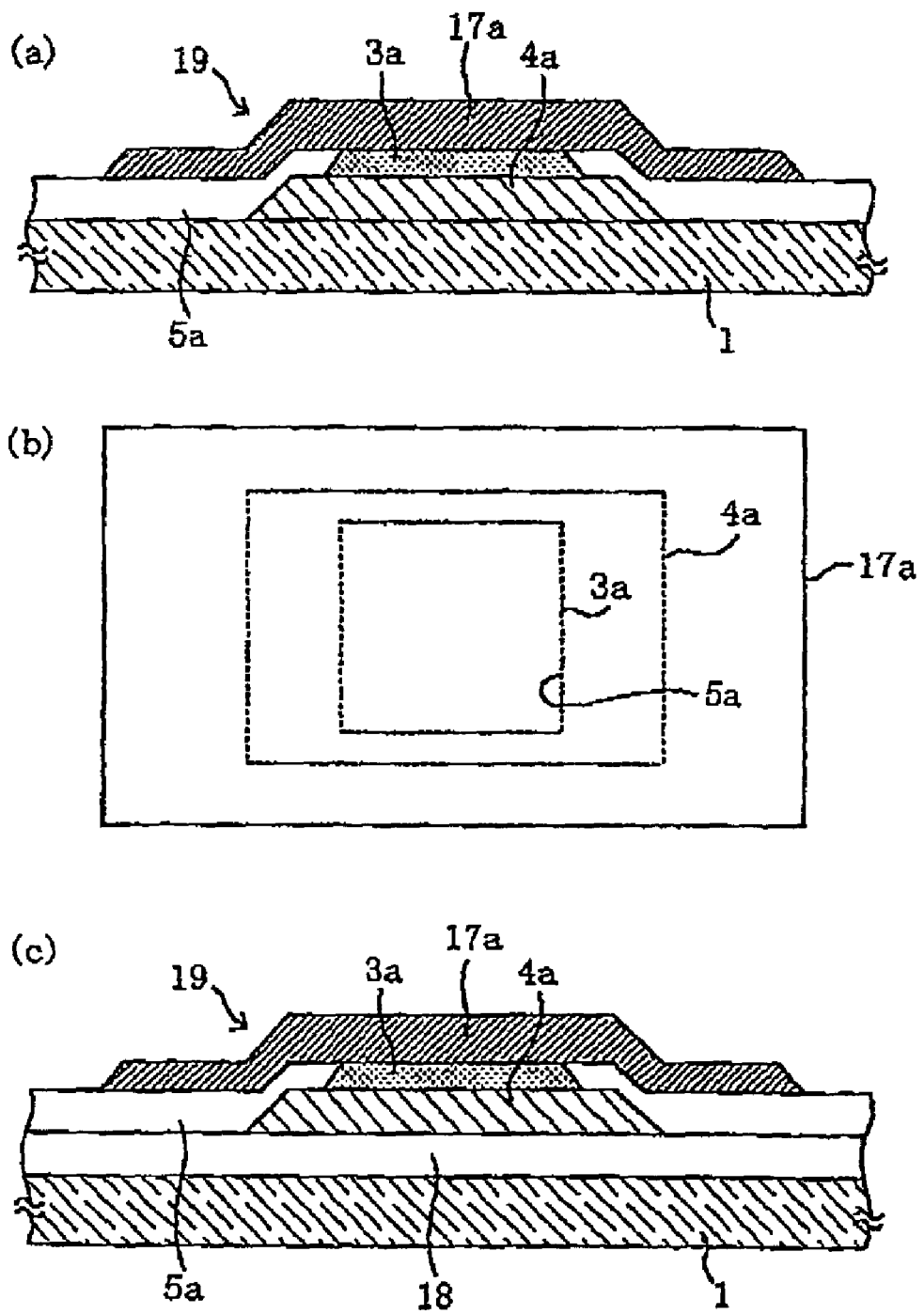
FIGS. 22(a) and 22(b) are sectional and plan views each showing still another exemplary structure of a light emitting element in an organic EL device according to the present invention, FIG. 22(c) being a sectional view showing a modified example of FIG. 22(a)
Figure 23:
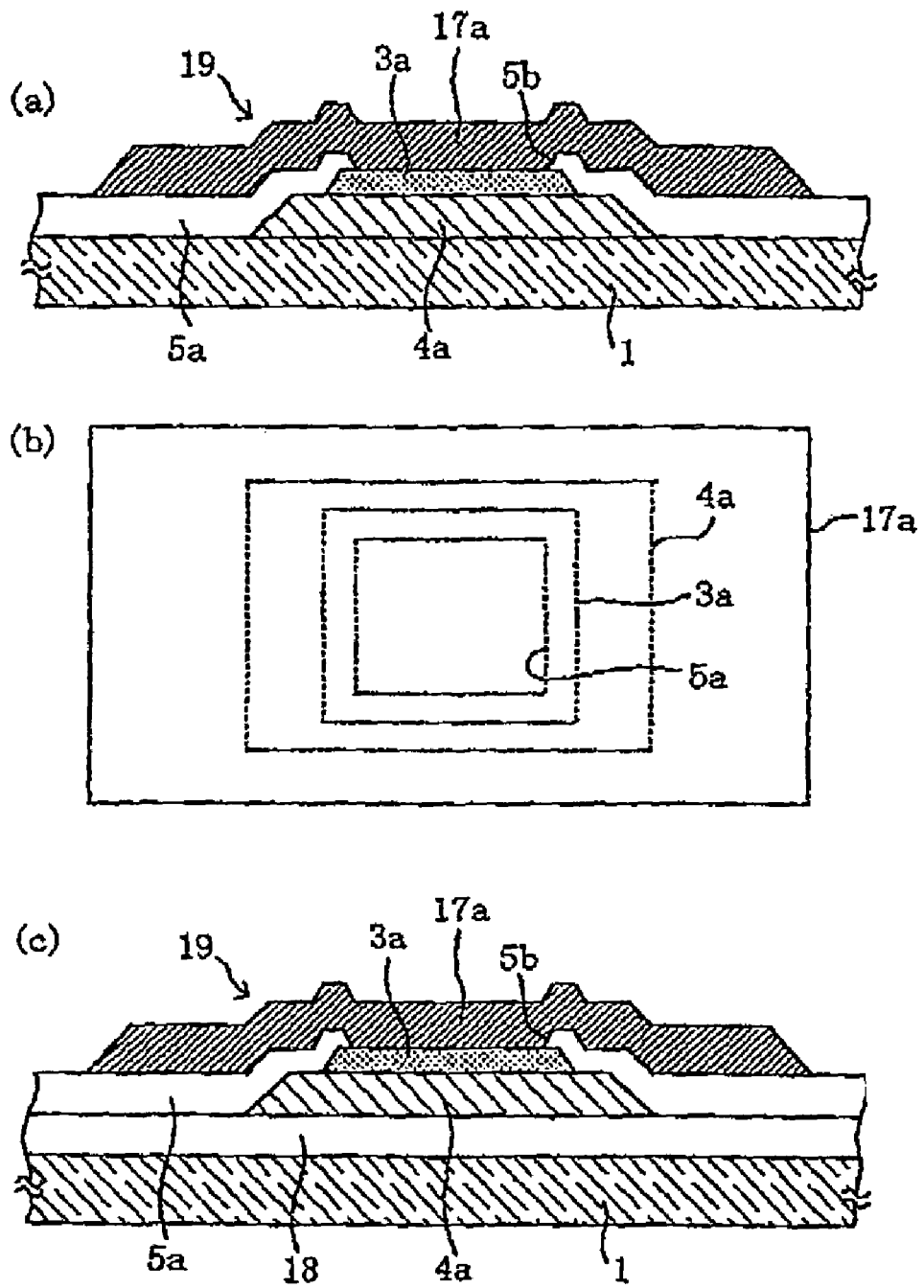
FIGS. 23(a) and 23(b) are sectional and plan views each showing still another exemplary structure of a light emitting element in an organic EL device according to the present invention, FIG. 23(c) being a sectional view showing a modified example of FIG. 23(a)

The structures shown in FIGS. 23(a), 23(b), and 23(c) are variations of the embodiments shown in FIGS. 22(a), 22(b), and 22(c), with the end 5b of the insulating layer pattern 5a staying on the light emitting material layer pattern 3a. The insulating layer and the light emitting material pattern overlapping each other makes it possible to prevent the occurrence of a leakage current between the upper electrode pattern 17a and the transparent electrode pattern 4a, which may result from a manufacturing error. However, the presence of the insulating layer and the light emitting material pattern overlapping each other causes the upper surface of the light emitting element 19 to deteriorate in flatness more than that of FIG. 22.

Figure 24:
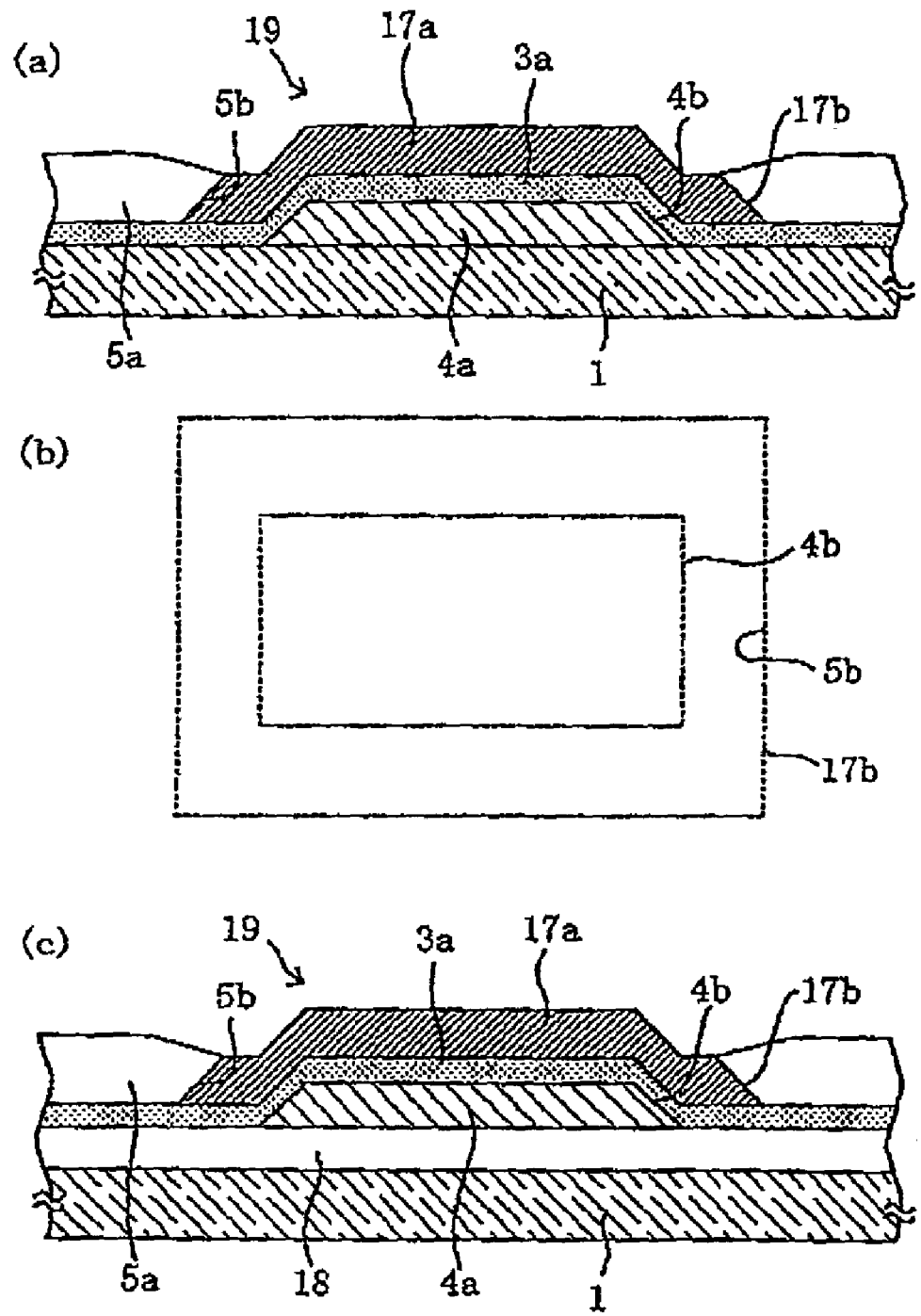
FIGS. 24(a) and 24(b) are sectional and plan views each showing still another exemplary structure of a light emitting element in an organic EL device according to the present invention, FIG. 24(c) being a sectional view showing a modified example of FIG. 24(a)

FIGS. 24(a) and 24(b) are schematic sectional and plan views each showing the structure of a light emitting element 19 in an organic EL device according to an embodiment of the present invention. The transparent electrode pattern 4a is formed on the base assembly 1, and the light emitting material layer pattern 3a is formed on the transparent electrode pattern 4a. The light emitting material layer pattern 3a covers the entire region of the transparent electrode pattern 4a. On top thereof, the upper electrode pattern 17a is formed to cover the entire top of the transparent electrode pattern 4a. On the light emitting material layer pattern 3a around the upper electrode pattern 17a, formed is the insulating layer pattern 5a such that the insulating layer pattern end 5b is in contact with an upper electrode pattern end 17b. In this arrangement, the insulating layer pattern 5a is formed so as to cover the entire portion of the light emitting material layer pattern 3a that is not covered With the upper electrode pattern 17a.

In this arrangement, the $In_{2-x}Sn_xO_{3-y}$ ($0.05 \leq y \leq 0.2$), which is deficient in oxygen to be thereby hygroscopic, is formed under the light emitting portion of the light emitting material layer pattern 3a. This allows the $In_{2-x}Sn_xO_{3-y}$ ($0.05 \leq y \leq 0.2$) to absorb a trace amount of moisture present in the vicinity of the light emitting material layer and thereby keep moisture from the light emitting material of that region.

Here, such a case was shown in which the entire region of the transparent electrode pattern 4a is covered with the light emitting material layer; however, this embodiment also includes the case where part of the transparent electrode pattern 4a is not covered with the light emitting material layer. Additionally, in the foregoing, such a case was shown: in which the entire region of the upper electrode pattern 17a is formed on the light emitting material layer pattern 3a; however, this embodiment also includes the case where part of the upper electrode pattern 17a is not formed on the light emitting material layer pattern 3a.

This embodiment shown in FIGS. 24(a) and 24(b) can also be modified as follows. That is, as shown in the sectional view shown in FIG. 24(c), the enhanced hygroscopic layer 18 can also be provided under the hygroscopic transparent electrode pattern 4a and the light emitting material layer pattern 3a. In this case, the enhanced hygroscopic layer accepts the moisture absorbed by the transparent electrode layer 4 and serves to further keep moisture from the light emitting material. In addition, it is also possible to provide an improved durability to the light emitting material by absorbing moisture from the region of the light emitting material layer pattern 3a that is not in contact with the transparent electrode pattern 4a.

In order to entirely block the entrance of moisture and oxygen in the air into the upper electrode pattern 17a and the light emitting material layer pattern 3a, it is also possible to provide a protective layer (not shown) on the multilayer structure shown.

Figure 25:
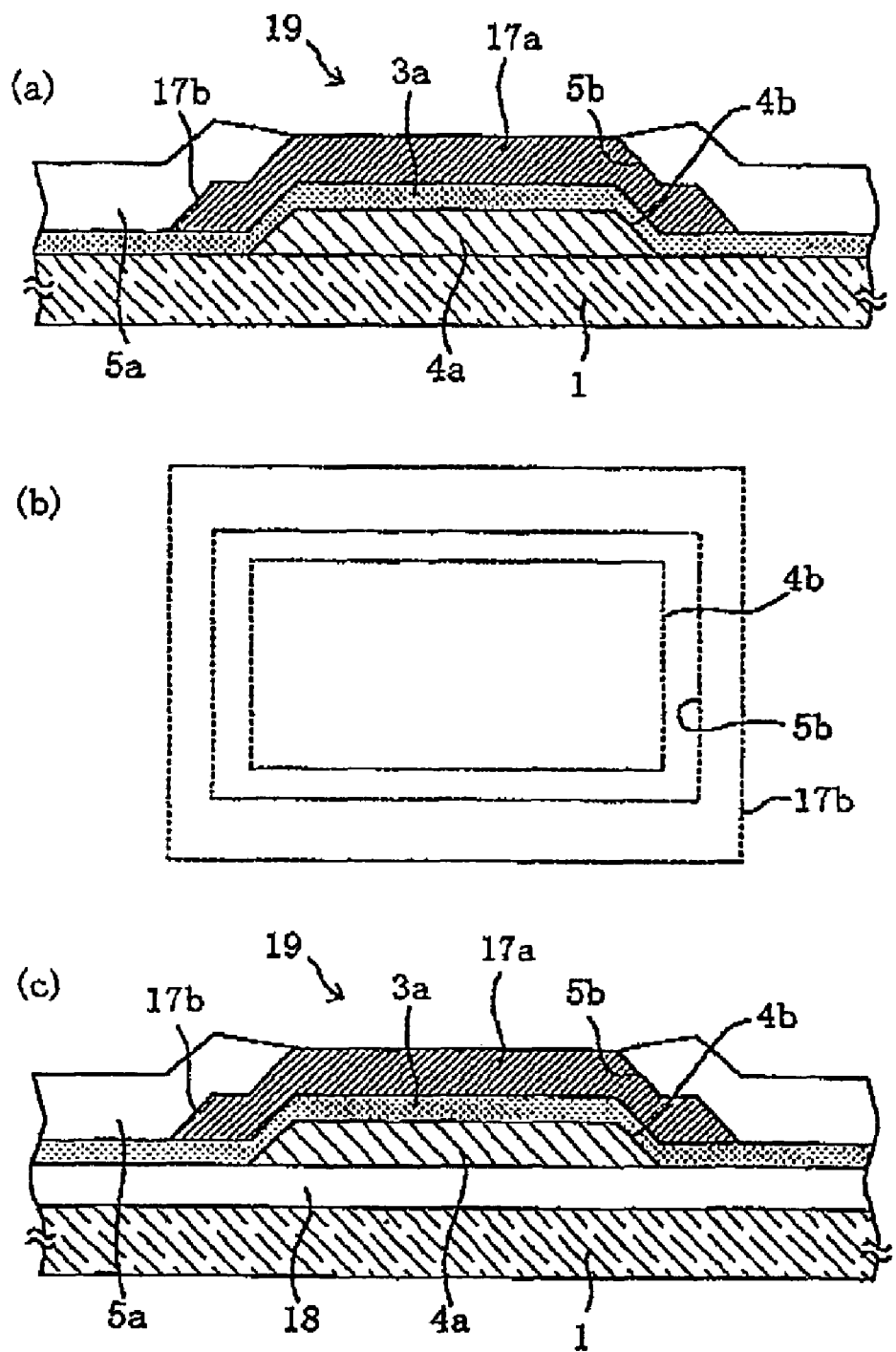
FIGS. 25(a) and 25(b) are sectional and plan views each showing still another exemplary structure of a light emitting element in an organic EL device according to the present invention, FIG. 25(c) being a sectional view showing a modified example of FIG. 25(a)

The structures shown in FIGS. 25(a), 25(b), and 25(c) are variations of the embodiments shown in FIGS. 24(a), 24(b), and 24(c), with the end 5b of the insulating layer pattern 5a staying on the upper electrode pattern 17a. That is, in this embodiment, the insulating layer pattern 5a is formed so that its end 5b is located on the transparent electrode pattern end 4b. The insulating layer pattern 5a and the upper electrode pattern 17a overlapping each other makes it possible to prevent the occurrence of a gap between the insulating layer pattern end 5b and the upper electrode pattern end 17b, which may result from a manufacturing error, thereby reducing the possibility of corrosion of the light emitting material layer.

Figure 26:
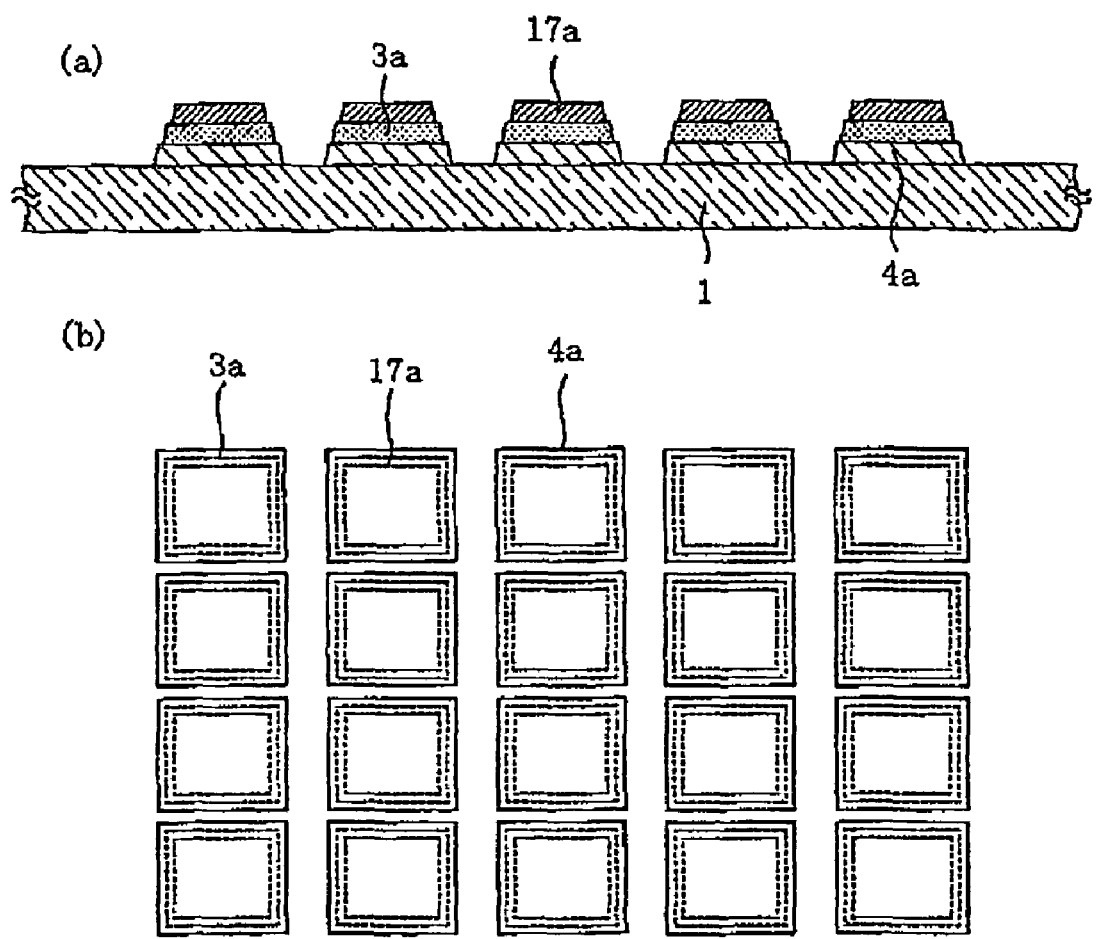
FIGS. 26(a) and 26(b) are sectional and plan views each showing an exemplary arrangement of light emitting elements in an organic EL device according to the present invention.

FIGS. 26(a) and 26(b) are sectional and plan views each showing an arrangement of light emitting elements in an organic EL device according to an embodiment of the present invention.

In each light emitting element, the transparent electrode pattern 4a is formed on the base assembly 1, and the light emitting material layer pattern 3a is formed on the transparent electrode pattern 4a so as to cover part of the transparent electrode pattern 4a. On the light emitting material layer pattern 3a, formed is the upper electrode pattern 17a so as to cover part of the top of the light emitting material layer pattern 3a. Such elements are arranged in the horizontal and vertical directions as shown in the figure. Here, such an example was shown in which the light emitting elements are arranged vertically in five columns and horizontally in four rows; however, the number of rows and columns can be selected freely.

Figure 27:
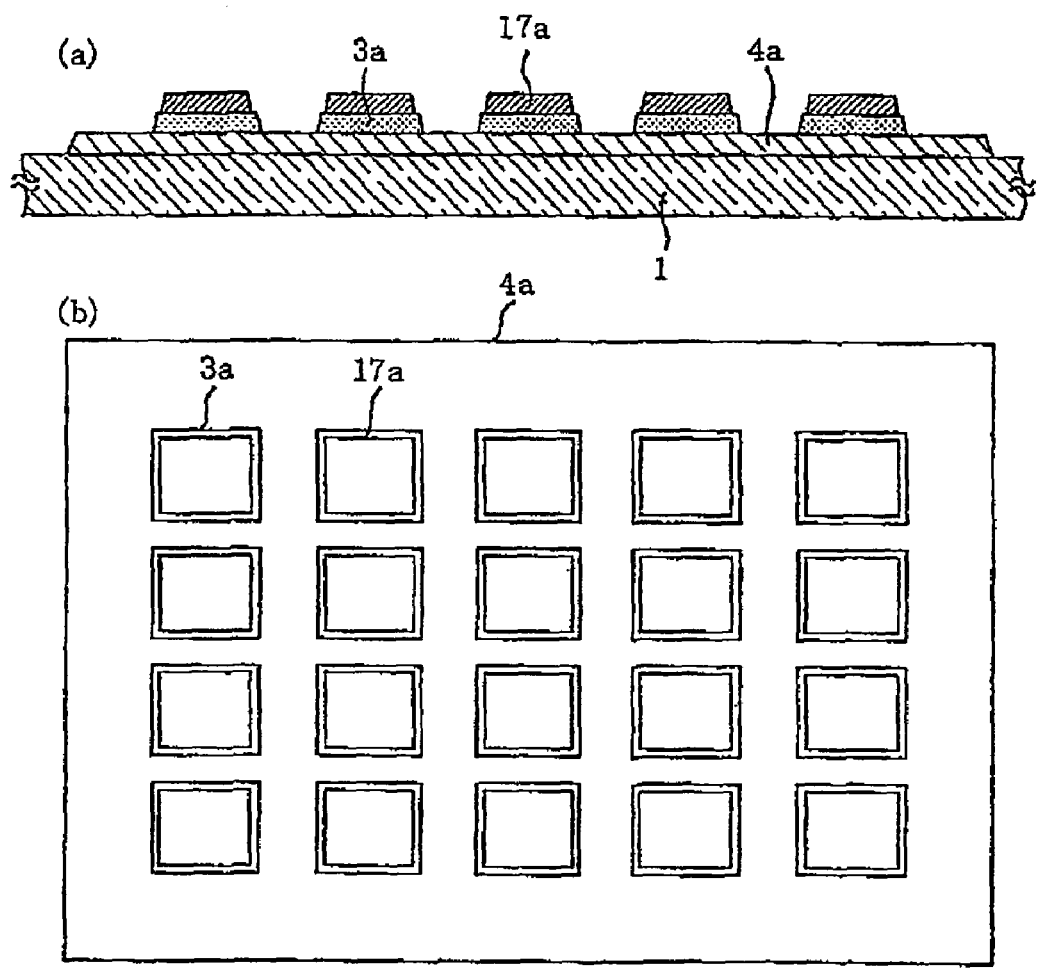
FIGS. 27(a) and 27(b) are sectional and plan views each showing another exemplary arrangement of light emitting elements in an organic EL device according to the present invention.

FIGS. 27(a) and 27(b) are sectional and plan views each showing an arrangement of light emitting elements in an organic EL device according to an embodiment of the present invention. The transparent electrode pattern 4a is formed on the base assembly 1, and on the transparent electrode pattern 4a, formed are a plurality of light emitting material layer patterns 3a in the vertical and horizontal directions. The upper electrode pattern 17a is formed on each light emitting material layer pattern 3a so as to cover part of the top of the light emitting material layer pattern 3a. Here, such an example was shown in which the light emitting elements are arranged vertically in five columns and horizontally in four rows; however, the number of rows and columns can be selected freely. Additionally, in the foregoing, the transparent electrode pattern 4a is common to all the light emitting elements, but not limited thereto, and may cover only a plurality of light emitting elements.

Figure 28:
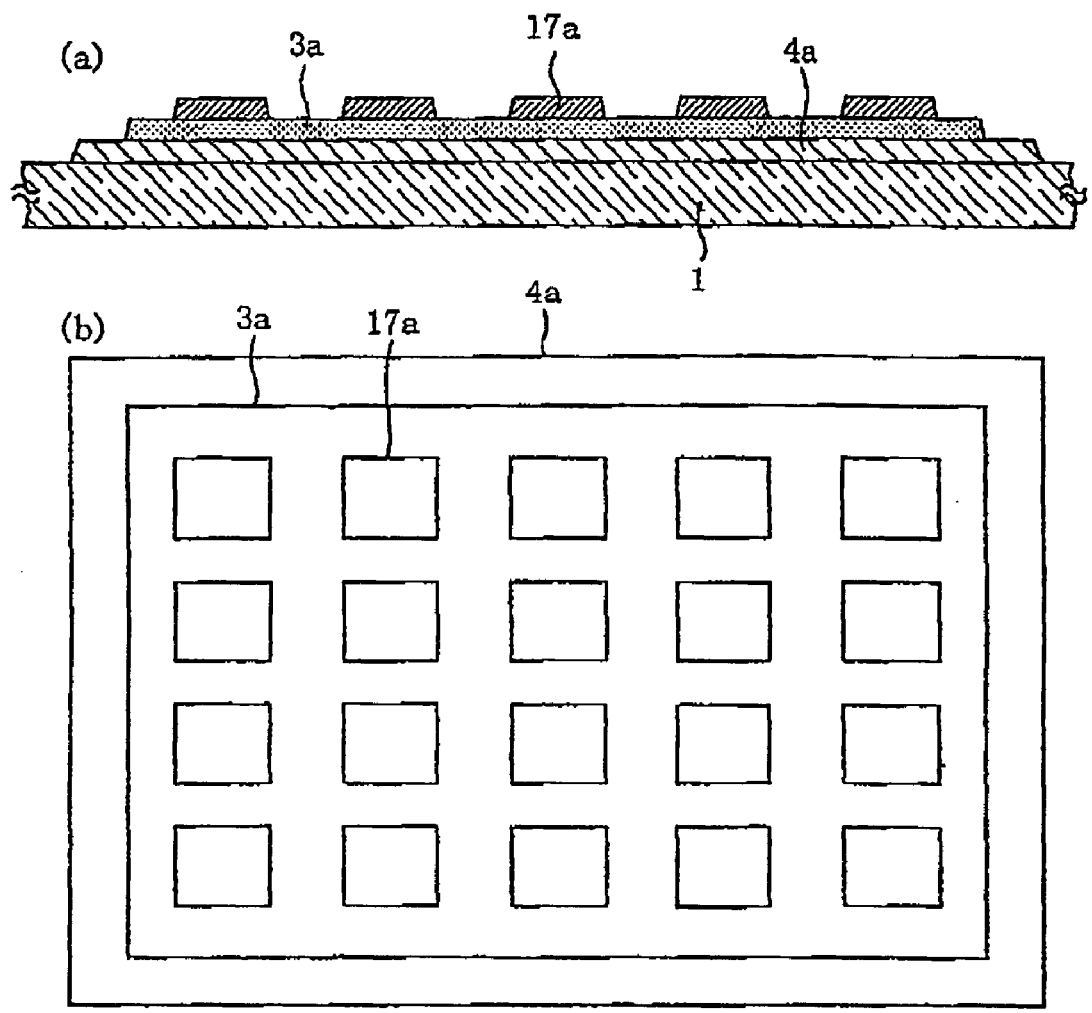
FIGS. 28(a) and 28(b) are sectional and plan views each showing still another exemplary arrangement of light emitting elements in an organic EL device according to the present invention.

FIGS. 28(a) and 28(b) are sectional and plan views each showing an arrangement of light emitting elements in an organic EL device according to an embodiment of the present invention. The transparent electrode pattern 4a is formed on the base assembly 1, and on the transparent electrode pattern 4a, formed is the light emitting material layer pattern 3a so as to cover most of the top of the transparent electrode pattern 4a. On the light emitting material layer pattern 3a, formed are a plurality of upper electrode patterns 17a in the horizontal and vertical directions. Here, such an example was shown in which the light emitting elements are arranged vertically in five columns and horizontally in four rows; however, the number of rows and columns can be selected freely. Additionally, in the foregoing, the transparent electrode pattern 4a and the light emitting material layer pattern 3a are common to all the light emitting elements, but not limited thereto, and may cover only a plurality of light emitting elements.

Figure 29:
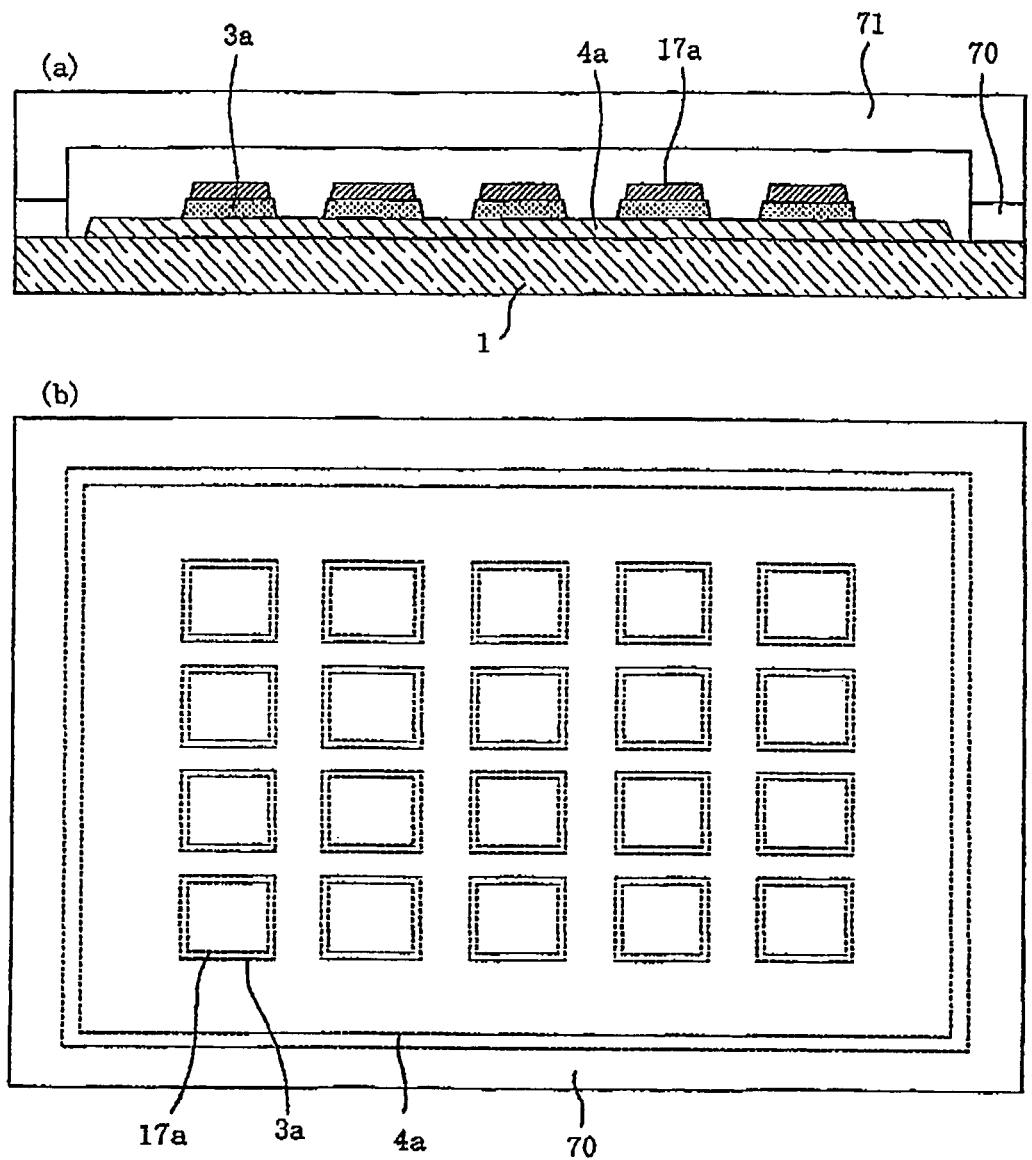
FIGS. 29(a) and 29(b) are sectional and plan views each showing still another exemplary arrangement of light emitting elements in an organic EL device according to the present invention.

FIGS. 29(a) and 29(b) are schematic sectional and plan views each showing the structure of a display device available as an organic EL device according to an embodiment of the present invention. The light emitting elements are often encapsulated in an inert gas for use, with the environment thereof being replaced and sealed by the inert gas. The structure shown in FIG. 29 provides an adhesive 70 around a set of a plurality of light emitting elements and a sealing member 71 thereon, thereby implementing the encapsulation of the light emitting elements. A sealing gas is filled in the encapsulated space.

Here, such a case was shown in which twenty light emitting elements are encapsulated in one sealing member 71; however, the number of light emitting elements to be encapsulated in one sealing member 71 can be selected as appropriate.

Figure 30:
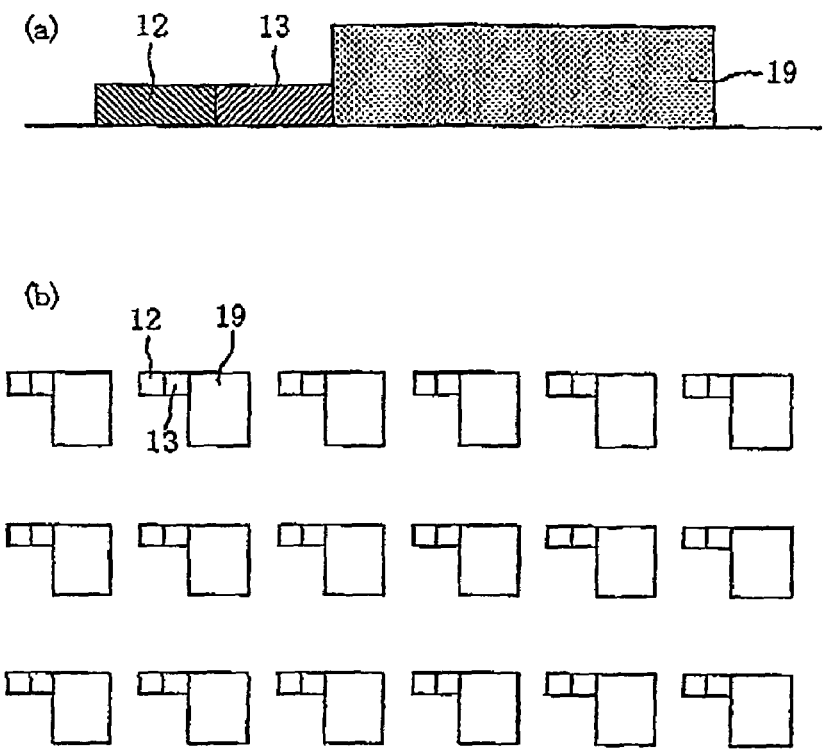
FIG. 30(a) is a schematic sectional view showing an exemplary structure of a light emitting element with a drive portion in an organic EL device according to the present invention, FIG. 30(b) being a plan view showing a plurality of light emitting elements each having the drive portion of the structure and disposed in the horizontal and vertical directions.

FIG. 30(a) is a schematic view showing the structure of a light emitting element with a drive portion in an organic EL device according to the present invention. In the light emitting element with a drive portion, the light emitting element 19 is connected to a current supply element 13, which is in turn connected to a switching element 12.

FIG. 30(b) is a plan view showing a plurality of light emitting elements each having the drive portion and arranged as described above, the light emitting elements being disposed in the horizontal and vertical directions. Here, such an example was shown in which the light emitting elements are arranged vertically in six columns and horizontally in three rows; however, the number of rows and columns can be selected arbitrarily.

Figure 31:
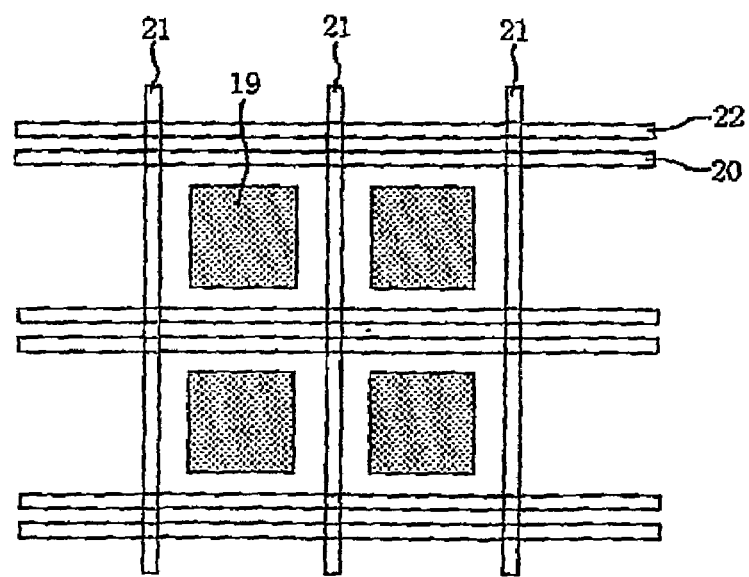
FIG. 31 is a plan view showing an exemplary relation between a light emitting element and wirings according to the present invention.
Figure 32:
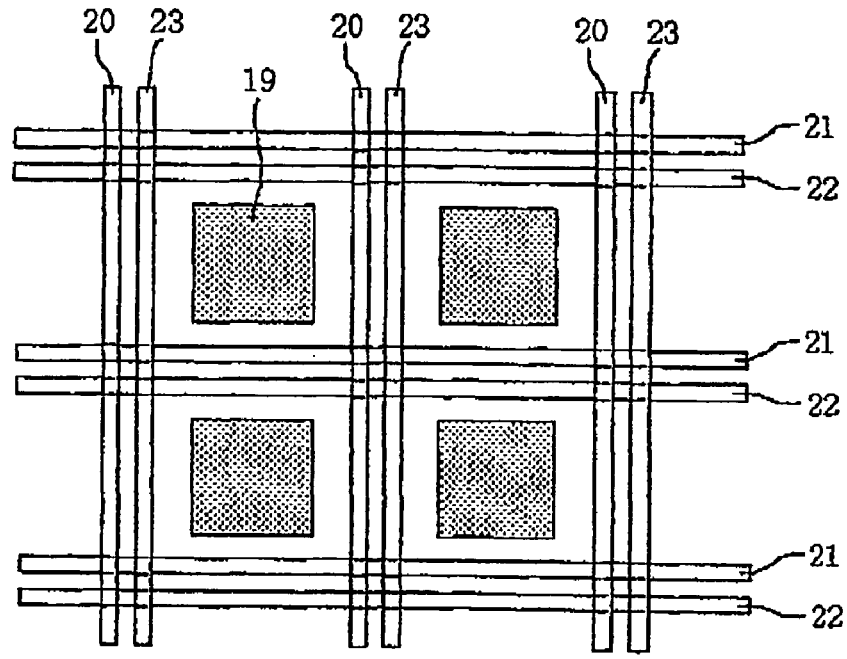
FIG. 32 is a plan view showing another exemplary relation between a light emitting element and wirings according to the present invention.
Figure 33:
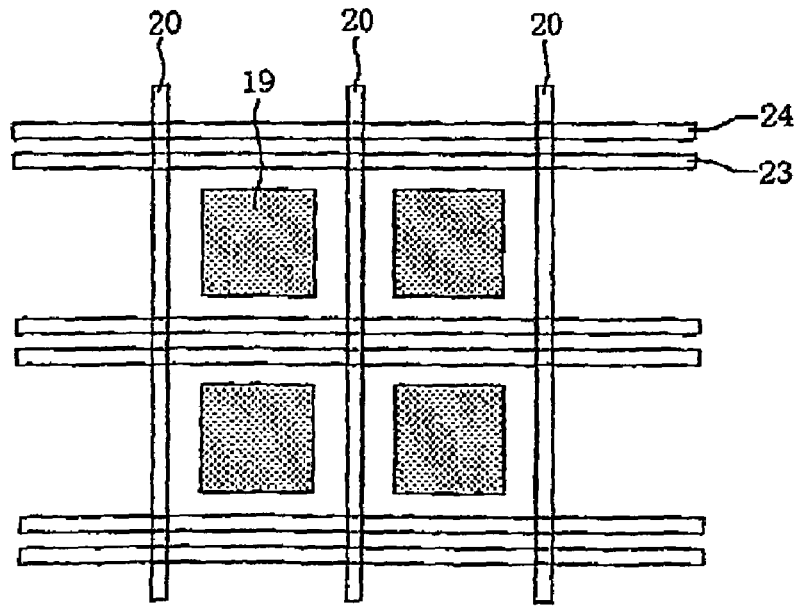
FIG. 33 is a plan view showing still another exemplary relation between a light emitting element and wirings according to the present invention.

Referring to FIGS. 31 to 33, explained below is the planar positional relationship between the wirings and the light emitting elements in an organic EL device according to the present invention.

In the example shown in FIG. 31, ground lines 22 and first switching wirings 20 are disposed horizontally (in the figure when viewed from its front), while second switching wirings 21 are disposed vertically. The light emitting element 19 is disposed in a space defined by the lattices made up of the vertical and horizontal wirings. The light emitting element 19 is connected to a current supply element (not shown), which is in turn connected to a switching element (not shown). On the other hand, the light emitting element or the current supply element (not shown) is connected to a current source (not shown). The ground lines 22 may also be arranged in the horizontal direction. Here, such an example was shown in which the light emitting elements 19 are arranged vertically in two columns and horizontally in two rows; however, the number of rows and columns can be selected as appropriate.

In the example shown in FIG. 32, the second switching wirings 21 and the ground lines 22 are disposed horizontally (in the figure when viewed from its front), while the first switching wirings 20 and current supply lines 23 are disposed vertically. The light emitting element 19 is disposed in a space defined by the lattices made up of the vertical and horizontal wirings. The light emitting element 19 is connect d to a current supply element (not shown), which is in turn connected to a switching element (not shown). The ground lines 22 may also be arranged in the vertical direction. The current supply line may also be arranged in the horizontal direction. Here, such an example was shown in which the light emitting elements 19 are arranged vertically in two columns and horizontally in two rows; however, the number of rows and columns can be selected as appropriate.

In the example shown in FIG. 33, second switching wirings 24, serving also as a ground line, and the current supply lines 23 are disposed horizontally (in the figure when viewed from its front), while the first switching wirings 20 are disposed vertically. The light emitting element 19 is disposed in a space defined by the lattices made up of the vertical and horizontal wirings. The light emitting element 19 is connected to a current supply element (not shown), which is in turn connected to a switching element (not shown). The current supply lines 23 can also be arranged in the vertical direction. Here, such an example has been shown in which the light emitting elements 19 are arranged vertically in two columns and horizontally in two rows; however, the number of rows and columns can be selected as appropriate. In this arrangement, the second switching wirings 24 serving also as a ground line are a wiring to which a ground potential and a switching potential are alternately applied in a time division manner.

The embodiment shown in FIG. 33 may also be modified as follows. That is, the ground line 22 is disposed in place of the second switching wiring 24, which also serves as a ground line. In this case, for example, a diode element such as MIM is employed as the switching element.

Referring to FIGS. 34 to 39, explained below is the connectional relationships between the light emitting element, the current supply element, the switching element, and the first and second switching wirings, the current supply line and the like in an organic EL device according to the present invention.

Figure 34:
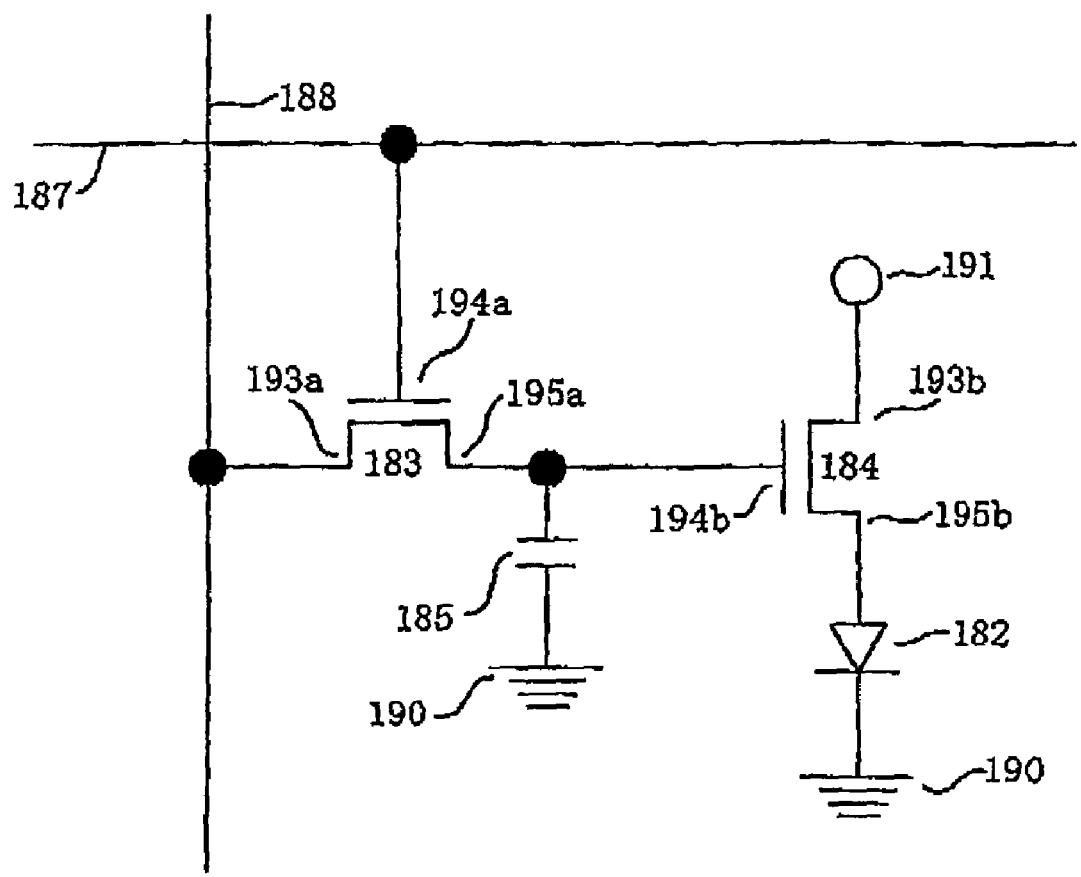
FIG. 34 is a circuit diagram showing an exemplary relation between a light emitting element and a drive circuit according to the present invention.

FIG. 34 is a circuit connection diagram of a light emitting element according to an embodiment of the present invention. In this circuit, such a case is shown in which a switching transistor is employed as the switching element and a current supply transistor is employed as the current supply element.

A first switching wiring 187 and a second switching wiring 188 are laid in the horizontal and vertical directions as shown. The gate portion 194a of a switching transistor 183 is connected to the first switching wiring 187, while the drain portion 193a is connected to the second switching wiring 188. The source portion 195a is connected to the gate portion 194b of a current supply transistor 184 and one terminal of a voltage sustain capacitor 185. The other terminal of the voltage sustain capacitor 185 is connected to a ground 190. The drain portion 193b of the current supply transistor 184 is connected to a current source 191, while the source portion 195b is connected to the anode of a light emitting element 182. The cathode of the light emitting element 182 is connected to the ground 190. In this arrangement, it is assumed that the current supply source and the ground potential are supplied to each element through conductive layers formed entirely on the substrate or the elements or through individual wirings.

Applying a voltage to the first switching wiring 187 causes a voltage to be applied to the gate portion 194a of the switching transistor 183, thereby allowing the drain portion 193a and the source portion 195a to conduct therebetween. Applying a voltage to the second switching wiring 188 under this condition causes a voltage to be applied to the source portion 195a and electric charge to be accumulated in the voltage sustain capacitor 185. Even when the voltage applied to the first switching wiring 187 or the second switching wiring 188 is turned off, this allows a voltage to continue being applied to the gate portion 194b of the current supply transistor 184 until the electric charge accumulated in the voltage sustain capacitor 185 disappears. A voltage applied to the gate portion 194b of the current supply transistor 184 causes the drain portion 193b and the source portion 195b to conduct therebetween, and a current to flow from the current source 191 through the light emitting element 182 to the ground, thereby allowing the light emitting element 182 to emit light.

On the other hand, suppose that a drive voltage is not applied to at least either the first switching wiring 187 or the second switching wiring 188. In this case, no voltage is applied to the gate portion of the current supply transistor 184 and thus no current flows through the light emitting element 182, thereby causing no light emission.

Figure 35:
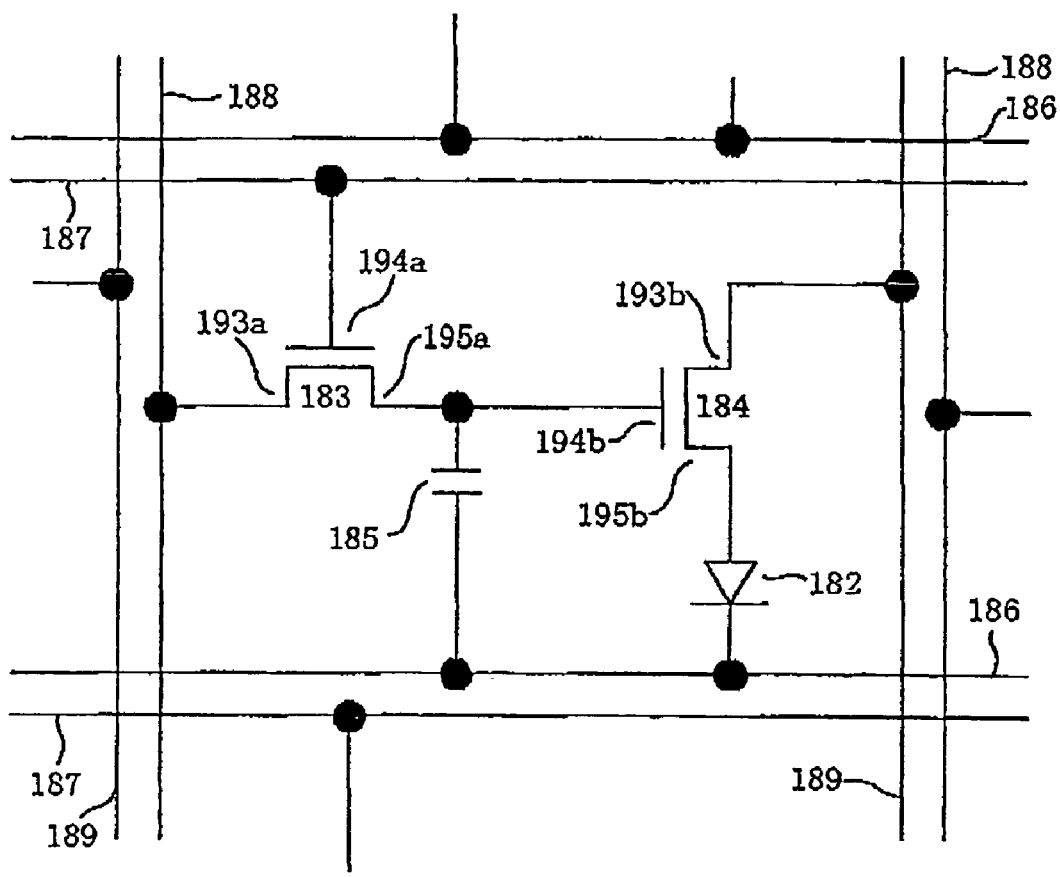
FIG. 35 is a schematic plan view showing an exemplary wiring circuit diagram and an electrical connection representative of a relation between a light emitting element and a drive circuit according to the present invention.

In the embodiment shown in FIG. 35, a ground wiring 186 and a current supply wiring 189 are added to the arrangement shown in FIG. 34.

Figure 36:
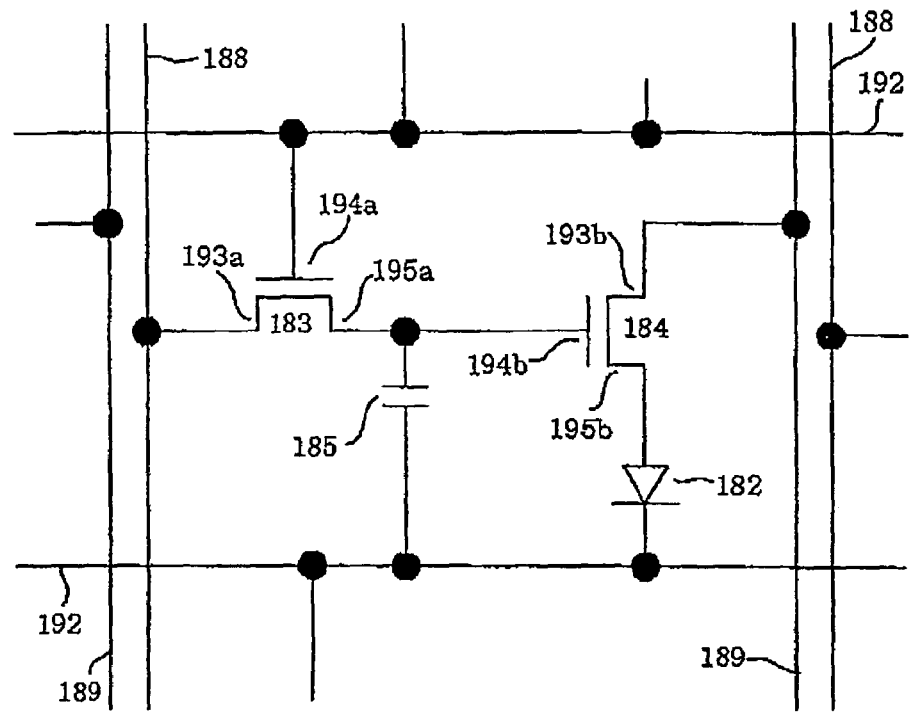
FIG. 36 is a circuit diagram showing another exemplary relation between a light emitting element and a drive circuit according to the present invention.

The embodiment shown in FIG. 36 is different from the arrangement shown in FIG. 35 in that the first switching wiring and the ground wiring are shared as a common wiring 192. In this arrangement, a ground potential and a switching potential are alternately applied to the common wiring 192 in a time division manner such that different potentials are applied to adjacent common wirings.

Figure 37:
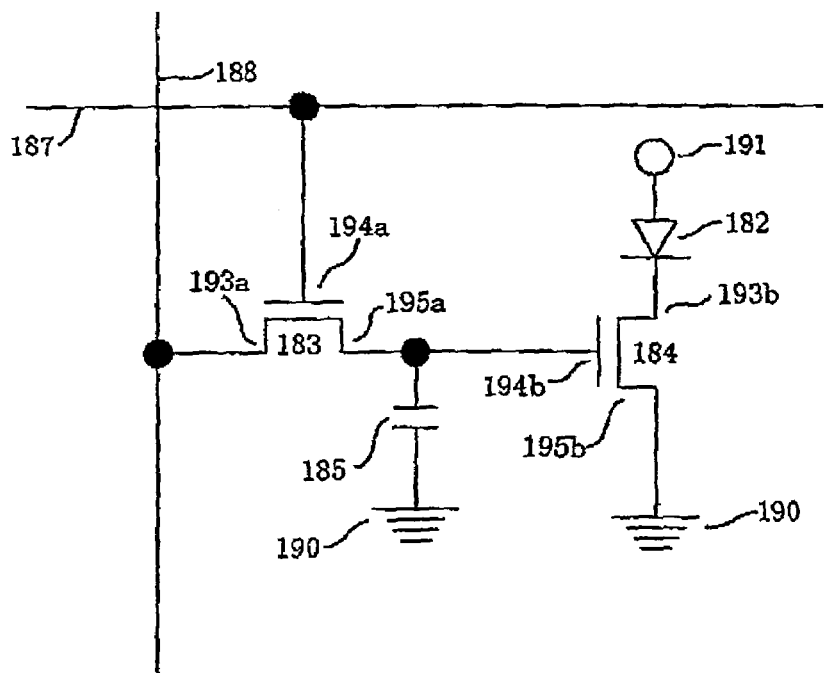
FIG. 37 is a circuit diagram showing still another exemplary relation between a light emitting element and a drive circuit according to the present invention.

FIG. 37 is a circuit connection diagram of a light emitting element according to an embodiment of the present invention. In this embodiment, a switching transistor is also employed as the switching element and a current supply transistor is also employed as the current supply element, respectively.

The switching wirings are made up of the first switching wiring 187 and the second switching wiring. 188. The drain portion 193a of the switching transistor 183 is connected to the second switching wiring 188, while the gate portion 194a is connected to the first switching wiring 187, respectively. The source portion 195a is connected to the gate portion 194b of the current supply transistor 184 and one terminal of the voltage sustain capacitor 185. The other terminal of the voltage sustain capacitor 185 is connected to the ground 190. The drain portion 193b of the current supply transistor 184 is connected to the cathode side of the light emitting element 182, while the source portion 195b is connected to the ground 190. The anode portion of the light emitting element 182 is connected to the current supply source 191.

In this arrangement, when a drive voltage is simultaneously applied to the first switching wiring 187 and the second switching wiring 188, a voltage is provided to the source portion 195a of the switching transistor 183 so as to cause electric charge to be accumulated in the voltage sustain capacitor 185. This allows a stable potential to be applied to the gate portion 194b of the current supply transistor 184. This allows a current to flow from the current source 191 through the light emitting element 182, and then from the drain portion 193b of the current supply transistor 184 through the source portion 195b to the ground 190. This allows the light emitting element 182 to emit light.

On the other hand, when a drive voltage is not applied to at least any one of the first switching wiring 187 and the second switching wiring 188, no voltage is applied to the gate portion of the current supply transistor 184 and no current flows through the light emitting element 182, thereby causing no light emission.

Figure 38:
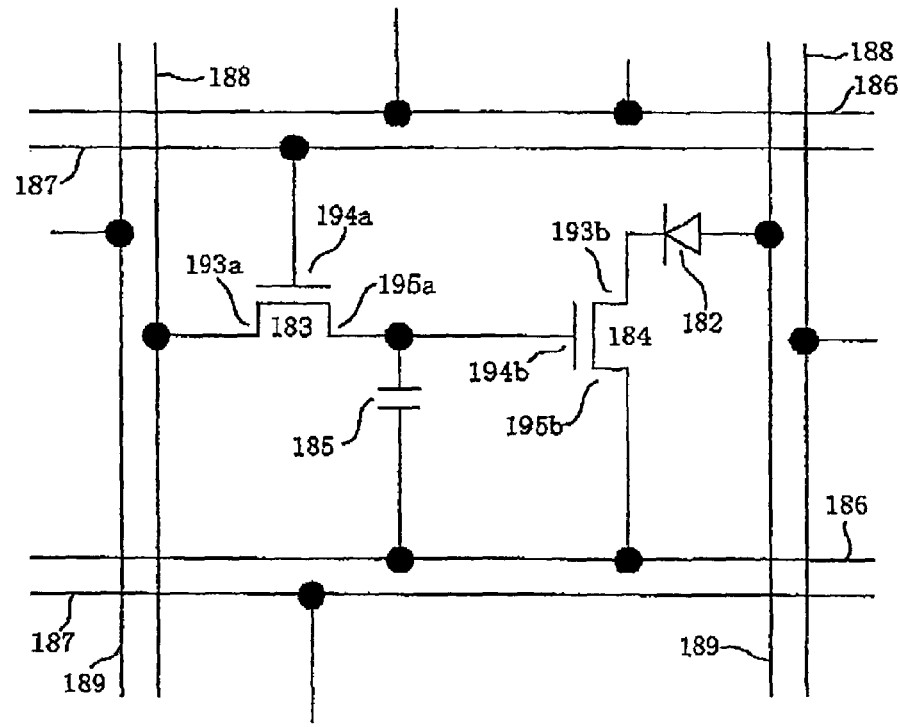
FIG. 38 is a circuit diagram showing still another exemplary relation between a light emitting element and a drive circuit according to the present invention.

In the embodiment shown in FIG. 38, the ground wiring 186 and the current supply wiring 189 are added to the arrangement shown in FIG. 37.

Figure 39:
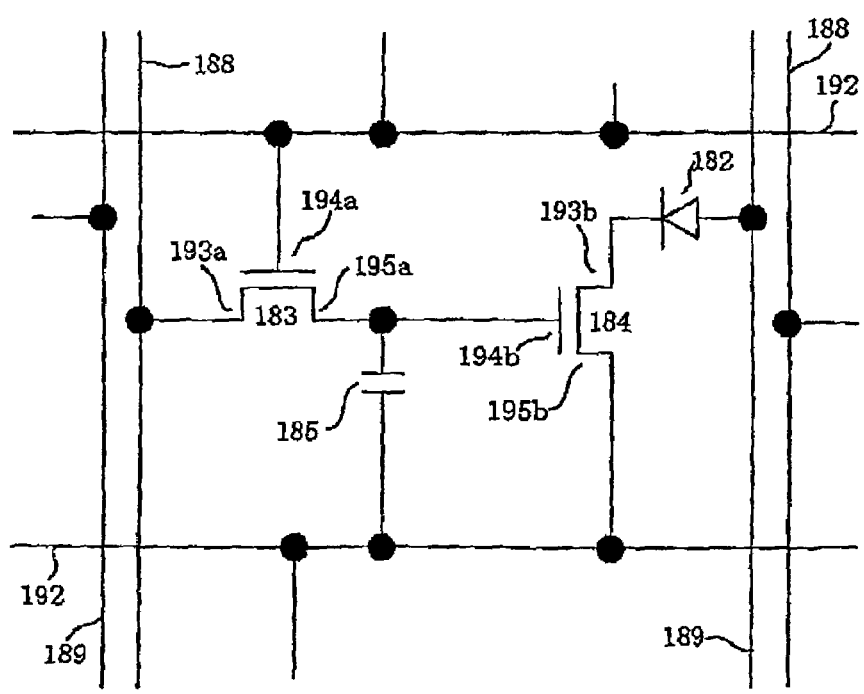
FIG. 39 is a circuit diagram showing still another exemplary relation between a light emitting element and a drive circuit according to the present invention.

The embodiment shown in FIG. 39 is different from the arrangement shown in FIG. 38 in that the first switching wiring and the ground wiring are shared as the common wiring 192. In this arrangement, a ground potential and a switching potential are alternately applied to the common wiring 192 in a time division manner.

Now, explained below are design variations of how to arrange light emitting elements, how to relate them to a substrate surface, how to construct their multilayer structure and the like, which are applicable to the present invention.

Figure 40:
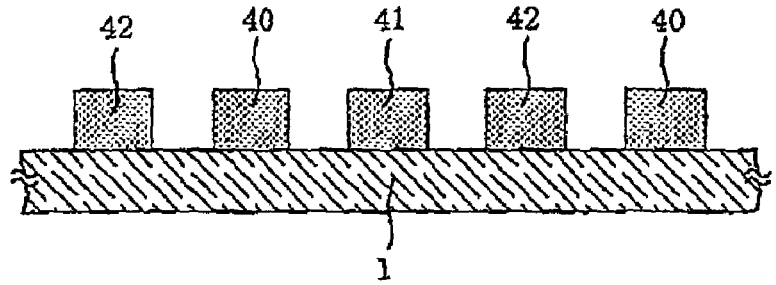
FIG. 40 is a sectional view showing an exemplary arrangement of light emitting elements according to the present invention.

FIG. 40 is a schematic sectional view showing an exemplary arrangement of light emitting elements of a plurality of colors. In this structure, a first color light emitting element 40, a second color light emitting element 41, and a third color light emitting element 42 are arranged on the base assembly 1 alternately in that order. The first color light emitting element 40, the second color light emitting element 41, and the third color light emitting element 42 are typically selected from light emitting elements which emit mainly blue light, green light, and red light, respectively.

Figure 41:
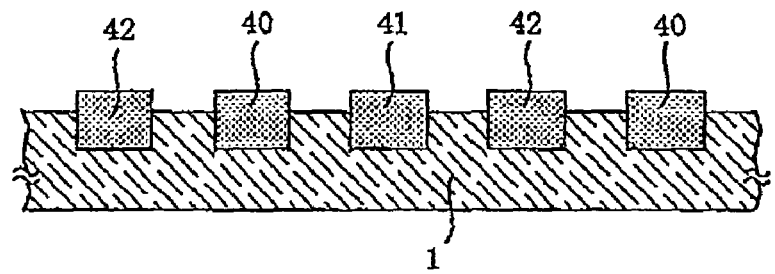
FIG. 41 is a sectional view showing another exemplary arrangement of light emitting elements according to the present invention.

FIG. 41 is a schematic sectional view showing another exemplary arrangement of light emitting elements. In this structure, at least part of a first color light emitting element 40, a second color light emitting element 41, and a third color light emitting element 42 is embedded in the base assembly 1 and arranged in sequence. The first color light emitting element 40, the second color light emitting element 41, and the third color light emitting element 42 are typically selected from light emitting elements which emit mainly blue light, green light, and red light, respectively.

Figure 42:
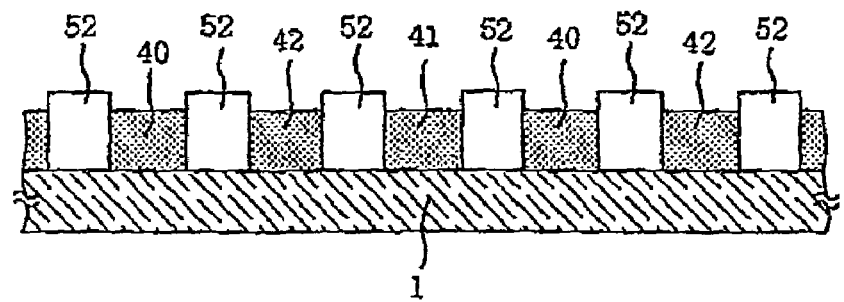
FIG. 42 is a sectional view showing still another exemplary arrangement of light emitting elements according to the present invention.

FIG. 42 is a schematic sectional view showing another exemplary arrangement of light emitting elements. In this structure, the first color light emitting element 40, the second color light emitting element 41, and the third color light emitting element are arranged on the base assembly 1 alternately in that order, with a bank 52 being formed between the individual elements. The first color light emitting element 40, the second color light emitting element 41, and the third color light emitting element are typically selected from light emitting elements which emit mainly blue light, green light, and red light, respectively.

Figure 43:
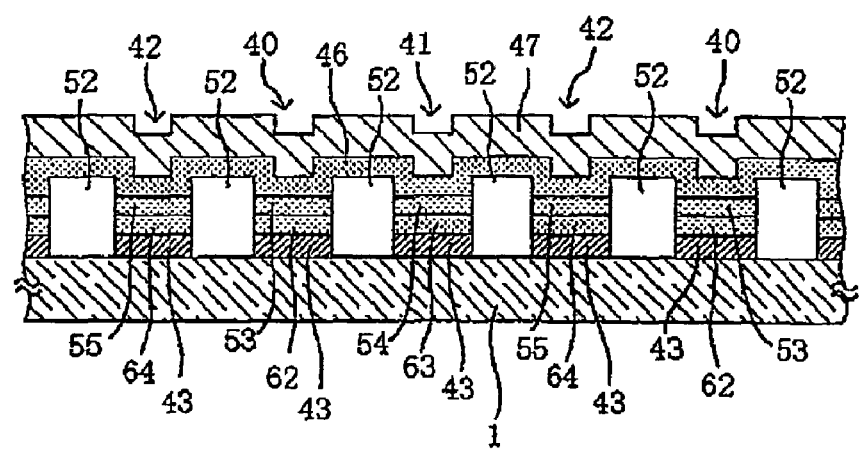
FIG. 43 is a sectional view showing still another exemplary arrangement of light emitting elements according to the present invention.

FIG. 43 is a schematic sectional view showing an exemplary structure and arrangement of light emitting elements. In this structure, the multilayer structure of a lower electrode 43/a first color electron transport layer 62/a first color light emitting layer 53, the multilayer structure of the lower electrode 43/a second color electron transport layer 63/a second color light emitting layer 54, and the multilayer structure of the lower electrode 43/a third color electron transport layer 64/a third color light emitting layer 55 are arranged on the base assembly 1 alternately in that order, with the bank 52 being formed between the individual elements. Upon them, a hole injection layer 46 and a transparent electrode layer 47 are formed across a plurality of light emitting elements. The first, second, and third colors are typically selected from light beams which are predominantly composed of blue color, green color, and red color, respectively.

Figure 44:
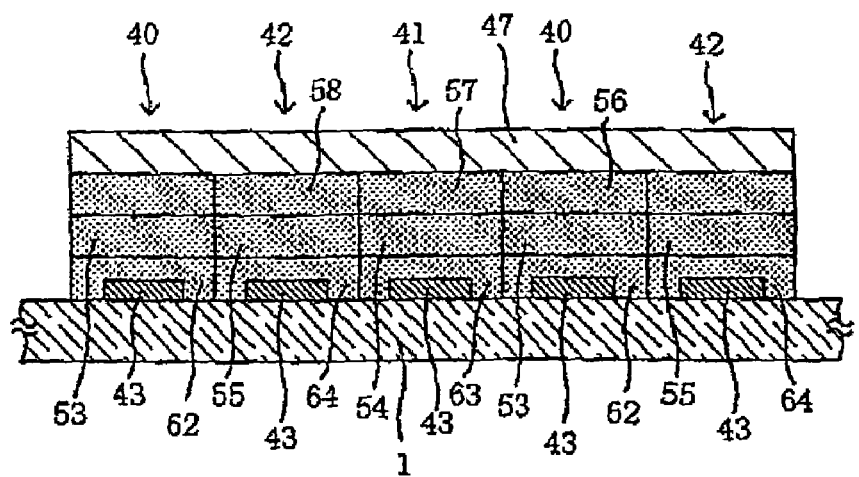
FIG. 44 is a sectional view showing still another exemplary arrangement of light emitting elements according to the present invention.

FIG. 44 is a schematic sectional view showing an exemplary structure and arrangement of light emitting elements. In this structure, the multilayer structure of the lower electrode 43/the first color electron transport layer 62/the first color light emitting layer 53/a first color hole injection layer 56, the multilayer structure of the lower electrode 43/the second color electron transport layer 63/the second color light emitting layer 54/a second color hole injection layer 57, and the multilayer structure of the lower electrode 43/the third color electron transport layer 64/the third color light emitting layer 55/a third color hole injection layer 58 are arranged on the base assembly 1 alternately in that order. Upon them, the transparent electrode layer 47 is formed across a plurality of light emitting elements. The first, second, and third colors are typically selected from light beams which are predominantly composed of blue color, green color, and red color, respectively.

Figure 45:
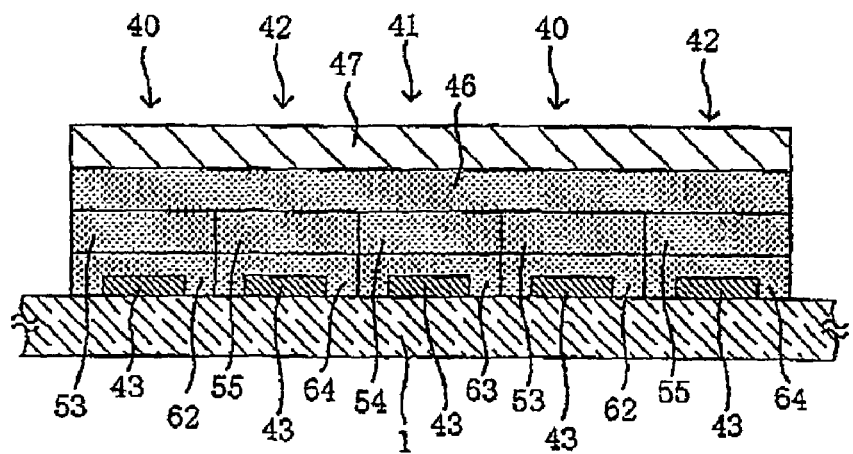
FIG. 45 is a sectional view showing still another exemplary arrangement of light emitting elements according to the present invention.

FIG. 45 is a schematic sectional view showing an exemplary structure and arrangement of light emitting elements. In this structure, the multilayer structure of the lower electrode 43/the first color electron transport layer 62/the first color light emitting layer 53, the multilayer structure of the lower electrode 43/the second color electron transport layer 63/the second color light emitting layer 54, and the multilayer structure of the lower electrode 43/the third color electron transport layer 64/the third color light emitting layer 55 are arranged on the base assembly 1 alternately in that order. Upon them, the hole injection layer 46 and the transparent electrode layer 47 are formed across a plurality of elements. The first, second, and third colors are typically selected from light beams which are predominantly composed of blue color, green color, and red color, respectively.

Figure 46:
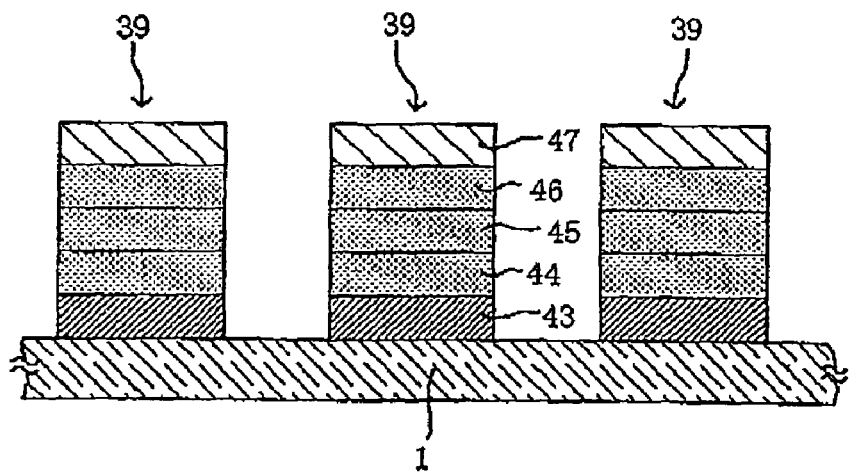
FIG. 46 is a sectional view showing still another exemplary arrangement of light emitting elements according to the present invention.

FIG. 46 is a schematic sectional view showing an exemplary structure and arrangement of light emitting elements. In this structure, the multilayer structures of the lower electrode 43/an electron transport layer 44/a light emitting layer 45/the hole injection layer 46/the transparent electrode layer 47 are spaced apart from one another on the base assembly 1.

Figure 47:
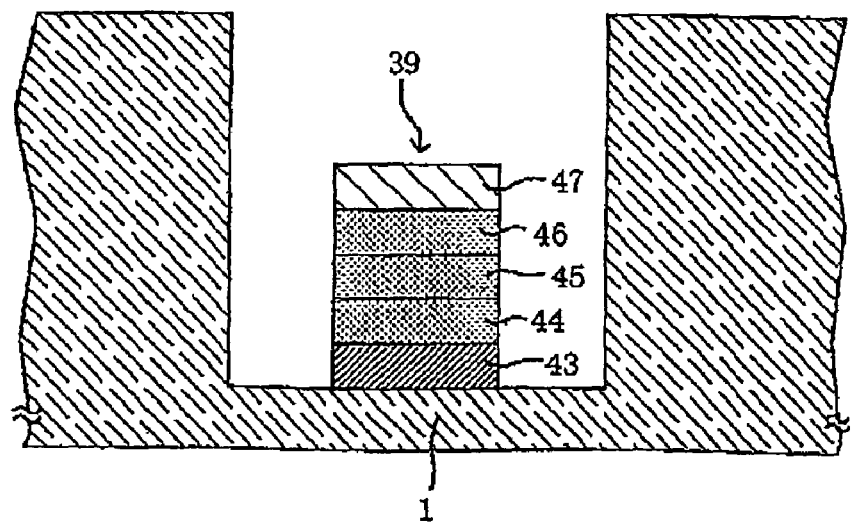
FIG. 47 is a sectional view showing an exemplary structure and arrangement of a light emitting element according to the present invention.

FIG. 47 is a schematic sectional view showing an exemplary structure and arrangement of light emitting elements. In this structure, the multilayer structure of the lower electrode 43/the electron transport layer 44/the light emitting layer 45/the hole injection layer 46/the transparent electrode layer 47 is formed in a recessed portion formed in the base assembly 1.

Now, the structure of a light emitting element with a drive portion to which the present invention is applied will be described more specifically below.

Figure 48:
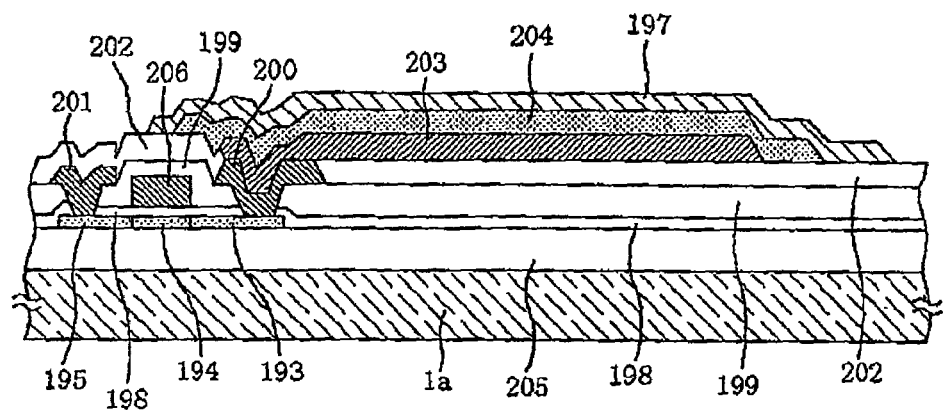
FIG. 48 is a sectional view showing an exemplary structure of a light emitting element according to the present invention.

FIG. 48 shows a light emitting element portion and a current supply element portion for the light emitting element. In this structure, a barrier layer 205 is formed on a substrate 1a, on top of which a drain region 193, a channel region 194, and a source region 195 of a thin film transistor (TFT) are formed as shown in the figure. On top of them, formed is a gate insulating film 198. On the gate insulating film and above the channel region 194 of the TFT, formed is a gate electrode 206, on top of which formed is a first interlayer insulating film 199.

In the gate insulating film 198 and the first interlayer insulating film 199, provided are openings for exposing part of the surfaces of the drain region 193 and the source region 195 of the TFT. In these openings, there are formed a drain electrode 200 and a source electrode 201, which are in contact with the drain region 193 and the source region 195, respectively. As shown, on top of them, a second interlayer insulating film 202 is formed excluding on the region where the drain electrode 200 is formed. Although not shown here, the source electrode 201 is connected to a ground wiring, while the gate electrode 206 is connected to the source electrode of a switching transistor. On the second interlayer insulating film 202, there is formed a lower electrode 203 such that its one end is in contact with the drain electrode 200. On the top thereof, a light emitting material layer 204 and a transparent electrode 197 are sequentially formed. Employed as the light emitting material layer 204 are a three-layer film made up of an electron transport layer/a light emitting layer/a hole injection layer, a two-layer film made up of a light emitting layer serving also as an electron transport layer/a hole injection layer, or a single-layer film made up of a light emitting layer serving also as an electron transport layer and a hole injection layer. Here, such a case was shown in which the light emitting material layer 204 and the transparent electrode 197 are patterned in single light emitting elements; however, they may also be a large pattern that covers a plurality of elements.

Figure 49:
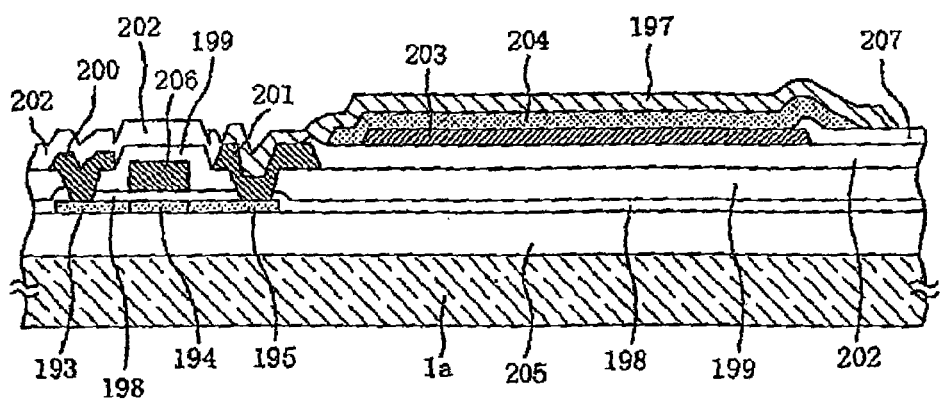
FIG. 49 is a sectional view showing another exemplary structure of a light emitting element according to the present invention.

FIG. 49 is a sectional view showing another exemplary light emitting element with a drive portion to which the present invention is applied. In this example, the lower electrode 203 is connected to a ground wiring located outside the figure, with the transparent electrode 197 being in contact with the source electrode 201. In addition, although not shown, the drain electrode 200 is connected to a current supply wiring, while the gate electrode 206 is connected to a source electrode of a switching transistor.

Figure 50:
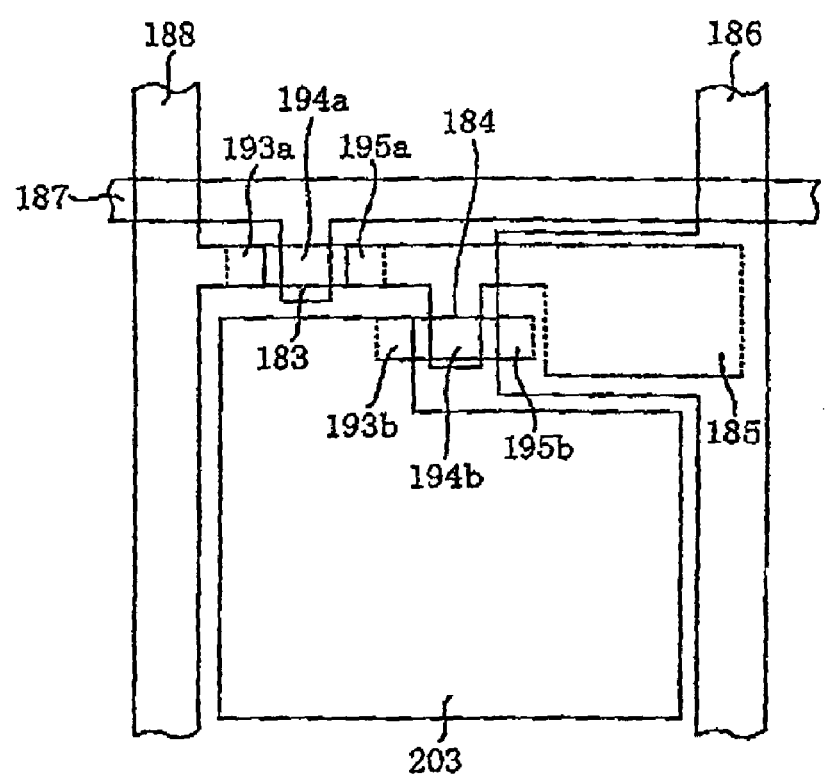
FIG. 50 is a plan view showing still another exemplary structure of a light emitting element according to the present invention.

FIG. 50 is a plan view showing the element having the sectional structure shown in FIG. 48, showing the peripheral region including its wiring portion. The first switching wiring (gate line) 187 is connected to the gate portion 194a of the switching transistor 183. The second switching wiring (data line) 188 is connected to the drain portion 193a of the switching transistor 183.

The source portion 195a of the switching transistor 183 is connected to the gate portion 194b of the current supply transistor 184 as well as to one terminal of the voltage sustain capacitor 185 (or to the lower side of 185 in the figure) that is formed between it and the ground wiring 186. The other terminal of the voltage sustain capacitor 185 (or the upper side of 185 in the figure) is connected to the ground wiring 186.

The drain portion 193b of the current supply transistor is connected to the lower electrode 203. The source portion 195b of the current supply transistor 184 is connected to the ground wiring 186.

A light emitting material layer and a transparent electrode (both not shown) are formed on the lower electrode 203, with the transparent electrode being connected to a current supply source (not shown). The light emitting layer and the transparent electrode formed thereon may also be formed on the entire surface to be shared by a plurality of light emitting elements.

Typically, each member constituting the light emitting element and its drive portion may employ those shown in Table 1.

TABLE 1

| | |
|---|---|
| Substrate | Glass, Resin, Quartz, Ceramics, Metal |
| Transparent electrode layer | ITO (Indium Tin Oxide), Mixture of In Oxide and Zn Oxide |
| Metal electrode layer | MgAg, Al, LiAl |
| Electron transport layer | Quinolinol Aluminum complex (Alq$_3$), PBD, TAZ, END, Oxazole derivative (OXD), OXD-7, Polyphenylene vinylene (PPV) |
| Light emitting layer, Light emitting layer serving also as a hole injection layer and/or an electron transport layer | Material of quinolinol aluminum complex doped with red fluorescent pigment, quinolinol aluminum complex, beryllium benzoquinolinol complex, zinc oxazole complex, or a material containing a conjugate polymeric organic compound precursor and at least one type of fluorescent substance. For example, the precursor may be polyphenylene vinylene or its derivative; the fluorescent pigment may be rhodamine B, distilbiphenyl, coumarin, tetraphenylbutadiene quinacridon, and their derivatives |
| Hole injection layer | Triphenyl diamine derivative (TPD), porphin compound such as copper phthalocyanine, α-NPD |
| Anode buffer layer | CuPc, polyaniline, polythiophene |
| Protective layer | Film of Al oxide, Al nitride, Si oxide, or Si nitride, or film of their mixture, or their compound film |
| Enhanced hygroscopic layer | Ba oxide, Ca oxide |
| Switching element | Transistor, diode, MM |
| Current supply element | Transistor |
| Wiring such as switching wiring | Silicide or polycide of high melting-point metal such as Al, Cu, Ta, Ru, and WSi |

On the other hand, each element that constitutes the switching transistor or the current supply transistor can employ those listed in Table 2.

TABLE 2

| | |
|---|---|
| Source-drain electrode, gate electrode | Silicide or polycide of high melting-point metal such as Al, Cu, Ta, Ru, and WSi |
| Gate insulating film, first interlayer insulating film, second interlayer insulating film, barrier layer | Film of Al oxide, Al nitride, Si oxide, or Si nitride, or film of their mixture, or their compound film |

On the other hand, an element used for sealing a light emitting element can employ those listed in Table 3.

TABLE 3

| | |
|---|---|
| Adhesive | UV-curable resin, thermosetting resin |
| Sealing number | Metal, glass, resin |
| Sealing glass | Inert gas such as N$_2$, H$_2$, and Ar |

Now, referring to FIGS. 51(*a*) to 53(*l*), described below is a method for manufacturing an organic EL device according to the present invention that was described with reference to FIG. 48 and FIG. 50.

Figure 51:
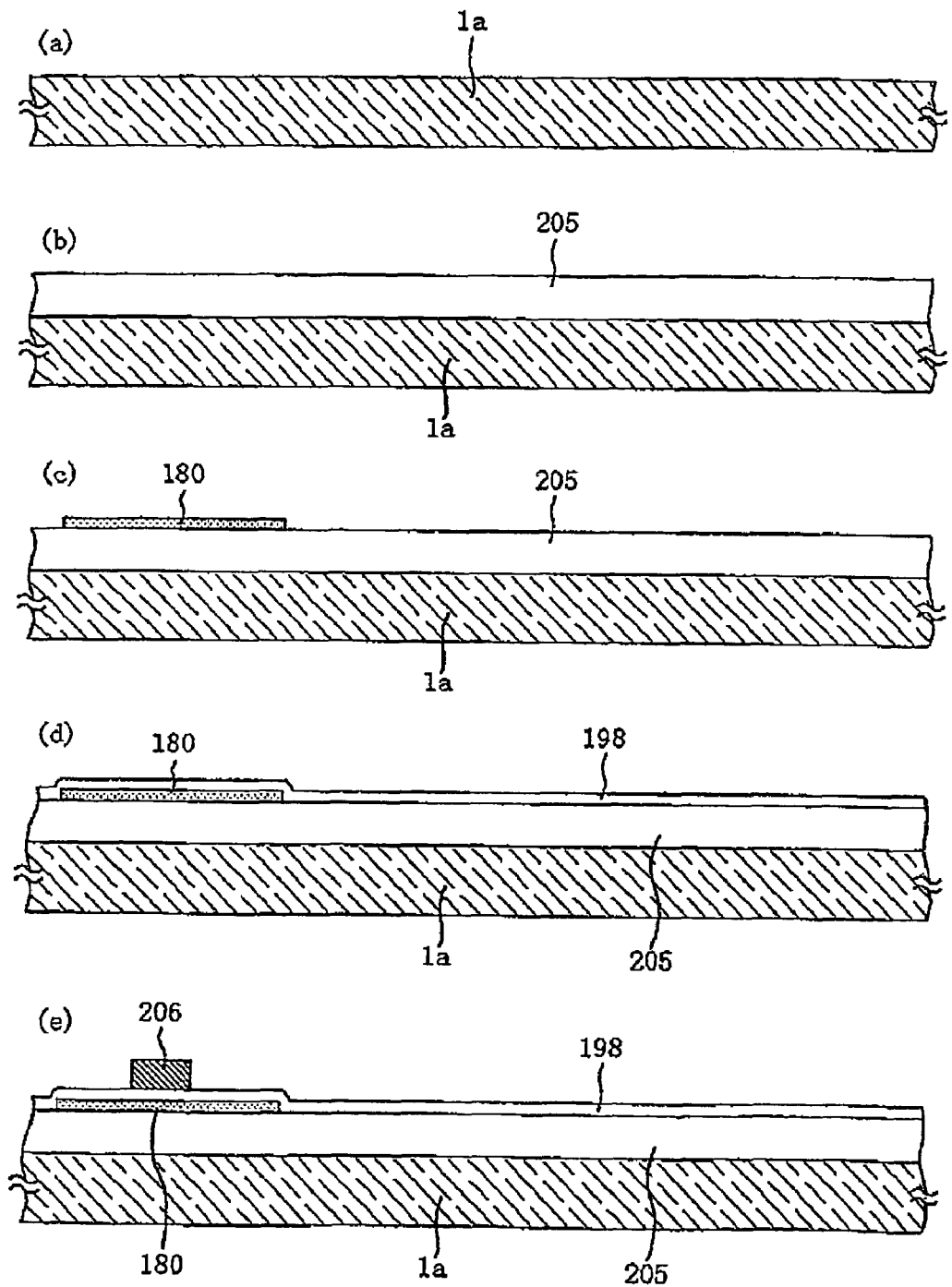
FIG. 51 is a sectional view showing an exemplary first step of a series of fabrication procedures for a light emitting element according to a first embodiment of the present invention.

First, as shown in FIG. 51(*a*), the substrate 1*a* is prepared. The substrate 1*a* is typically made of non-alkali glass. As shown in FIG. 51(*b*), on this substrate, the barrier layer 205 made of SiO$_2$ or the like is formed by sputtering or by CVD (Chemical Vapor Deposition). As shown in FIG. 51(*c*), silicon is deposited thereon by LP (Low pressure) CVD at about a growth temperature of 500° C. and irradiated with a laser beam to form polycrystalline silicon, which is then patterned by photolithography and by dry etching to form a polycrystalline silicon film 180. Then, as shown in FIG. 51(*d*), SiO$_2$ or the like is deposited by sputtering or by CVD to form the gate insulating film 198. Typically, the SiO$_2$ is deposited by remote plasma CVD. A conductive film, typically WSi, is deposited thereon by sputtering or by vapor deposition, and then patterned by photolithography and by ion milling to form the gate electrode 206, as shown in FIG. 51(*e*).

Figure 52:
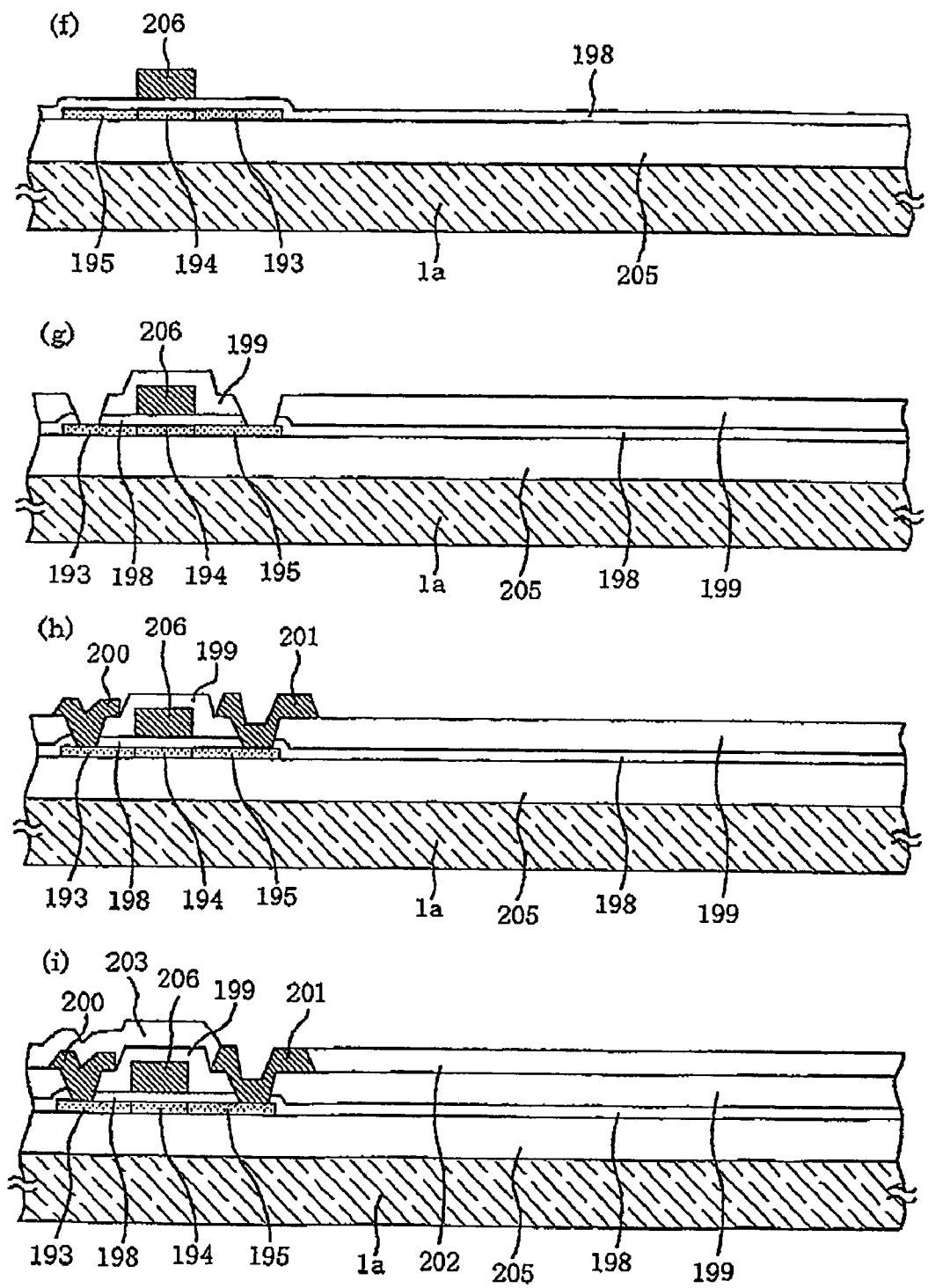
FIG. 52 is a sectional view showing a second step of the same fabrication procedures.

Then, as shown in FIG. 52(*f*), boron or phosphorus is ion doped using the gate electrode 206 as a mask to form the drain region 193 and the source region 195. The region under the gate electrode 206 which is not subjected to the ion doping is the channel region 194. Heat treatment is carried out typically at a temperature of about 550° C. in order to activate the drain and source regions. Then, as shown in FIG. 52(*g*), SiO$_2$ is typically deposited by sputtering or by CVD to form the first interlayer insulating film 199. Subsequently, the first interlayer insulating film 199 and the gate insulating film 198 are selectively removed by photolithography and by dry etching to open a contact hole on the source and drain regions. Then, as shown in FIG. 52(*h*), Al is typically deposited by sputtering to form the drain electrode 200 and the source electrode 201, which are in contact with the drain and source regions, by photolithography and by dry etching. Then, as shown in FIG. 52(*i*), on top thereof, SiO$_2$ is typically deposited by sputtering or by CVD to form the second interlayer insulating film 202, which is then selectively removed by photolithography and by dry etching to form an opening on the drain electrode 200.

Figure 53:
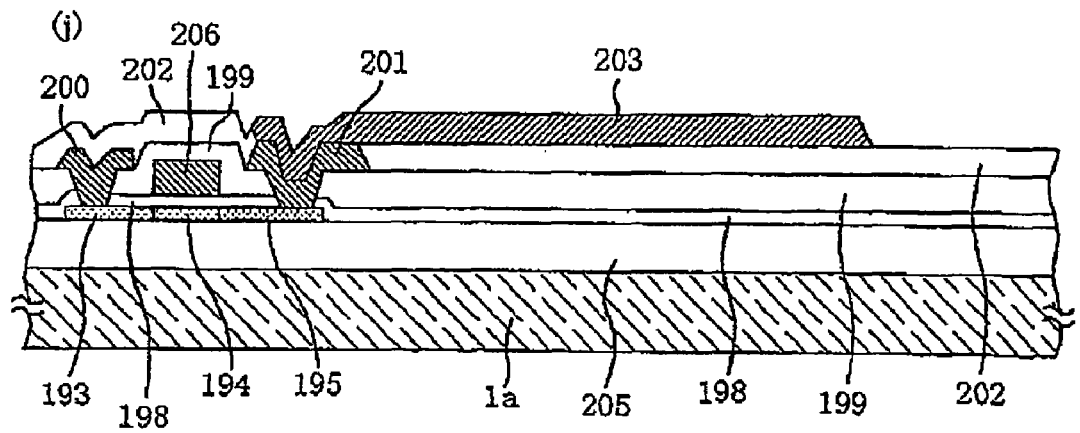
FIG. 53 is a sectional view showing a third step of the same fabrication procedures.
Figure 53:
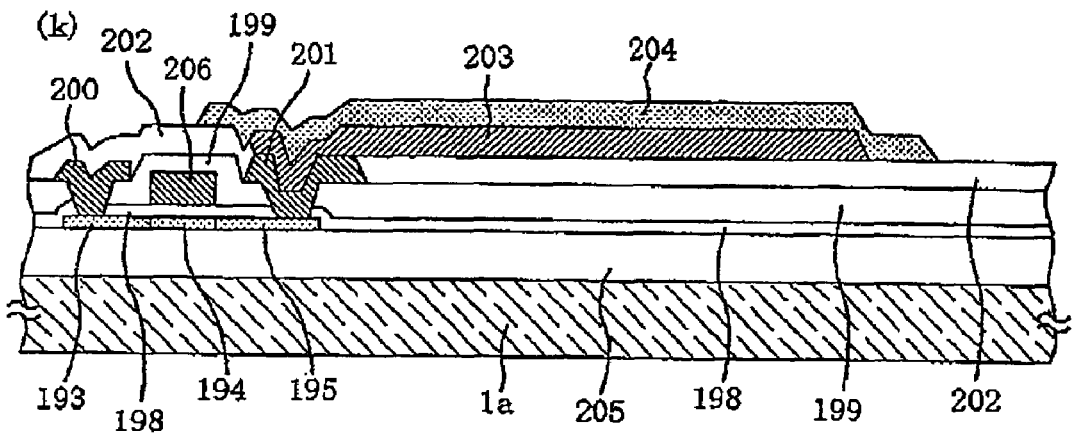
Figure 53:
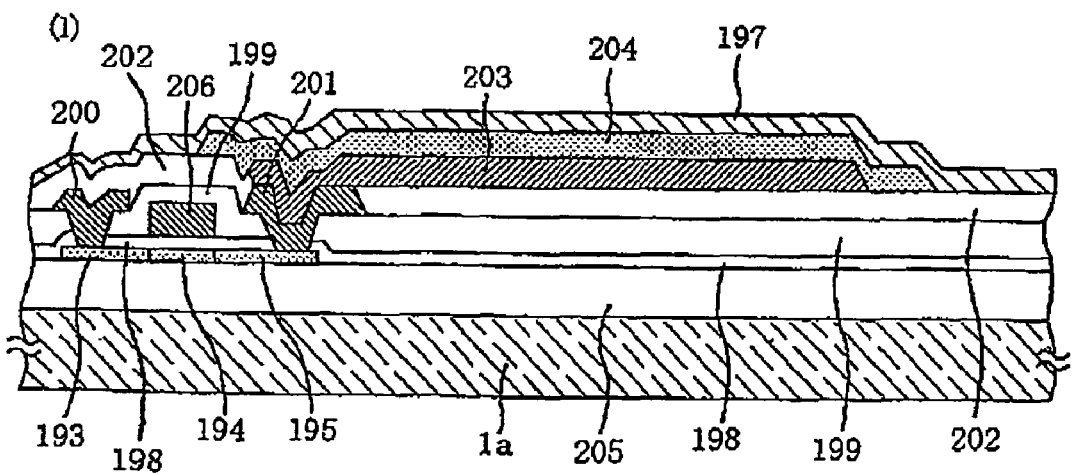

Then, as shown in FIG. 53(*j*), light metal or light metal alloy is deposited by sputtering and then patterned to form the lower electrode 203 that is in contact with the drain electrode 200. On top thereof, as shown in FIG. 53(*k*), the pattern of the light emitting material layer 204 is formed. At this time, used is a vapor deposition method employing a metal mask or a formation technique employing an inkjet head On top thereof, as shown in FIG. 53(*l*), transparent conductive film is deposited by sputtering, by CVD, or by spin-coating to form the transparent electrode 197. Thereafter, the transparent conductive film is patterned by photolithography.

Now, the embodiments of the present invention will be described in more detail. For the embodiments, light emitting display devices were prototyped using the light emitting elements having the structures or arrangements shown in FIG. 6(*d*), FIG. 18(*a*) or 18(*c*), FIG. 18(*b*), FIG. 27, FIG. 29, FIG. 30(*a*), FIG. 30(*b*), FIG. 35, FIG. 48, and FIG. 50. A single unit element has a size of 30 μm×100 μm, with a display portion having a size of 40 mm×40 mm.

To prototype these elements, a non-alkali glass substrate was employed as the base assembly, AlLi as the metal electrode layer, α-NPD as the hole injection layer, and Alq$_3$ as the light emitting layer serving also as an electron transport layer. Polyaniline was employed as the anode buffer layer. The transparent electrode layer employed a mixture of In oxide and Sn (In$_{2-x}$Sn$_x$O$_{3-y}$). The first switching wiring, the second switching wiring, and the ground line employed Al.

The indium tin oxide film was prepared using a $In_{2-x}Sn_x$ target by reactive sputtering in an environment of $Ar+O_2$. At this time, the ratio of $O_2$ to Ar was varied to change the value of y in the $In_{2-x}Sn_xO_{3-y}$. To determine the value of y, the $In_{2-x'}Sn_{x'}O_{3-y}$ film which was prepared separately was analyzed by the Rutherford backscattering spectrometry (RBS). Here, "x'" with an "'" added to the "x" in the $In_{2-x'}Sn_{x'}O_{3-y}$ means that the value of x may possibly be different between in the film and in the target (not analyzed).

In the embodiment having the structure shown in FIG. 18(c), the enhanced hygroscopic layer employed a Ba oxide. The switching element and the current supply element employed a transistor (TFT) The source electrode and drain electrode of the transistor employed Al and the gate electrode employed WSi, while the gate insulating film, the first interlayer insulating film, the second interlayer insulating film, and the barrier layer employed a Si oxide. The light emitting element was surrounded by a replaced nitrogen environment and then encapsulated in a metal cap.

Two types of light emitting display devices were fabricated, one having an enhanced hygroscopic layer and the other not having it. A voltage of 5V was applied to the anode portion made of a transparent electrode. Then, a voltage of 5V was applied to all the switching wirings (gate lines) and the second switching wirings (data lines) to measure, using a photometer at room temperature, the period of time taken to reduce the light emission from the elements by half.

Table 4 indicates the relationship between the value of y of the $In_{2-x}Sn_xO_{3-y}$ film and the light emission half time (measured in hours), for various types of $In_{2-x}Sn_x$ targets employed. Table 4 shows the cases in which the structures of FIG. 18(a) and FIG. 18(c) were used.

TABLE 4

|  | FIG. 18a | | | | | | | FIG. 18c |
| --- | --- | --- | --- | --- | --- | --- | --- | --- |
|  | y = 0.01 | y = 0.03 | y = 0.06 | y = 0.1 | y = 0.15 | y = 0.2 | y = 0.3 | y = 0.06 |
| x = 0.05 | 49 | 48 | 340 | 280 | 320 | 220 | 21 | 570 |
| x = 0.1 | 52 | 90 | 350 | 360 | 320 | 240 | 18 | 580 |
| x = 0.2 | 47 | 45 | 360 | 330 | 340 | 250 | 17 | 460 |

With the value of x in the $In_{2-x}Sn_x$ target taking any one of 0.05, 0.1, or 0.2, it was found that the light emission half time was less than 100 hours for the values of y equal to or less than 0.03. In the range of y varying from 0.06 to 0.2, the half time was 220 hours or more, while being as extremely short as 21 hours or less for the value of y being 0.3.

This shows that the value of y lies within the range of 0.06 to 0.2 to ensure the light emission sustain time. This is because the $In_{2-x}Sn_xO_{3-y}$ film somewhat deficient in oxygen has a better moisture absorption capability, thereby being able to absorb the moisture around the light emitting elements and provide an improved emission lifetime.

Furthermore, the structure shown in FIG. 18(c) has a light emission half time 1.5 times longer when compared with the light emitting elements fabricated using the $In_{2-x}Sn_xO_{3-y}$ film that has been prepared using the same value of y (y=0.06) The $In_{2-x}Sn_xO_{3-y}$ film absorbs moisture around the light emitting elements and the enhanced hygroscopic layer further absorbs the moisture, thereby making it possible to further reduce the amount of moisture around the light emitting elements and thus provide a further improved emission lifetime.

The invention claimed is:

1. An organic EL device having a light emitting element comprising:
 a substrate;
 a first electrode;
 a second electrode of transparent conductive film; and
 a light emitting organic material layer formed between said first electrode and said second electrode, wherein
 said transparent conductive film is made of a metal oxide deficient in oxygen as compared with stoichiometric composition and is made of ITO having a composition of $In_{2-x}Sn_xO_{3-y}$ (where $0<x<1$ and $0.05 \leq y \leq 0.2$),
 wherein said first electrode is arranged between said second electrode and said substrate, and
 an enhanced hygroscopic layer and/or a protective layer are formed on said second electrode.

2. The organic EL device according to claim 1, wherein said first electrode is made of metal.

3. The organic EL device according to claim 1, wherein said first electrode is made of any one of MgAg, Al, and LiAl.

4. The organic EL device according to claim 1, wherein said light emitting organic material layer serves also as a hole injection layer and/or an electron transport layer.

5. The organic EL device according to claim 1, wherein an electron transport layer is inserted between said first electrode and said light emitting organic material layer.

6. The organic EL device according to claim 1, wherein an anode buffer layer and/or a hole injection layer is inserted between said second electrode and said light emitting organic material layer.

7. An organic EL device having a light emitting element comprising:
 a first electrode;
 a second electrode of transparent conductive film; and
 a light emitting organic material layer formed between said first electrode and said second electrode,
 wherein said transparent conductive film is made of a metal oxide deficient in oxygen as compared with stoichiometric composition and is made of ITO having a composition of $In_{2-x}Sn_xO_{3-y}$ (where $0<x<0.3$ and $0.05 \leq y \leq 0.2$),
 wherein said second electrode, of said first electrode and said second electrode, is formed on a substrate side, and
 a protective layer is formed on said first electrode, and
 wherein an enhanced hygroscopic layer is formed adjacent to said second electrode between a substrate and said second electrode.

8. The organic EL device according to claim 1, wherein said light emitting element is encapsulated in a sealing member adhered onto said substrate.

9. The organic EL device according to claim 8, wherein Na, $H_2$, or an inert gas is sealed in a space encapsulated in said sealing material.

* * * * *